(12) United States Patent
Honda

(10) Patent No.: US 12,217,962 B2
(45) Date of Patent: Feb. 4, 2025

(54) SEMICONDUCTOR MANUFACTURING SYSTEM, METHOD OF MANUFACTURING A SEMICONDUCTOR DEVICE, AND SEMICONDUCTOR DEVICE

(71) Applicant: Kioxia Corporation, Tokyo (JP)

(72) Inventor: Shingo Honda, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 623 days.

(21) Appl. No.: 17/459,400

(22) Filed: Aug. 27, 2021

(65) Prior Publication Data

US 2022/0084824 A1   Mar. 17, 2022

(30) Foreign Application Priority Data

Sep. 15, 2020   (JP) .................. 2020-154754

(51) Int. Cl.

| | |
|---|---|
| *H01L 21/033* | (2006.01) |
| *G03F 7/00* | (2006.01) |
| *G03F 7/16* | (2006.01) |
| *H01J 37/32* | (2006.01) |
| *H01L 21/311* | (2006.01) |
| *H01L 23/522* | (2006.01) |
| *H01L 23/528* | (2006.01) |

(52) U.S. Cl.
CPC .......... *H01L 21/0338* (2013.01); *G03F 7/162* (2013.01); *G03F 7/70525* (2013.01); *H01J 37/32642* (2013.01); *H01L 21/31116* (2013.01); *H01L 21/31144* (2013.01); *H01L 23/5226* (2013.01); *H01L 23/5283* (2013.01); *H01J 2237/3341* (2013.01)

(58) Field of Classification Search
CPC .............. H01L 2924/00; H01L 27/124; H01L 2924/0002; H01L 29/78621; H01L 21/823814
See application file for complete search history.

(56) References Cited

U.S. PATENT DOCUMENTS

| | | | | |
|---|---|---|---|---|
| 2002/0076921 A1* | 6/2002 | Fukada | ............. | H01L 21/76873 |
| | | | | 257/E21.578 |
| 2016/0056070 A1* | 2/2016 | Kuwajima | ........ | H01L 21/76831 |
| | | | | 438/618 |
| 2020/0176226 A1 | 6/2020 | Tsukahara et al. | | |

FOREIGN PATENT DOCUMENTS

| | | |
|---|---|---|
| JP | 2005-332978 A | 12/2005 |
| JP | 2010-093043 A | 4/2010 |
| JP | 2020-091942 A | 6/2020 |

* cited by examiner

*Primary Examiner* — Tony Tran
(74) *Attorney, Agent, or Firm* — Foley & Lardner LLP

(57) ABSTRACT

A semiconductor manufacturing system includes a calculation unit that calculates an inclination degree of an incidence direction of an etchant in an etching device according to a worn state of a part of the etching device. A correction unit corrects a second exposure pattern so that an edge position in the second exposure pattern including an edge is shifted from a first exposure pattern according to the calculated inclination degree. An exposure device exposes a second resist film formed on the substrate from which a first resist pattern is removed with the second exposure pattern. A development device develops the second resist film and forms a second resist pattern on the substrate. The etching device performs etching processing on the substrate by using the second resist pattern as a mask.

4 Claims, 31 Drawing Sheets

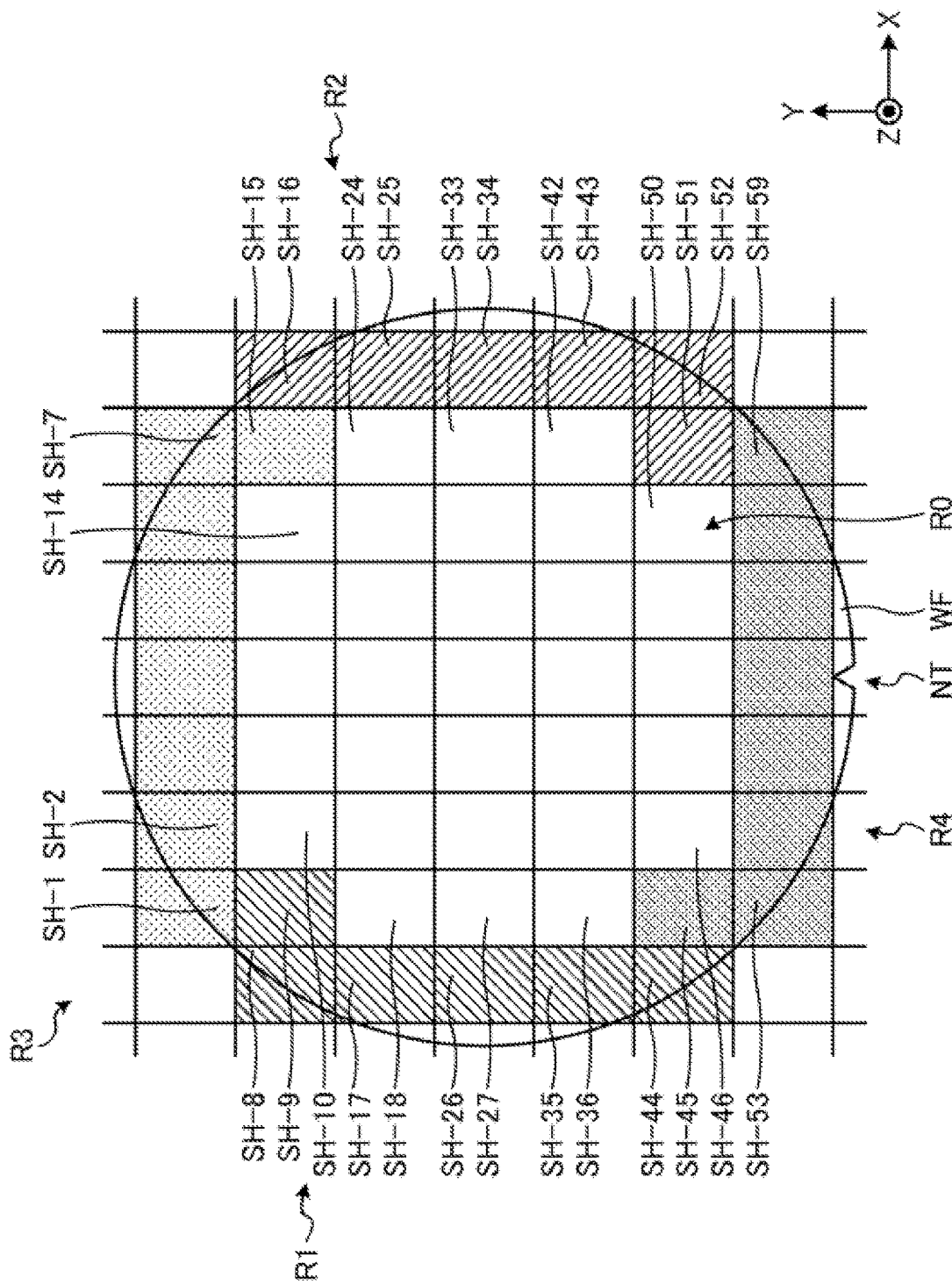

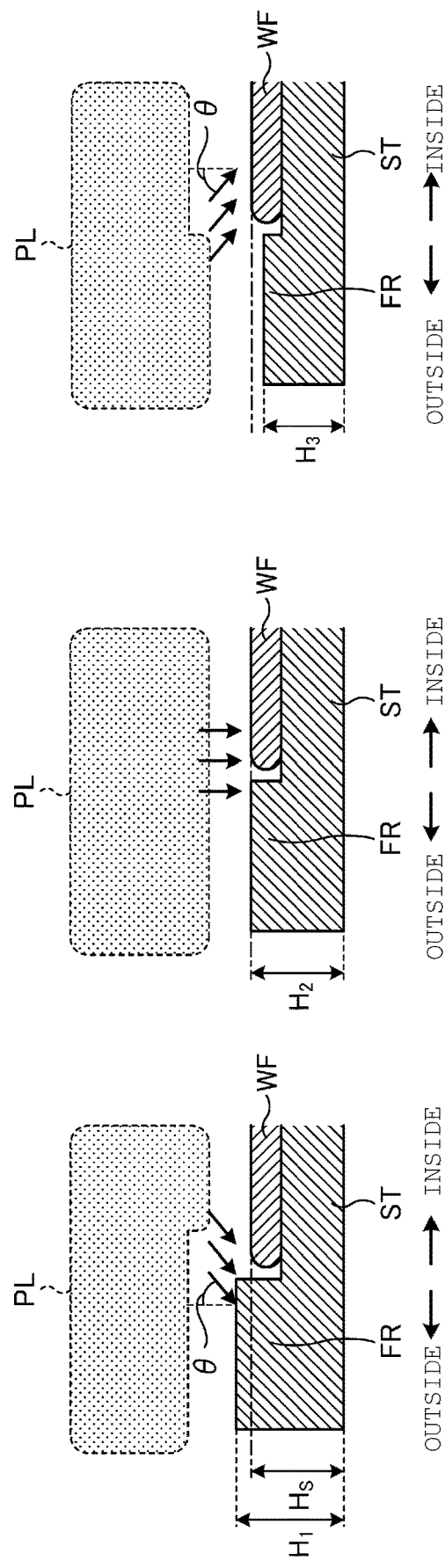

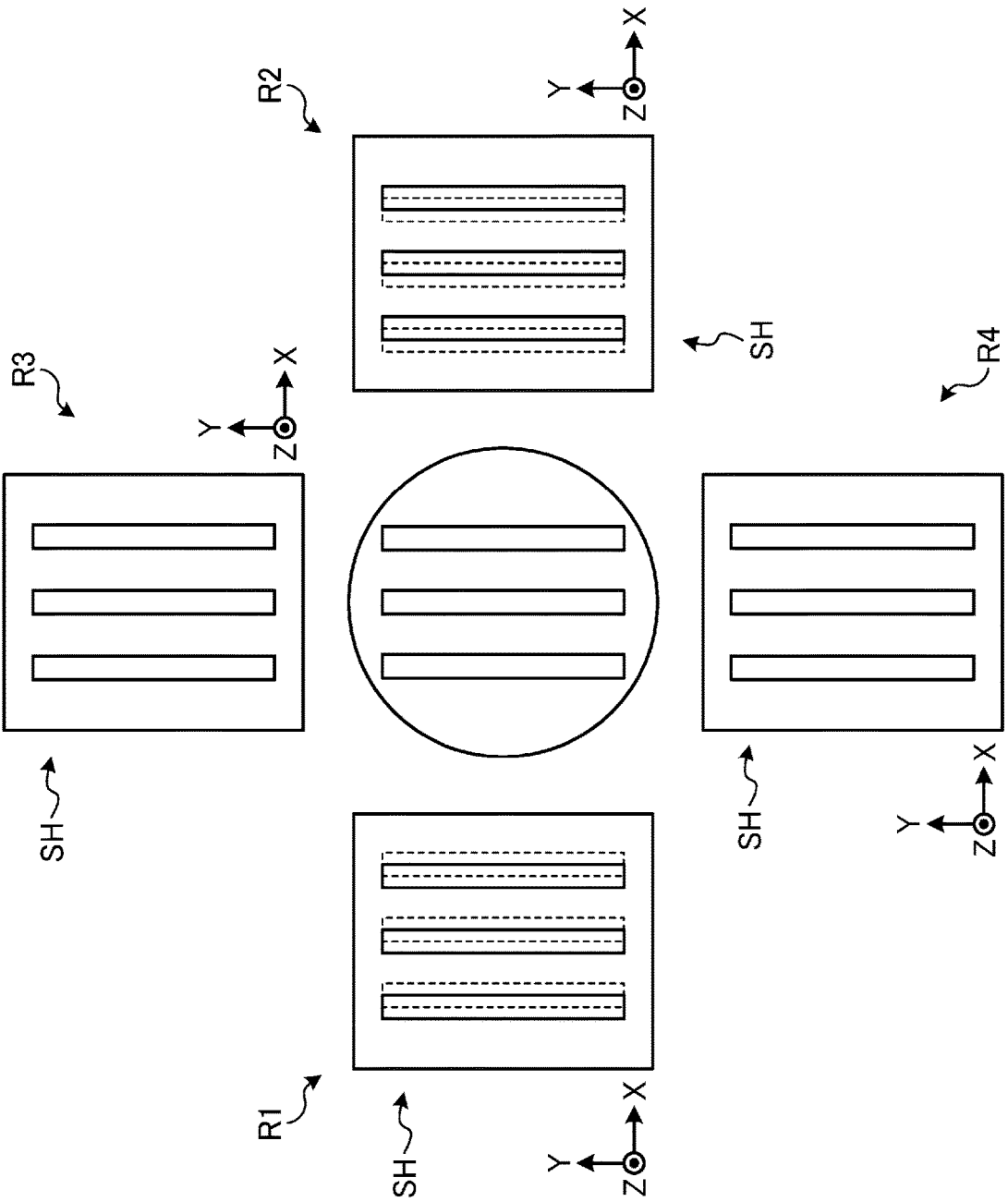

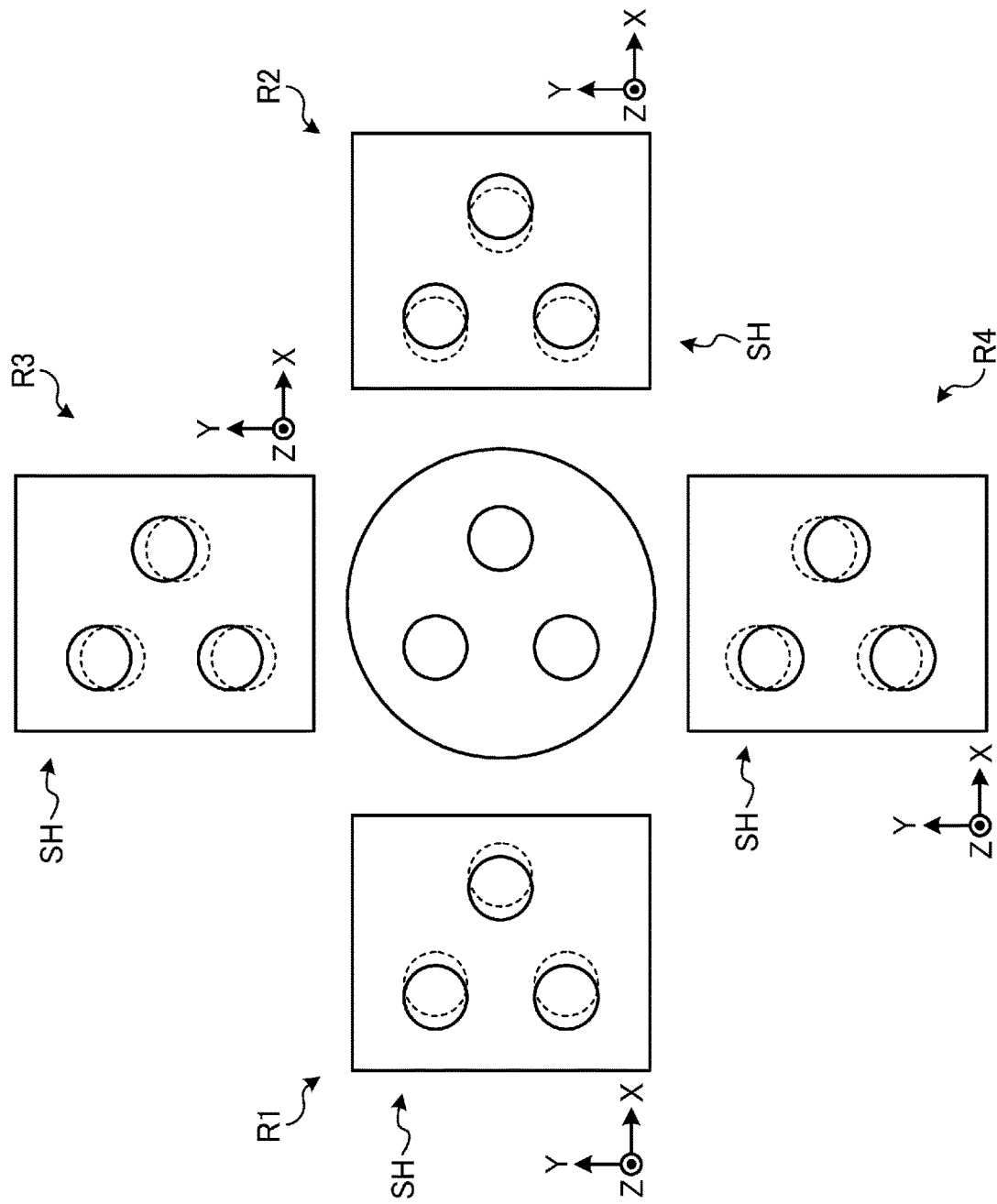

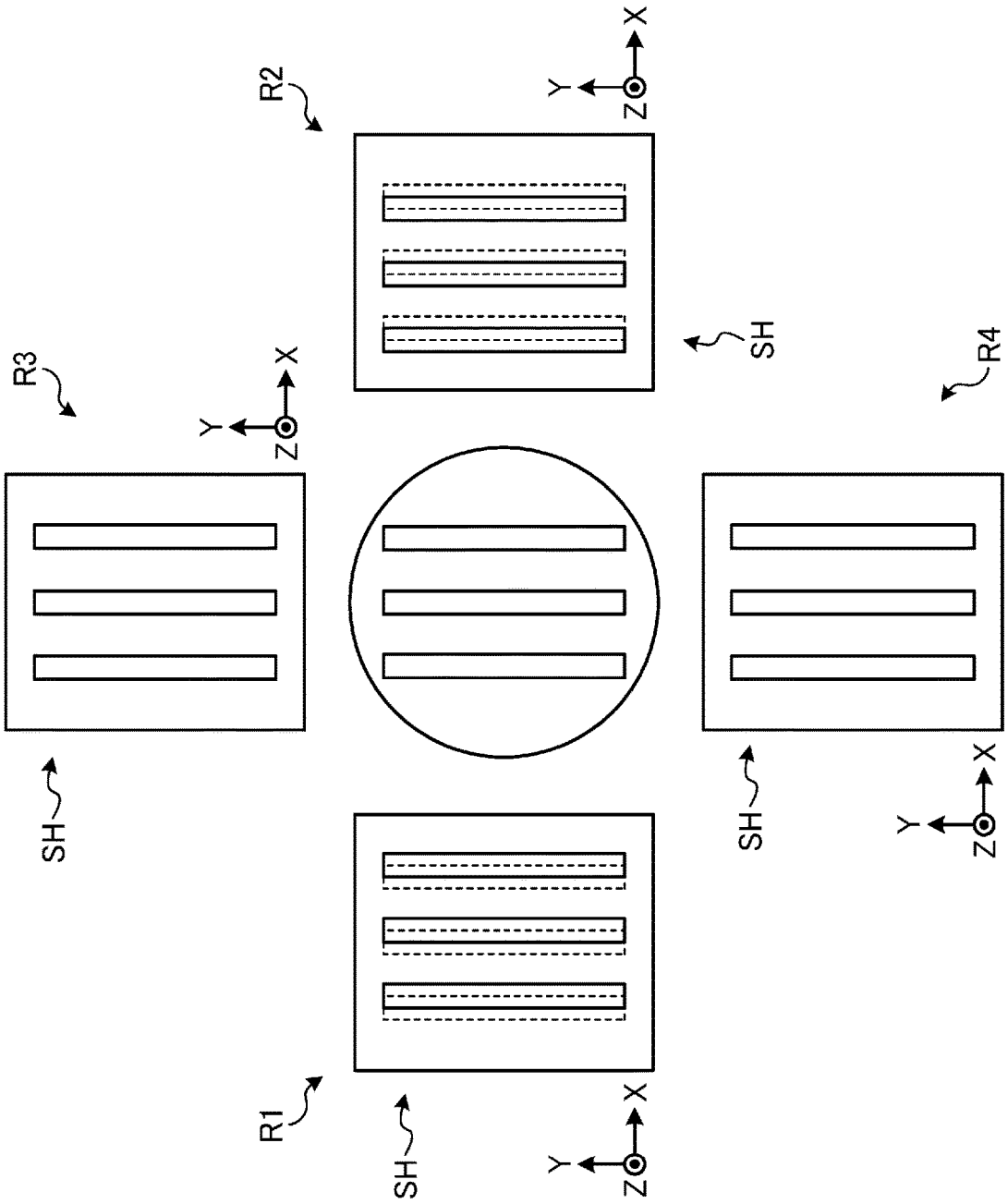

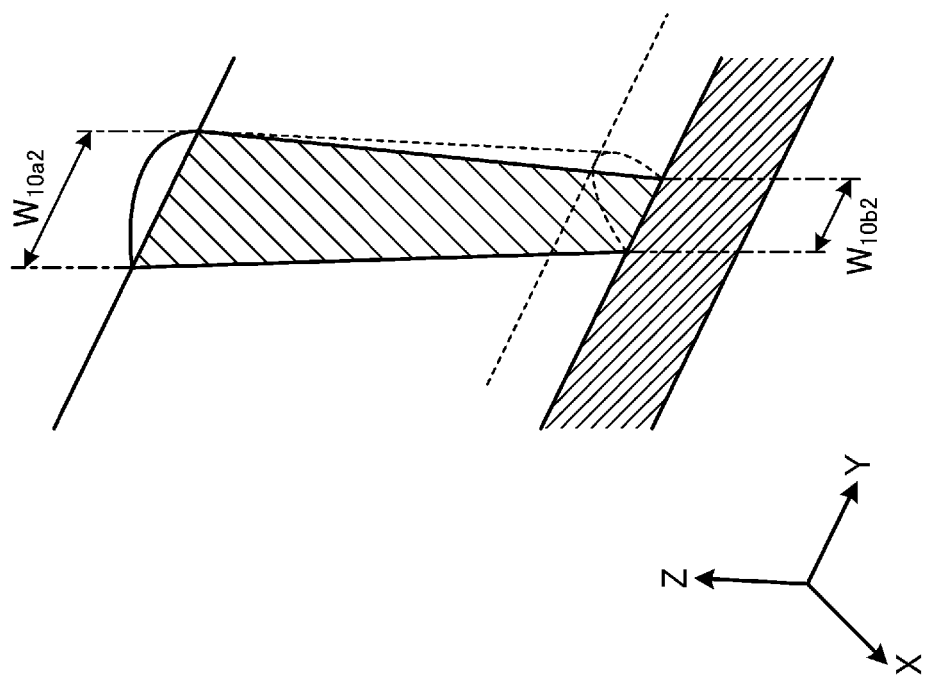
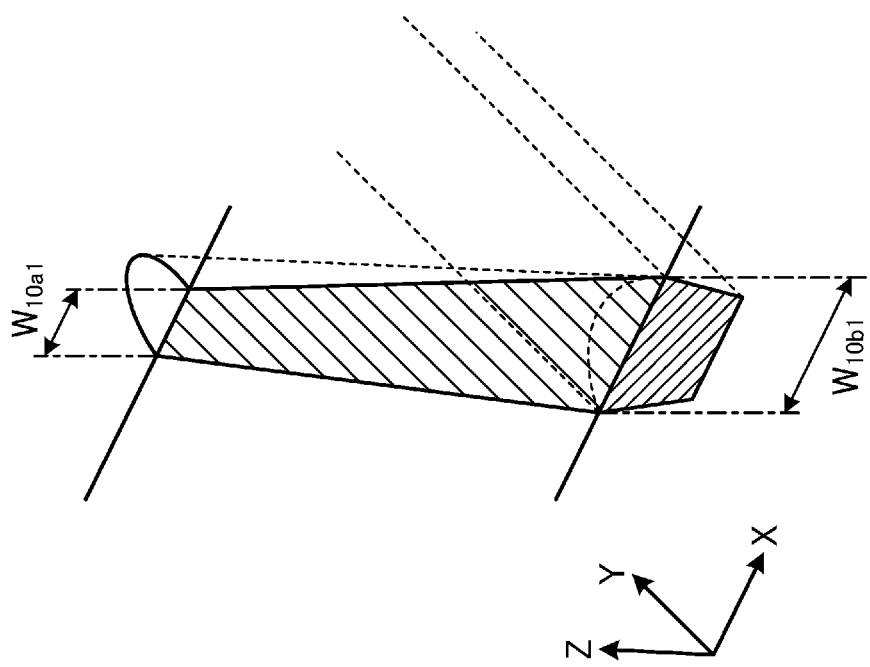

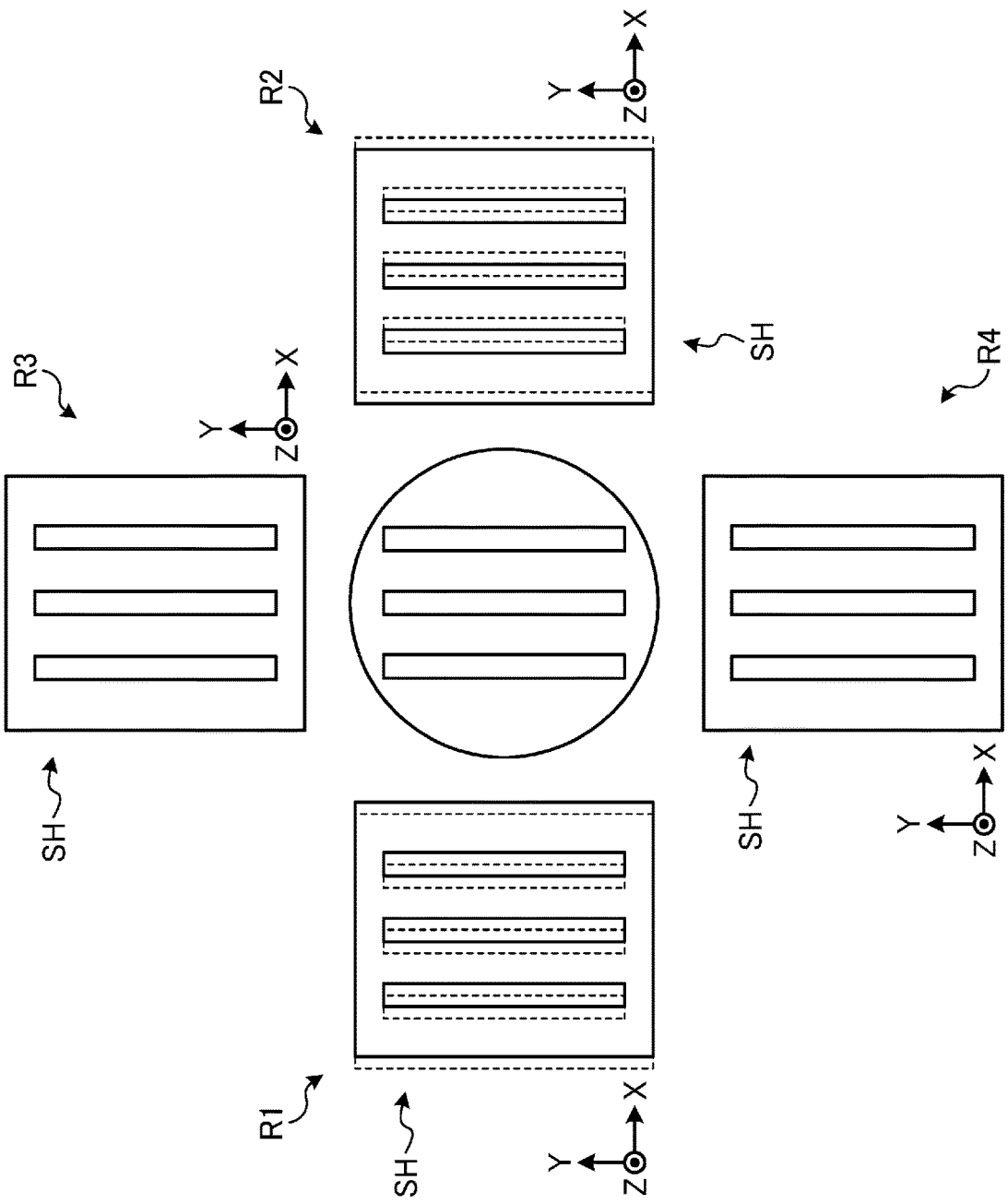

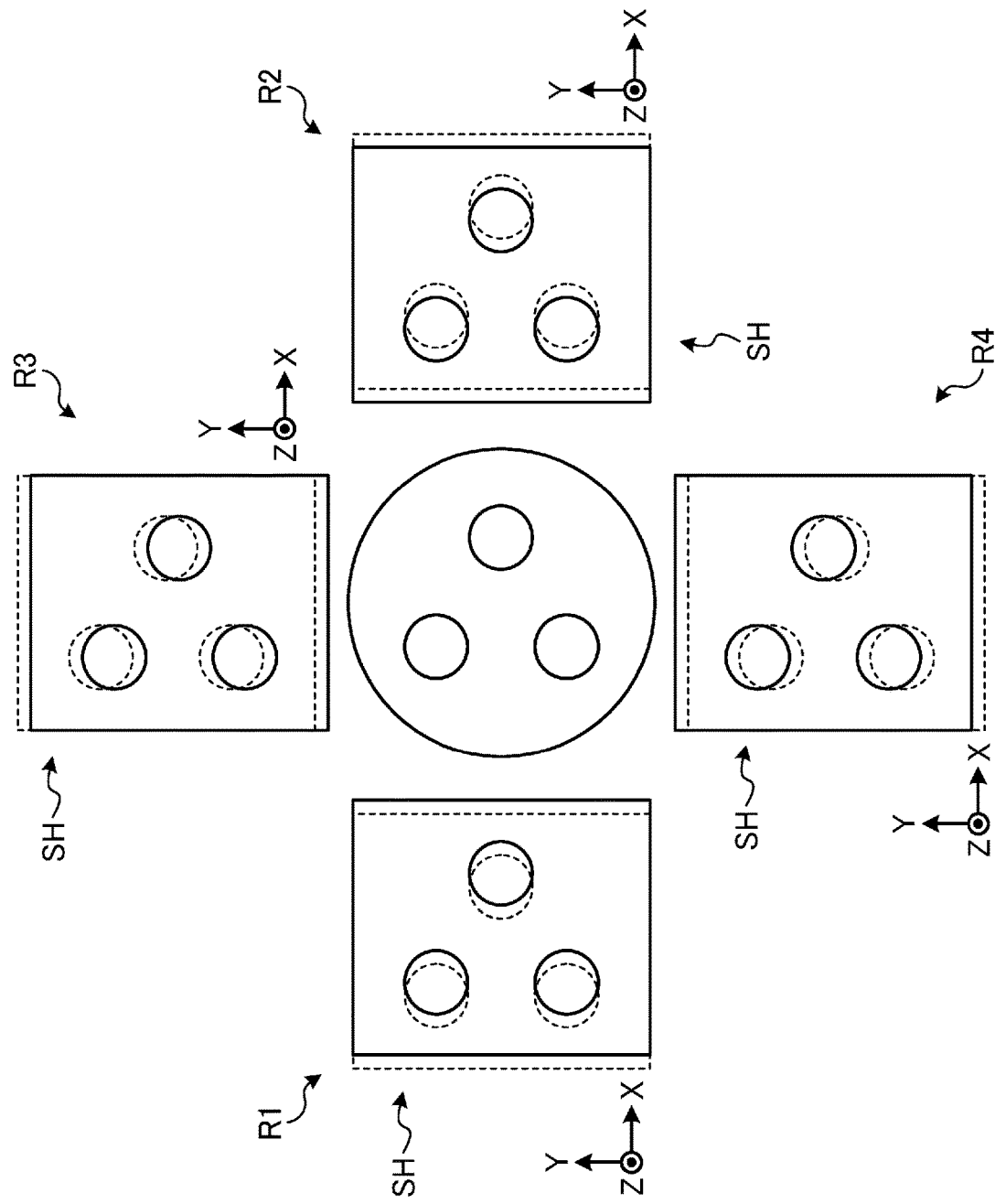

SEMICONDUCTOR MANUFACTURING SYSTEM, METHOD OF MANUFACTURING A SEMICONDUCTOR DEVICE, AND SEMICONDUCTOR DEVICE

CROSS-REFERENCE TO RELATED APPLICATION

This application is based upon and claims the benefit of priority from Japanese Patent Application No. 2020-154754, filed Sep. 15, 2020, the entire contents of which are incorporated herein by reference.

FIELD

Embodiments described herein relate generally to a semiconductor manufacturing system, a method of manufacturing a semiconductor device, and a semiconductor device.

BACKGROUND

In the method of manufacturing a semiconductor device, a film to be processed is deposited on a substrate, a resist pattern is formed on the film to be processed, and etching processing is performed on the film to be processed with an etching device by using the resist pattern as a mask, to form a predetermined pattern. At this point, it is desirable to accurately form a pattern.

DESCRIPTION OF THE DRAWINGS

FIG. 3 is a diagram illustrating a substrate and a plurality of shot areas according to at least one embodiment.

FIGS. 4A to 4C are diagrams illustrating changes of the inclination of an incidence direction of an etchant in accordance with a worn state of a part of an etching device according to at least one embodiment.

FIG. 6 is a diagram illustrating the correction of layout data with respect to a groove pattern according to at least one embodiment (when a worn amount is small).

FIG. 7 is a diagram illustrating the correction of the layout data with respect to a hole pattern according to at least one embodiment (when the worn amount is small).

FIG. 8 is a diagram illustrating the correction of layout data with respect to the groove pattern according to at least one embodiment (when a worn amount is large).

FIGS. 20A and 20B are perspective views illustrating the configuration of the semiconductor device according to at least one embodiment.

FIG. 24 is a diagram illustrating the shot position shift with respect to the groove pattern according to the first modification of at least one embodiment (when the worn amount is large).

FIG. 25 is a diagram illustrating the shot position shift with respect to the hole pattern according to the first modification of at least one embodiment (when the worn amount is large).

DETAILED DESCRIPTION

Figure 1:
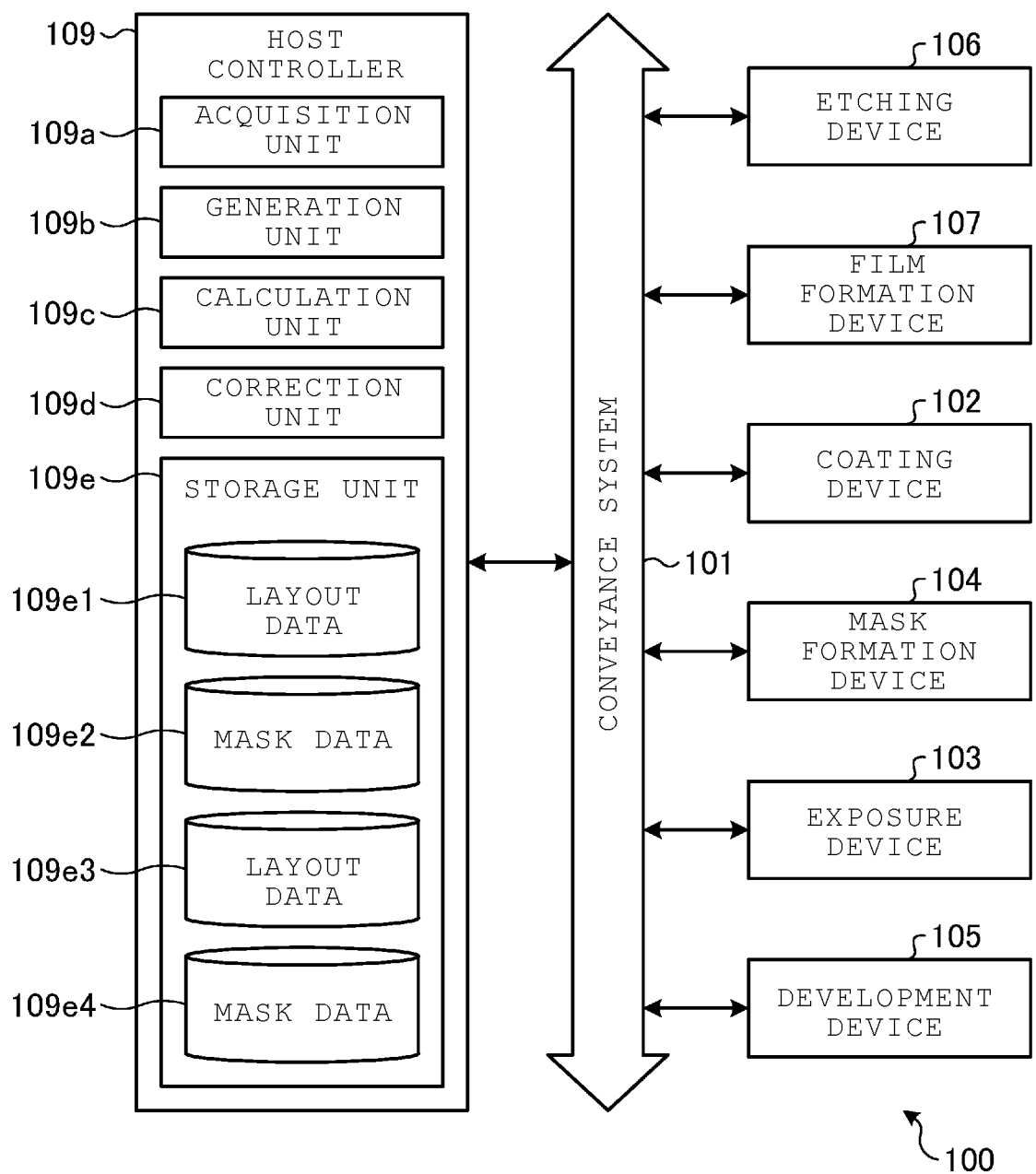
FIG. 1 is a diagram illustrating a configuration of a semiconductor manufacturing system according to at least one embodiment.

Embodiments provide a semiconductor manufacturing system appropriate for forming a pattern accurately, a method of manufacturing a semiconductor device, and a semiconductor device.

In general, according to at least one embodiment, a semiconductor manufacturing system including an exposure device, a development device, an etching device, a calculation unit, and a correction unit is provided. The exposure device exposes a first resist film formed on a substrate with a first exposure pattern. The development device develops the first resist film and forms a first resist pattern on the substrate. The etching device performs etching processing on the substrate by using the first resist pattern as a mask. The calculation unit calculates an inclination degree of an incidence direction of an etchant in the etching device according to a worn state of a part of the etching device. The correction unit corrects a second exposure pattern so that an edge position in the second exposure pattern including an edge is shifted from the first exposure pattern according to the calculated inclination degree. The exposure device exposes a second resist film formed on the substrate from which the first resist pattern is removed with the second exposure pattern. The development device develops the second resist film and forms a second resist pattern on the substrate. The etching device performs etching processing on the substrate by using the second resist pattern as a mask.

Hereinafter, a semiconductor manufacturing system according to at least one embodiment is described in detail with reference to the accompanying drawings. In addition, the present disclosure is not limited to this embodiment.

EMBODIMENT

A semiconductor manufacturing system according to the embodiment is applied to a method of manufacturing a semiconductor device. In the method of manufacturing the semiconductor device, a film to be processed is deposited on a substrate, a resist pattern is formed on the film to be processed, etching processing is performed on the film to be processed with an etching device by using the resist pattern as a mask, and a predetermined pattern is formed, to manufacture the semiconductor device.

The etching device is, for example, a Reactive Ion Etching (RIE) device and performs dry etching on the film to be processed on the substrate placed on a stage in a chamber. In the etching device, a stage in the chamber is considered as a lower electrode, processing gas is introduced into the chamber, a high frequency voltage is applied between an upper electrode and the lower electrode, and plasma is discharged into the chamber. In the etching device, radicals and ions of processing gas are generated as etchants with the plasma in the chamber, and the etchants are drawn to the lower electrode side (stage side) by the potential gradient between the upper electrode and the lower electrode to be incident to the substrate, so that the film to be processed on the substrate (for example, an insulating film) is subjected to the etching processing. The etching device performs the etching processing on the film to be processed on the substrate front surface under the condition of the anisotropic etching. If a semiconductor device to be manufactured is a three-dimensional memory, holes and/or grooves having a high aspect ratio may be subjected to the etching processing.

In the etching device, as the integrated time of plasma discharge increases, a part disposed outside the stage (for example, a focus ring) is worn, the height thereof gradually decreases, and thus the position of the sheath between the plasma and the stage in the chamber may be changed. Accordingly, tilting in which the inclination degree (that is, the direction and the angle of the inclination) of the incidence direction of the etchant with respect to the substrate changes with time, and accordingly, patterns of holes and/or grooves are formed with the inclined angle from an appropriate angle may occur. When etching processing is performed under the condition of the anisotropic etching, if the incidence direction of the etchant is diagonally inclined, and the side surfaces of the hole and/or the grooves in a certain direction are exposed to the etchant more intensively than the side surfaces in the other directions, local side etching is performed on the holes and/or grooves, so that tilting may occur. Otherwise, when etching processing is performed under the condition of the anisotropic etching, if the incidence direction of the etchant is diagonally inclined, and side wall protective films for implementing anisotropy are unevenly deposited on the side surfaces of the holes and/or grooves, local side etching is performed on the holes and/or grooves, so that tilting may occur.

If the tilting occurs, wiring is formed so that the conductors are embedded in the patterns of the holes and/or grooves formed in the inclined angle from the appropriate angle, and thus poor connection of wiring, such as shift in the connection position of this wiring with the lower layer wiring, may occur. If a semiconductor device to be manufactured is a three-dimensional memory, the aspect ratio of holes and/or grooves may be high, and thus the tendency may be remarkable. If a poor connection occurs, the pattern formed by the etching processing or the like cannot achieve the role as a wiring or a circuit, and thus it is likely that the manufacturing yield of the semiconductor device decreases.

Therefore, according to at least one embodiment, in the semiconductor manufacturing system, the inclination degree of the incidence direction of the etchant is calculated according to the worn state of the part of the etching device, the edge position of the layout data is corrected according to the calculated inclination degree, and the substrate is exposed, developed, and subjected to the etching processing. Accordingly, the tilting is prevented, and the manufacturing yield of the semiconductor device is improved.

Specifically, the semiconductor manufacturing system deposits the film to be processed on the substrate and forms a multilayer resist structure thereon. The multilayer resist structure includes a first resist film as the uppermost resist. The semiconductor manufacturing system exposes the first resist film of the substrate with a first exposure pattern, develops the first resist film, and forms the first resist pattern on the substrate. The semiconductor manufacturing system performs the etching processing on the substrate by using the first resist pattern as a mask. The semiconductor manufacturing system removes the first resist pattern, and forms a second resist film on the substrate as the uppermost resist of the multilayer resist structure. In addition, the semiconductor manufacturing system calculates the inclination degree of the incidence direction of the etchant according to the worn state of the part of the etching device. The inclination degree of the incidence direction of the etchant includes the direction and the angle of the inclination of the etchant. The semiconductor manufacturing system corrects a second exposure pattern so that the edge position in the second exposure pattern including the edge is shifted from the first exposure pattern according to the calculated inclination degree. The semiconductor manufacturing system obtains the direction and the amount of the correction according to the direction and the angle of the inclination of the etchant, and corrects the second exposure pattern so that the edge position is shifted from the first exposure pattern according to the obtained direction and amount. The semiconductor manufacturing system exposes the second resist film of the substrate with the second exposure pattern, develops the second resist film, and forms the second resist pattern on the substrate. The semiconductor manufacturing system performs the etching processing on the substrate by using the second resist pattern as the mask. Accordingly, the resist of the lower layer lower than the uppermost resist in the multilayer resist structure is processed to form the lower layer resist pattern. With respect to the lower layer resist pattern, the inclination angle of the side surface in the cross-sectional view is asymmetrical on the left and right. With respect to the lower layer resist pattern, in the cross-sectional view, the inclination angle of the side surface on the first side that corresponds to the direction of the inclination of the etchant to the normal line of the substrate front surface is larger than the inclination angle of the opposite side surface on the second side to the normal line of the substrate front surface. The semiconductor manufacturing system performs the etching processing on the film to be processed by using this lower layer resist pattern as the mask. At this point, since the inclination angle of the side surface on the first side in the lower layer resist pattern is larger than the inclination angle of the side surface on the second side, the influence by the inclination of the etchant is prevented, and the etching processing can be performed on the film to be processed. Accordingly, in the cross-sectional view of the film to be processed, a pattern in which the inclination angle of the side surface on the first side and the inclination angle of the side surface on the second side are equal (for example, a pattern of holes and/or grooves) can be formed. As a result, the tilting can be prevented, and thus the occurrence of the poor connection and the like can be prevented. Therefore, the manufacturing yield of the semiconductor device can be improved.

More specifically, a semiconductor manufacturing system 100 may be configured as illustrated in FIG. 1. FIG. 1 is a diagram illustrating the configuration of the semiconductor manufacturing system 100. The semiconductor manufacturing system 100 includes a conveyance system 101, a coating device 102, an exposure device 103, a mask formation device 104, a development device (developer) 105, an etching device 106, a film formation device 107, and a host controller 109. The coating device 102, the exposure device 103, the mask formation device 104, the development device 105, the etching device 106, and the film formation device 107 are configured to convey the substrate therebetween via the conveyance system 101.

The host controller 109 is communicably connected to the conveyance system 101, the coating device 102, the exposure device 103, the mask formation device 104, the development device 105, the etching device 106, and the film formation device 107 via a communication line (not illustrated). The host controller 109 controls each of the conveyance system 101, the coating device 102, the exposure device 103, the mask formation device 104, the development device 105, the etching device 106, and the film formation device 107.

The host controller 109 functionally includes an acquisition unit 109*a*, a generation unit 109*b*, a calculation unit 109*c*, a correction unit 109*d*, and a storage unit 109*e*.

The acquisition unit 109*a* acquires layout data 109*e*1 and 109*e*3 of a layer to be processed. The acquisition unit 109*a* may acquire the data by receiving the layout data 109*e*1 and 109*e*3 via a communication line from the outside (for example, a design device such as a computer) or may acquire the data by receiving an input of the layout data 109*e*1 and 109*e*3 generated from the outside via an input interface or a medium interface. The acquisition unit 109*a* stores the layout data 109*e*1 and 109*e*3 in the storage unit 109*e*.

The generation unit 109*b* reads the layout data 109*e*1 and 109*e*3 of the layer to be processed from the storage unit 109*e*. The generation unit 109*b* generates mask data 109*e*2 and 109*e*4 of the layer to be processed according to the layout data 109*e*1 and 109*e*3. The generation unit 109*b* stores the mask data 109*e*2 and 109*e*4 in the storage unit 109*e*.

The acquisition unit 109*a* acquires worn state information indicating the worn state of the part of the etching device 106. The acquisition unit 109*a* may acquire the information by receiving the worn state information via a communication line from the etching device 106 or may acquire the information by receiving an input of the worn state information read from the etching device 106 via an input interface or a medium interface.

The etching device 106 monitors the worn state of the part of the etching device 106. For example, the etching device 106 measures the integrated time when the plasma is discharged in the chamber, and stores the measured value of the integrated time as the monitor result. The measured value of the integrated time tends to be long as the wear of the part advances and may indicate the worn state of the part. Otherwise, the etching device 106 measures the dimension of the part (for example, the height of the focus ring) and stores the measured value of the dimension of the part as the monitor result. The dimension of the part (for example, the height of the focus ring) tends to decrease as the wear of the part advances, and thus may indicate the worn state of the part.

The acquisition unit 109*a* can acquire the monitor result of the etching device 106 as the worn state information indicating the worn state of the part. The acquisition unit 109*a* supplies the worn state information to the calculation unit 109*c*.

The calculation unit 109*c* calculates the inclination degree of the incidence direction of the etchant in the etching device 106 according to the worn state information. The inclination degree of the incidence direction of the etchant includes the direction and the angle of the inclination of the incidence direction of the etchant. The calculation unit 109*c* includes etchant information in which the worn state of the etching device 106 and the direction of the inclination of the incidence direction of the etchant and the angle of the inclination of the incidence direction of the etchant are associated with each other with respect to the classification of a plurality of different worn states. If the worn state information is received from the acquisition unit 109*a*, the calculation unit 109*c* refers to the etchant information and specifies the classification corresponding to the worn state indicated by the worn state information. The calculation unit 109*c* refers to the etchant information and obtains the direction and the angle of the inclination of the incidence direction of the etchant corresponding to the specified classification. The calculation unit 109c supplies the obtained inclination degree of the etchant to the correction unit 109d.

The correction unit 109d corrects the layout data 109e3 according to the inclination degree of the etchant so that the edge position in the layout data 109e3 including the edge is shifted from the immediately previous resist pattern. The correction unit 109d obtains the direction and the amount of the correction according to the direction and the angle of the inclination of the etchant and corrects the edge position in the layout data 109e3 with the obtained direction and amount. The correction unit 109d stores the corrected layout data 109e3 in the storage unit 109e.

The storage unit 109e stores the layout data 109e1 and 109e3 and stores the mask data 109e2 and 109e4.

Figure 2:
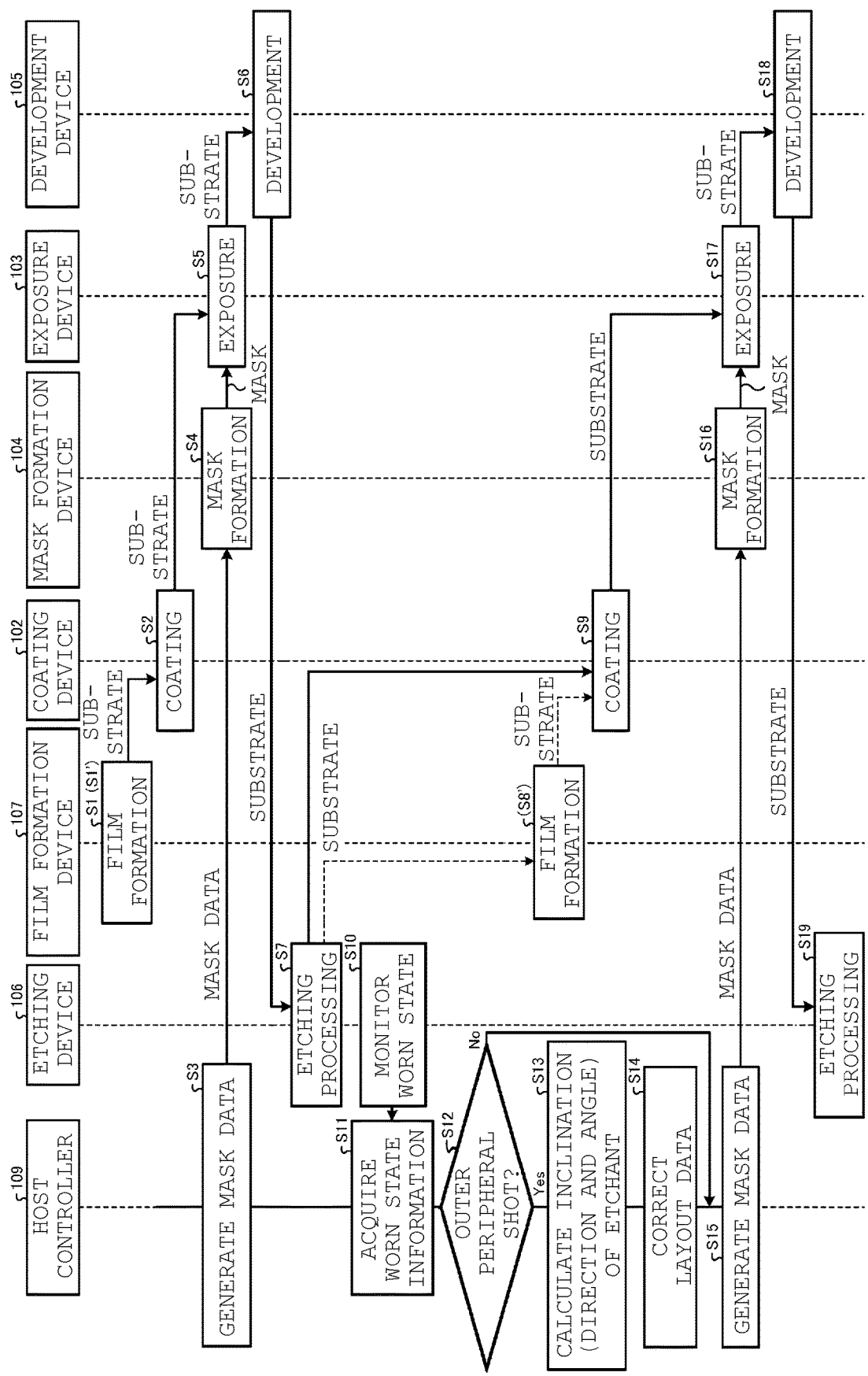
FIG. 2 is a sequence diagram illustrating an operation of the semiconductor manufacturing system according to at least one embodiment.

Subsequently, the operation of the semiconductor manufacturing system 100 is described with reference to FIG. 2. FIG. 2 is a sequence diagram illustrating the operation of the semiconductor manufacturing system 100.

The film formation device 107 forms the film to be processed (for example, an insulating film such as a silicon oxide film) on a substrate WF (S1). The film formation device 107 may be a Chemical Vapor Deposition (CVD) device or may be a Physical Vapor Deposition (PVD) device. The conveyance system 101 conveys the substrate WF on which the film to be processed is formed from the film formation device 107 to the coating device 102.

The coating device 102 forms the multilayer resist structure on the film to be processed by coating (S2). The multilayer resist structure may be a three-layer resist structure in which a first mask film, a second mask film, and a first resist film are stacked in this order. The coating device 102 forms the first mask film on the film to be processed by coating. The first mask film is a film, for example, including carbon as a main component and may be a Spin On Carbon (SOC) film in case of being formed by spin coating. The coating device 102 forms the second mask film on the first mask film by coating. The second mask film is a film, for example, including silicon oxide as a main component and may be a Spin On Glass (SOG) film in case of being formed by spin coating. The coating device 102 forms the first resist film on the second mask film by coating. The first resist film is a photoresist, for example, including a photosensitive material as a main component. The conveyance system 101 conveys the substrate WF on which the multilayer resist structure is formed from the coating device 102 to the exposure device 103.

The host controller 109 acquires the layout data 109e1 of the layer to be processed (that is the first resist film) and generates the mask data 109e2 according to the layout data 109e1 (S3). The host controller 109 supplies the mask data 109e2 to the mask formation device 104.

If the mask data 109e2 is received, the mask formation device 104 forms a mask MK1 according to the mask data 109e2 (S4). The mask formation device 104 is, for example, an electron beam drawing device and draws a pattern in accordance with the mask data 109e2 on a mask blank to form the mask MK1. The formed mask MK1 may be set on the mask stage of the exposure device 103.

In the exposure device 103, the conveyed substrate WF is set on a substrate stage. The exposure device 103 exposes the first resist film formed on the substrate WF with the mask MK1 (S5). The exposure device 103 irradiates the mask on the mask stage by the irradiation optical system, projects the irradiation light to the substrate WF on the substrate stage by a projection optical system, and exposes the substrate WF. Accordingly, a latent image pattern is formed on the first resist film of the substrate WF in accordance with the mask data 109e2. The conveyance system 101 conveys the exposed substrate WF to the development device 105.

If the substrate WF is conveyed, the development device 105 develops the first resist film of the substrate WF (S6). The development device 105 develops the latent image pattern formed on the first resist film of the substrate WF and forms the first resist pattern on the substrate WF. The conveyance system 101 conveys the substrate WF on which the first resist pattern is formed from the development device 105 to the etching device 106.

If the substrate WF is conveyed, the etching device 106 sets the substrate WF on the stage and performs etching processing on the substrate WF using the first resist pattern as a mask (S7). The etching device 106 processes the second mask film by using the first resist pattern as a mask and forms the second mask pattern. The conveyance system 101 conveys the processed substrate WF from the etching device 106 to a washing device (not illustrated). The washing device performs washing for removing the first resist pattern from the substrate WF. The conveyance system 101 conveys the washed substrate WF from the washing device to the coating device 102.

After the second mask pattern is additionally coated with the second mask film, the coating device 102 forms the second resist film on the second mask pattern by coating (S9). The second resist film is a photoresist, for example, including a photosensitive material as a main component. The conveyance system 101 conveys the substrate WF on which the second resist film is formed from the coating device 102 to the exposure device 103.

However, the etching device 106 monitors the worn state of the part (S10). The part is, for example, a focus ring. The etching device 106 may monitor integrated time for which the plasma is discharged in the chamber as the worn state information indicating the worn state of the part or may monitor the dimension of the part (for example, the height of the focus ring). The etching device 106 supplies the worn state information to the host controller 109 according to the request from the host controller 109 or according to the accomplishment of a predetermined condition (the elapse of a cycle).

If the worn state information is acquired (S11), the host controller 109 generates the mask data according to the position of the shot areas SH to be exposed among a plurality of shot areas SH-1 to SH-59 as illustrated in FIG. 3 in the substrate WF. FIG. 3 is a diagram illustrating the substrate WF and the plurality of shot areas SH-1 to SH-59. In FIG. 3, a configuration in which the substrate WF includes 59 shot areas SH is illustrated, but the substrate WF may include any number of the shot areas SH.

The host controller 109 determines whether the shot areas SH to be exposed is the outer peripheral shot (S12). The plurality of shot areas SH-1 to SH-59 are grouped into an inner area R0 and outer peripheral areas R1 to R4 as illustrated in FIG. 3. The outer peripheral shot is a shot area that belongs to the outer peripheral areas R1 to R4. The outer peripheral areas R1 to R4 are areas that are provided along the outer periphery of the substrate WF, and the inner area R0 is an area on the inner side of the outer peripheral areas R1 to R4 in the substrate WF.

If the direction perpendicular to the front surface of the substrate WF is set as a Z direction, a direction toward an opposite side to a notch NT with respect to the center of the substrate WF is a +Y direction, and a direction orthogonal to the Z direction and the Y direction is set as an X direction, an outer peripheral area R1 is an outer peripheral area of the substrate WF on a −X side. The outer peripheral area R1 includes the shot areas SH-8, SH-9, SH-17, SH-26, SH-35, and SH-44. An outer peripheral area R2 is an outer peripheral area of the substrate WF on a +X side. The outer peripheral area R2 includes the shot areas SH-16, SH-25, SH-34, SH-43, SH-51, and SH-52. The outer peripheral area R3 is an outer peripheral area of the substrate WF on a +Y side. The outer peripheral area R3 includes the shot areas SH-1 to SH-7, and SH-15. The outer peripheral area R4 is an outer peripheral area of the substrate WF on a −Y side. The outer peripheral area R4 includes the shot areas SH-45, and SH-53 to SH-59. The inner area R0 includes the shot areas SH-10 to SH-14, SH-18 to SH-24, SH-27 to SH-33, SH-36 to SH-42, and SH-46 to SH-50.

If the shot area SH to be exposed belongs to the inner area R0 (No in S12), the host controller 109 acquires the layout data 109e3 with respect to the layer to be processed (that is, the second resist film) and generates mask data 109e4-0 for the inner area R0 according to the layout data 109e3 (S15). The host controller 109 supplies the mask data 109e4-0 to the mask formation device 104. If the mask data 109e4-0 is received, the mask formation device 104 forms a mask MK2-0 for the inner area R0 according to the mask data 109e4-0 (S16). The mask formation device 104 is, for example, an electron beam drawing device, and draws a pattern in accordance with the mask data 109e4-0 on a mask blank to form the mask MK2-0. When the shot area SH that belongs to the inner area R0 is exposed, the formed mask MK2-0 may be set on the mask stage of the exposure device 103.

When the shot areas SH to be exposed belong to the outer peripheral area R1 (Yes in S12), the host controller 109 calculates the inclination degree of the incidence direction of the etchant in the outer peripheral area R1 according to the worn state information acquired in S11 (S13). The inclination degree of the incidence direction of the etchant includes the direction and the angle of the inclination of the etchant. The host controller 109 corrects layout data 109e3-1 so that the edge position in the layout data 109e3 is shifted from the first resist pattern according to the inclination degree of the etchant in the outer peripheral area R1 (S14). The host controller 109 obtains the direction and the amount of the correction according to the direction and the angle of the inclination of the etchant and corrects the edge position in the layout data 109e3-1 by the obtained direction and amount.

The worn state of the part of the etching device 106 may be classified as illustrated in FIGS. 4A to 4C. FIGS. 4A to 4C are diagrams illustrating changes of the inclination of the incidence direction of the etchant in accordance with the worn state of the part of the etching device, and illustrate a case where the worn state is classified into three stages of "small" as illustrated in FIG. 4A, "medium" as illustrated in FIG. 4B, and "large" as illustrated in FIG. 4C. The number of stages of the classification of the worn state may be two or may be three or more.

For example, a threshold value of the integrated time of "small" and "medium" is Tth1, and a threshold value of the integrated time of "medium" and "large" is Tth2. The threshold values Tth1 and Tth2 may be experimentally determined in advance. With respect to integrated time T indicated by the worn state information, the host controller 109 determines the worn state="small" if T<Tth1, determines the worn state="medium" if Tth1≤T≤Tth2, and determines the worn state="large" if T>Tth2.

Otherwise, the threshold value of the parameter of the part of "small" and "medium" (for example, the height of the focus ring FR from the lower surface of a stage ST) is set as Hth1, and the threshold value of the parameter of the part of "medium" and "large" is set as Hth2. If the height of the front surface of the substrate WF is set as reference height Hs, Hth1=Hs+ΔH, and Hth2=Hs−ΔH may be represented by using a predetermined positive value ΔH. The predetermined positive value ΔH may be experimentally determined in advance. With respect to a parameter H of the part illustrated with the worn state information, the host controller 109 determines the worn state="small" if H>Hth1, determine the worn state="medium" if Hth1≥H≥Hth2, and determines the worn state="large" if H<Hth2.

Height H1 (>Hth1) of the focus ring FR is illustrated in FIG. 4A, height H2 (≤Hth1 and ≥Hth2) of the focus ring FR is illustrated in FIG. 4B, and height H3 (<Hth2) of the focus ring FR is illustrated in FIG. 4C.

If it is determined as the worn state="small", a −Z side end portion of plasma PL is positioned on the −Z side on the inner side than the outside of the stage ST as illustrated in FIG. 4A. Therefore, the incidence direction of the etchant tilts from the inside to the outside. As illustrated with arrows in FIG. 5A, with respect to the outer peripheral area R1, the host controller 109 approximately determines that the direction of the incidence direction of the etchant is a direction inclined from the −Z direction to the +X side and the angle of the inclination becomes an angle θ from the +Z direction to the +X side. According to this, the host controller 109 determines the direction of the correction with respect to the layout data 109e3-1 to be the −X direction, and the correction amount to be the amount in accordance with the angle θ. For example, with respect to the groove patterns in the layout data 109e3-1, as illustrated by the solid lines in FIG. 6, the host controller 109 shifts the edge portions extending almost in the Y direction from the edge position of the first resist patterns illustrated with dotted lines to the −X side by the amount in accordance with the angle θ. With respect to the hole pattern in the layout data 109e3-1, as illustrated by the solid lines in FIG. 7, the host controller 109 shifts the edge portions mostly extending in the Y direction to the −X side from the edge positions of the first resist patterns illustrated with dotted lines by an amount in accordance with the angle θ. Accordingly, the host controller 109 obtains the corrected layout data 109e3-1 with respect to the outer peripheral area R1.

Figure 5C:
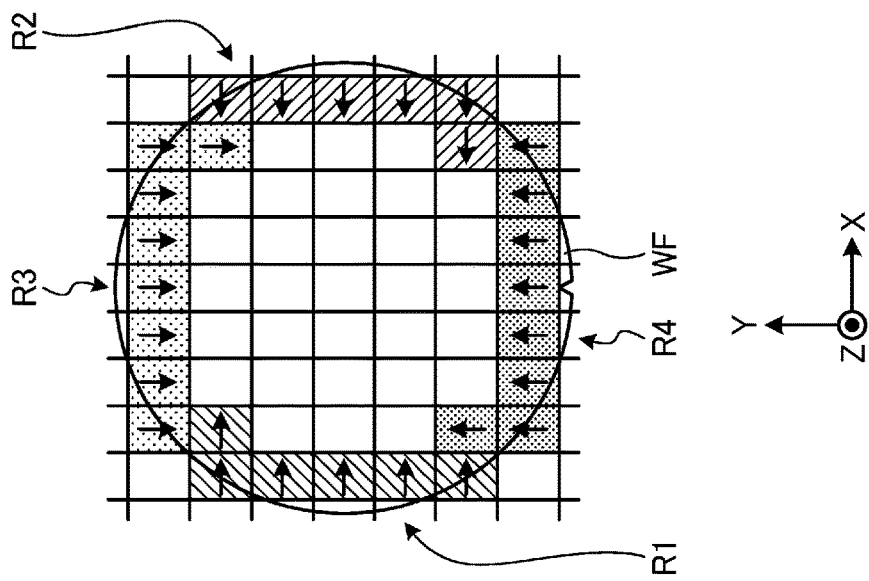
FIGS. 5A to 5C are diagrams illustrating information indicating an inclination degree of the incidence direction of the etchant in the etching device according to the embodiment.
Figure 5B:
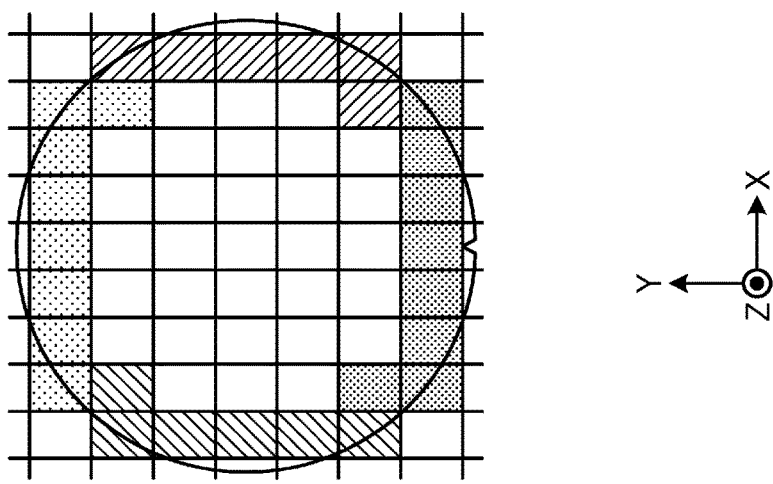
Figure 5A:
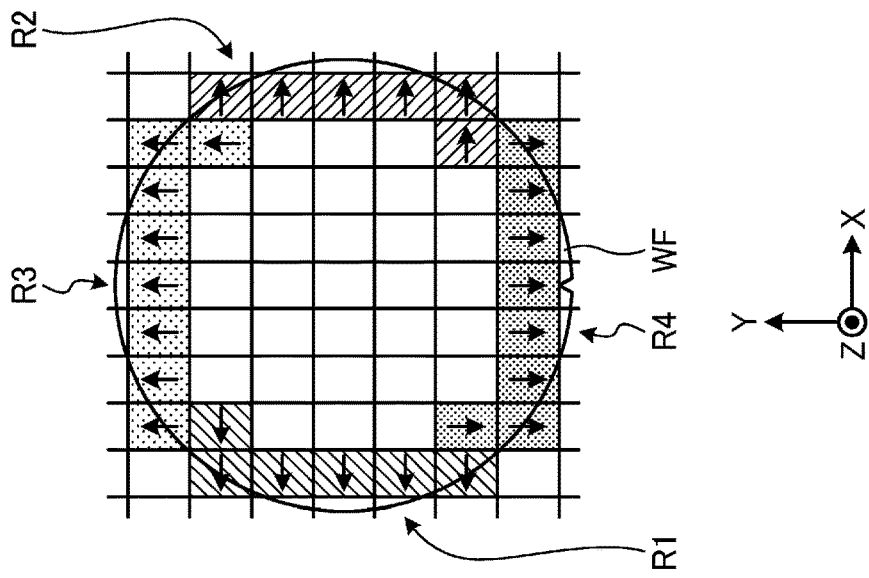

In addition, FIGS. 5A to 5C are diagrams illustrating the change of the inclination of the incidence direction of the etchant in accordance with the worn state of the part of the etching device 106. FIG. 6 is a diagram illustrating the correction of the layout data with respect to the groove pattern (when the worn amount is small). FIG. 7 is a diagram illustrating the correction of the layout data with respect to the hole pattern (when the worn amount is small). The solid square frames illustrated in FIGS. 6 and 7 schematically illustrate the shot areas SH. However, the ratios of the sizes of the shot areas SH and the patterns may be different from the ratios illustrated in FIGS. 6 and 7.

If it is determined as the worn state="medium", as illustrated in FIG. 4B, the −Z side end portion of the plasma PL is positioned at the Z position that is almost equal on the outside and the inside of the stage ST. Therefore, the incidence direction of the etchant is rarely tilted and is along the Z direction. With respect to the outer peripheral area R1, as illustrated in FIG. 5B, the host controller 109 determines that the direction of the incidence direction of the etchant is approximately the Z direction, and the angle of the inclination becomes zero. According to this, the host controller 109 corrects the layout data 109e3-1 by the correction amount of zero and obtains the corrected layout data 109e3-1 with respect to the outer peripheral area R1.

If it is determined as the worn state="large", as illustrated in FIG. 4C, the −Z side end portion of the plasma PL is positioned to the −Z side to the outside from the inside of the stage ST. Therefore, the incidence direction of the etchant tilts from the outside toward the inside. With respect to the outer peripheral area R1, as illustrated with arrows in FIG. 5C, the host controller 109 approximately determines that the direction of the incidence direction of the etchant is the direction inclined from the −Z direction to the −X side, and the angle of the inclination becomes the angle θ from the +Z direction to the −X side. According to this, the host controller 109 determines that the direction of the correction with respect to the layout data 109e3-1 is the +X direction, and the correction amount is the amount in accordance with the angle θ. For example, with respect to the groove patterns in the layout data 109e3-1, as illustrated with the solid lines in FIG. 8, the host controller 109 shifts the edge portions extending in the Y direction by the amount in accordance with the angle θ to the +X side from the edge positions of the first resist patterns illustrated with dotted lines. With respect to the hole pattern in the layout data 109e3-1, as illustrated with the solid lines in FIG. 9, the host controller 109 shifts the edge portions extending almost in the Y direction to the +X side from the edge positions of the first resist pattern illustrated with dotted lines by the amount in accordance with the angle θ. Accordingly, the host controller 109 obtains the corrected layout data 109e3-1 with respect to the outer peripheral area R1.

Figure 9:
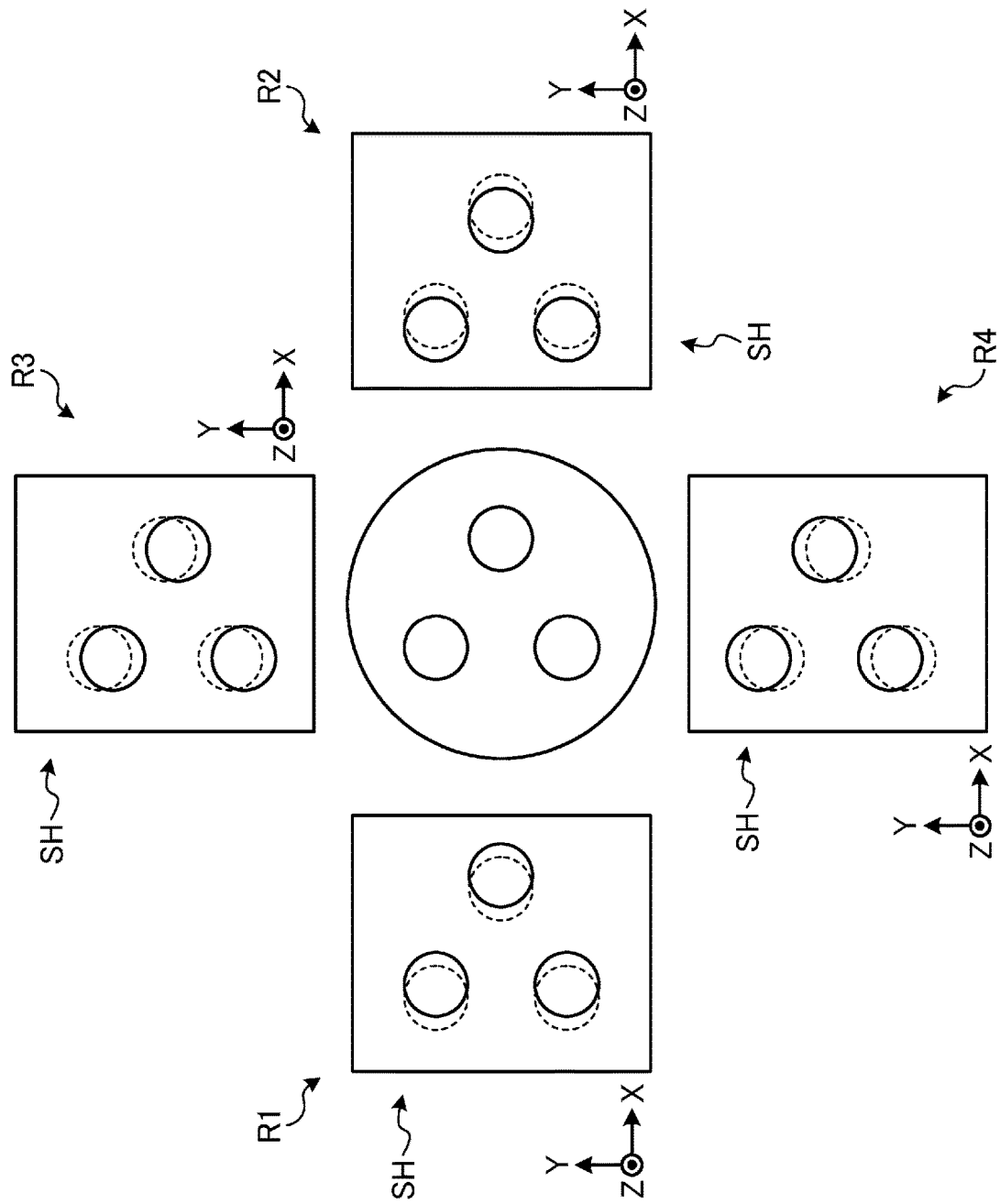
FIG. 9 is a diagram illustrating the correction of the layout data with respect to the hole pattern according to at least one embodiment (when the worn amount is large).

In addition, FIG. 8 is a diagram illustrating the correction of the layout data with respect to the groove pattern (when the worn amount is large). FIG. 9 is a diagram illustrating the correction of the layout data with respect to the hole pattern (when the worn amount is large). The solid square frames illustrated in FIGS. 8 and 9 schematically illustrate the shot areas SH, but the ratios of the sizes of the shot areas SH and the patterns may be different from the ratios illustrated in FIGS. 8 and 9.

The host controller 109 generates mask data 109e4-1 for the outer peripheral area R1 according to the corrected layout data 109e3-1 (S15). The host controller 109 supplies the mask data 109e4-1 to the mask formation device 104. If the mask data 109e4-1 is received, the mask formation device 104 forms a mask MK2-1 for the outer peripheral area R1 according to the mask data 109e4-1 (S16). The mask formation device 104 is, for example, an electron beam drawing device, and draws a pattern in accordance with the mask data 109e4-1 on a mask blank to form the mask MK2-1. When the shot area SH that belongs to the outer peripheral area R1 is exposed, the formed mask MK2-1 may be set on the mask stage of the exposure device 103.

When the shot areas SH to be exposed belong to the outer peripheral area R2 (Yes in S12), the host controller 109 calculates the inclination degree of the incidence direction of the etchant in the outer peripheral area R2 according to the worn state information acquired in S11 (S13). The inclination degree of the incidence direction of the etchant includes the direction and the angle of the inclination of the etchant. The host controller 109 corrects layout data 109e3-2 so that the edge positions in the layout data 109e3 is shifted from the first resist patterns according to the inclination degree of the etchant in the outer peripheral area R2 (S14). The host controller 109 obtains the direction and the amount of the correction according to the direction and the angle of the inclination of the etchant and corrects the edge positions in the layout data 109e3-2 by the obtained direction and amount.

With respect to the worn state of the part of the etching device 106, when it is determined as the worn state="small", the −Z side end portion of the plasma PL is positioned on the −Z side on the inner side than the outside of the stage ST as illustrated in FIG. 4A. Therefore, the incidence direction of the etchant tilts from the inside to the outside. As illustrated with the arrows in FIG. 5A, with respect to the outer peripheral area R2, the host controller 109 approximately determines that the direction of the incidence direction of the etchant is a direction inclined from the −Z direction to the −X side and the angle of the inclination becomes an angle θ from the +Z direction to the −X side. According to this, the host controller 109 determines the direction of the correction with respect to the layout data 109e3-2 to be the +X direction, and the correction amount to be the amount in accordance with the angle θ. For example, with respect to the groove patterns in the layout data 109e3-2, as illustrated with the solid lines in FIG. 6, the host controller 109 shifts the edge portions extending in the Y direction to the +X side from the edge positions of the first resist patterns illustrated with dotted lines by the amount in accordance with the angle θ. With respect to the hole pattern in the layout data 109e3-2, as illustrated with the solid line in FIG. 7, the host controller 109 shifts the edge portions extending almost in the Y direction to the +X side from the edge positions of the first resist pattern illustrated with dotted lines by the amount in accordance with the angle θ. Accordingly, the host controller 109 obtains the corrected layout data 109e3-2 with respect to the outer peripheral area R2.

If it is determined as the worn state="medium", as illustrated in FIG. 4B, the −Z side end portion of the plasma PL is positioned at the Z position that is almost equal on the outside and the inside of the stage ST. Therefore, the incidence direction of the etchant is rarely tilted and is along the Z direction. With respect to the outer peripheral area R2, as illustrated in FIG. 5B, the host controller 109 determines that the direction of the incidence direction of the etchant is approximately the Z direction, and the angle of the inclination becomes zero. According to this, the host controller 109 corrects the layout data 109e3-2 by the correction amount of zero and obtains the corrected layout data 109e3-2 with respect to the outer peripheral area R2.

If it is determined as the worn state="large", as illustrated in FIG. 4C, the −Z side end portion of the plasma PL is positioned to the −Z side to the outside from the inside of the stage ST. Therefore, the incidence direction of the etchant tilts from the outside toward the inside. With respect to the outer peripheral area R2, as illustrated with arrows in FIG. 5C, the host controller 109 approximately determines that the direction of the incidence direction of the etchant is the direction inclined from the −Z direction to the +X side, and the angle of the inclination becomes the angle θ from the +Z direction to the +X side. According to this, the host controller 109 determines that the direction of the correction with respect to the layout data 109e3-2 is the −X direction, and the correction amount is the amount in accordance with the angle θ. For example, with respect to the groove patterns in the layout data 109e3-2, as illustrated with the solid lines in FIG. 8, the host controller 109 shifts the edge portions extending in the Y direction to the −X side from the edge positions of the first resist patterns illustrated with dotted lines by the amount in accordance with the angle θ. With respect to the hole patterns in the layout data 109e3-2, as illustrated with the solid line in FIG. 9, the host controller 109 shifts the edge portions extending almost in the Y direction to the −X side from the edge positions of the first resist pattern illustrated with dotted lines by the amount in accordance with the angle θ. Accordingly, the host controller 109 obtains the corrected layout data 109e3-2 with respect to the outer peripheral area R2.

The host controller 109 generates mask data 109e4-2 for the outer peripheral area R2 according to the corrected layout data 109e3-2 (S15). The host controller 109 supplies the mask data 109e4-2 to the mask formation device 104. If the mask data 109e4-2 is received, the mask formation device 104 forms a mask MK2-2 for the outer peripheral area R2 according to the mask data 109e4-2 (S16). The mask formation device 104 is, for example, an electron beam drawing device, and draws a pattern in accordance with the mask data 109e4-2 on a mask blank to form the mask MK2-2. When the shot area SH that belongs to the outer peripheral area R2 is exposed, the formed mask MK2-2 may be set on the mask stage of the exposure device 103.

When the shot areas SH to be exposed belong to the outer peripheral area R3 (Yes in S12), the host controller 109 calculates the inclination degree of the incidence direction of the etchant in the outer peripheral area R3 according to the worn state information acquired in S11 (S13). The inclination degree of the incidence direction of the etchant includes the direction and the angle of the inclination of the etchant. The host controller 109 corrects layout data 109e3-3 so that the edge positions in the layout data 109e3 is shifted from the first resist patterns according to the inclination degree of the etchant in the outer peripheral area R3 (S14). The host controller 109 obtains the direction and the amount of the correction according to the direction and the angle of the inclination of the etchant and corrects the edge positions in the layout data 109e3-3 by the obtained direction and amount.

With respect to the worn state of the part of the etching device 106, when it is determined as the worn state="small", the −Z side end portion of the plasma PL is positioned on the −Z side on the inner side than the outside of the stage ST as illustrated in FIG. 4A. Therefore, the incidence direction of the etchant tilts from the inside to the outside. As illustrated with the arrows in FIG. 5A, with respect to the outer peripheral area R3, the host controller 109 approximately determines that the direction of the incidence direction of the etchant is a direction inclined from the −Z direction to the −Y side and the angle of the inclination becomes an angle θ from the +Z direction to the −Y side. According to this, the host controller 109 determines the direction of the correction with respect to the layout data 109e3-3 to be the +Y direction, and the correction amount to be the amount in accordance with the angle θ. For example, with respect to the groove pattern in the layout data 109e3-3, the host controller 109 determines that the influence of the tilting can be neglected, and does not perform correction as illustrated with the solid lines in FIG. 6. With respect to the hole patterns in the layout data 109e3-3, as illustrated with the solid line in FIG. 7, the host controller 109 shifts the edge portions extending almost in the X direction to the +Y side from the edge positions of the first resist pattern illustrated with dotted lines by the amount in accordance with the angle θ. Accordingly, the host controller 109 obtains the corrected layout data 109e3-3 with respect to the outer peripheral area R3.

If it is determined as the worn state="medium", as illustrated in FIG. 4B, the −Z side end portion of the plasma PL is positioned at the Z position that is almost equal on the outside and the inside of the stage ST. Therefore, the incidence direction of the etchant is rarely tilted and is along the Z direction. With respect to the outer peripheral area R3, as illustrated in FIG. 5B, the host controller 109 determines that the direction of the incidence direction of the etchant is approximately the Z direction, and the angle of the inclination becomes zero. According to this, the host controller 109 corrects the layout data 109e3-3 by the correction amount of zero and obtains the corrected layout data 109e3-3 with respect to the outer peripheral area R3.

If it is determined as the worn state="large", as illustrated in FIG. 4C, the −Z side end portion of the plasma PL is positioned to the −Z side to the outside from the inside of the stage ST. Therefore, the incidence direction of the etchant tilts from the outside toward the inside. With respect to the outer peripheral area R3, as illustrated with arrows in FIG. 5C, the host controller 109 approximately determines that the direction of the incidence direction of the etchant is the direction inclined from the −Z direction to the +Y side, and the angle of the inclination becomes the angle θ from the +Z direction to the +Y side. According to this, the host controller 109 determines that the direction of the correction with respect to the layout data 109e3-3 is the −Y direction, and the correction amount is the amount in accordance with the angle θ. For example, with respect to the groove pattern in the layout data 109e3-3, the host controller 109 determines that the influence of the tilting can be neglected, and does not perform correction as illustrated with the solid lines in FIG. 8. With respect to the hole patterns in the layout data 109e3-3, as illustrated with the solid line in FIG. 9, the host controller 109 shifts the edge portions extending almost in the X direction to the −Y side from the edge positions of the first resist pattern illustrated with dotted lines by the amount in accordance with the angle θ. Accordingly, the host controller 109 obtains the corrected layout data 109e3-3 with respect to the outer peripheral area R3.

The host controller 109 generates mask data 109e4-3 for the outer peripheral area R3 according to the corrected layout data 109e3-3 (S15). The host controller 109 supplies the mask data 109e4-3 to the mask formation device 104. If the mask data 109e4-3 is received, the mask formation device 104 forms a mask MK2-3 for the outer peripheral area R3 according to the mask data 109e4-3 (S16). The mask formation device 104 is, for example, an electron beam drawing device, and draws a pattern in accordance with the mask data 109e4-3 on a mask blank to form the mask MK2-3. When the shot area SH that belongs to the outer peripheral area R3 is exposed, the formed mask MK2-3 may be set on the mask stage of the exposure device 103.

When the shot areas SH to be exposed belong to the outer peripheral area R4 (Yes in S12), the host controller 109 calculates the inclination degree of the incidence direction of the etchant in the outer peripheral area R4 according to the worn state information acquired in S11 (S13). The inclination degree of the incidence direction of the etchant includes the direction and the angle of the inclination of the etchant. The host controller 109 corrects layout data 109e3-4 so that the edge positions in the layout data 109e3 is shifted from the first resist patterns according to the inclination degree of the etchant in the outer peripheral area R4 (S14). The host controller 109 obtains the direction and the amount of the correction according to the direction and the angle of the inclination of the etchant and corrects the edge positions in the layout data 109e3-4 by the obtained direction and amount.

With respect to the worn state of the part of the etching device 106, when it is determined as the worn state="small", the −Z side end portion of the plasma PL is positioned on the −Z side on the inner side than the outside of the stage ST as illustrated in FIG. 4A. Therefore, the incidence direction of the etchant tilts from the inside to the outside. As illustrated with the arrows in FIG. 5A, with respect to the outer peripheral area R4, the host controller 109 approximately determines that the direction of the incidence direction of the etchant is a direction inclined from the −Z direction to the +Y side and the angle of the inclination becomes an angle θ from the +Z direction to the +Y side. According to this, the host controller 109 determines the direction of the correction with respect to the layout data 109e3-4 to be the −Y direction, and the correction amount to be the amount in accordance with the angle θ. For example, with respect to the groove pattern in the layout data 109e3-4, the host controller 109 determines that the influence of the tilting can be neglected, and does not perform correction as illustrated with the solid lines in FIG. 6. With respect to the hole patterns in the layout data 109e3-4, as illustrated with the solid line in FIG. 7, the host controller 109 shifts the edge portions extending almost in the X direction to the −Y side from the edge positions of the first resist pattern illustrated with dotted lines by the amount in accordance with the angle θ. Accordingly, the host controller 109 obtains the corrected layout data 109e3-4 with respect to the outer peripheral area R4.

If it is determined as the worn state="medium", as illustrated in FIG. 4B, the −Z side end portion of the plasma PL is positioned at the Z position that is almost equal on the outside and the inside of the stage ST. Therefore, the incidence direction of the etchant is rarely tilted and is along the Z direction. With respect to the outer peripheral area R4, as illustrated in FIG. 5B, the host controller 109 determines that the direction of the incidence direction of the etchant is approximately the Z direction, and the angle of the inclination becomes zero. According to this, the host controller 109 corrects the layout data 109e3-4 by the correction amount of zero and obtains the corrected layout data 109e3-4 with respect to the outer peripheral area R4.

If it is determined as the worn state="large", as illustrated in FIG. 4C, the −Z side end portion of the plasma PL is positioned to the −Z side to the outside from the inside of the stage ST. Therefore, the incidence direction of the etchant tilts from the outside toward the inside. With respect to the outer peripheral area R4, as illustrated with arrows in FIG. 5C, the host controller 109 approximately determines that the direction of the incidence direction of the etchant is the direction inclined from the −Z direction to the −Y side, and the angle of the inclination becomes the angle θ from the +Z direction to the −Y side. According to this, the host controller 109 determines that the direction of the correction with respect to the layout data 109e3-4 is the +Y direction, and the correction amount is the amount in accordance with the angle θ. For example, with respect to the groove pattern in the layout data 109e3-4, the host controller 109 determines that the influence of the tilting can be neglected, and does not perform correction as illustrated with the solid lines in FIG. 8. With respect to the hole patterns in the layout data 109e3-4, as illustrated with the solid line in FIG. 9, the host controller 109 shifts the edge portions extending almost in the X direction to the +Y side from the edge positions of the first resist pattern illustrated with dotted lines by the amount in accordance with the angle θ. Accordingly, the host controller 109 obtains the corrected layout data 109e3-4 with respect to the outer peripheral area R4.

The host controller 109 generates mask data 109e4-4 for the outer peripheral area R4 according to the corrected layout data 109e3-4 (S15). The host controller 109 supplies the mask data 109e4-4 to the mask formation device 104. If the mask data 109e4-4 is received, the mask formation device 104 forms a mask MK2-4 for the outer peripheral area R4 according to the mask data 109e4-4 (S16). The mask formation device 104 is, for example, an electron beam drawing device, and draws a pattern in accordance with the mask data 109e4-4 on a mask blank to form the mask MK2-4. When the shot area SH that belongs to the outer peripheral area R4 is exposed, the formed mask MK2-4 may be set on the mask stage of the exposure device 103.

In the exposure device 103, the conveyed substrate WF is set on the substrate stage.

When the shot areas SH to be exposed belong to the inner area R0, the exposure device 103 exposes the second resist film formed on the substrate WF with the mask MK2-0 (S17). The exposure device 103 irradiates the mask on the mask stage by the irradiation optical system, projects the irradiation light to the substrate WF on the substrate stage by the projection optical system, and exposes the substrate WF. Accordingly, the latent image pattern is formed in accordance with the mask data 109e2-0 on the second resist film of the substrate WF. The conveyance system 101 conveys the exposed substrate WF to the development device 105.

If the substrate WF is conveyed, the development device 105 develops the second resist film of the substrate WF (S18). The development device 105 develops the latent image pattern formed on the second resist of the substrate WF and forms the second resist pattern on the substrate WF. The conveyance system 101 conveys the substrate WF on which the second resist pattern is formed from the development device 105 to the etching device 106.

If the substrate WF is conveyed, the etching device 106 sets the substrate WF on the stage and performs etching processing on the substrate WF by using the second resist pattern as a mask (S19). The etching device 106 processes the first mask film by using the second resist pattern and the second mask pattern as masks to form the first mask pattern. The etching device 106 processes the film to be processed by using the first mask pattern as a mask and forms a desired pattern.

When the shot areas SH to be exposed belong to the outer peripheral area R1, the exposure device 103 exposes the second resist film formed on the substrate WF with the mask MK2-1 (S17). The exposure device 103 irradiates the mask on the mask stage by the irradiation optical system, projects the irradiation light to the substrate WF on the substrate stage by the projection optical system, and exposes the substrate WF. That is, as the shot areas SH to be exposed belong to the outer peripheral area R1, the exposure device 103 exposes the substrate WF with the exposure patterns of which the edge positions are shifted from the exposure pattern of S5. Accordingly, the latent image pattern is formed in accordance with the mask data 109e2-1 on the second resist film of the substrate WF. The conveyance system 101 conveys the exposed substrate WF to the development device 105.

If the substrate WF is conveyed, the development device 105 develops the second resist film of the substrate WF (S18). The development device 105 develops the latent image pattern formed on the second resist film of the substrate WF and forms the second resist pattern on the substrate WF. The conveyance system 101 conveys the substrate WF on which the second resist pattern is formed from the development device 105 to the etching device 106.

If the substrate WF is conveyed, the etching device 106 sets the substrate WF on the stage and performs etching processing on the substrate WF by using the second resist pattern as a mask (S19). The etching device 106 processes the first mask film by using the second resist pattern and the second mask pattern as masks to form the first mask pattern. Accordingly, with respect to the first mask pattern MP, the inclination angle of the side surface in the cross-sectional view may be asymmetrical on the left and right.

Figure 10:
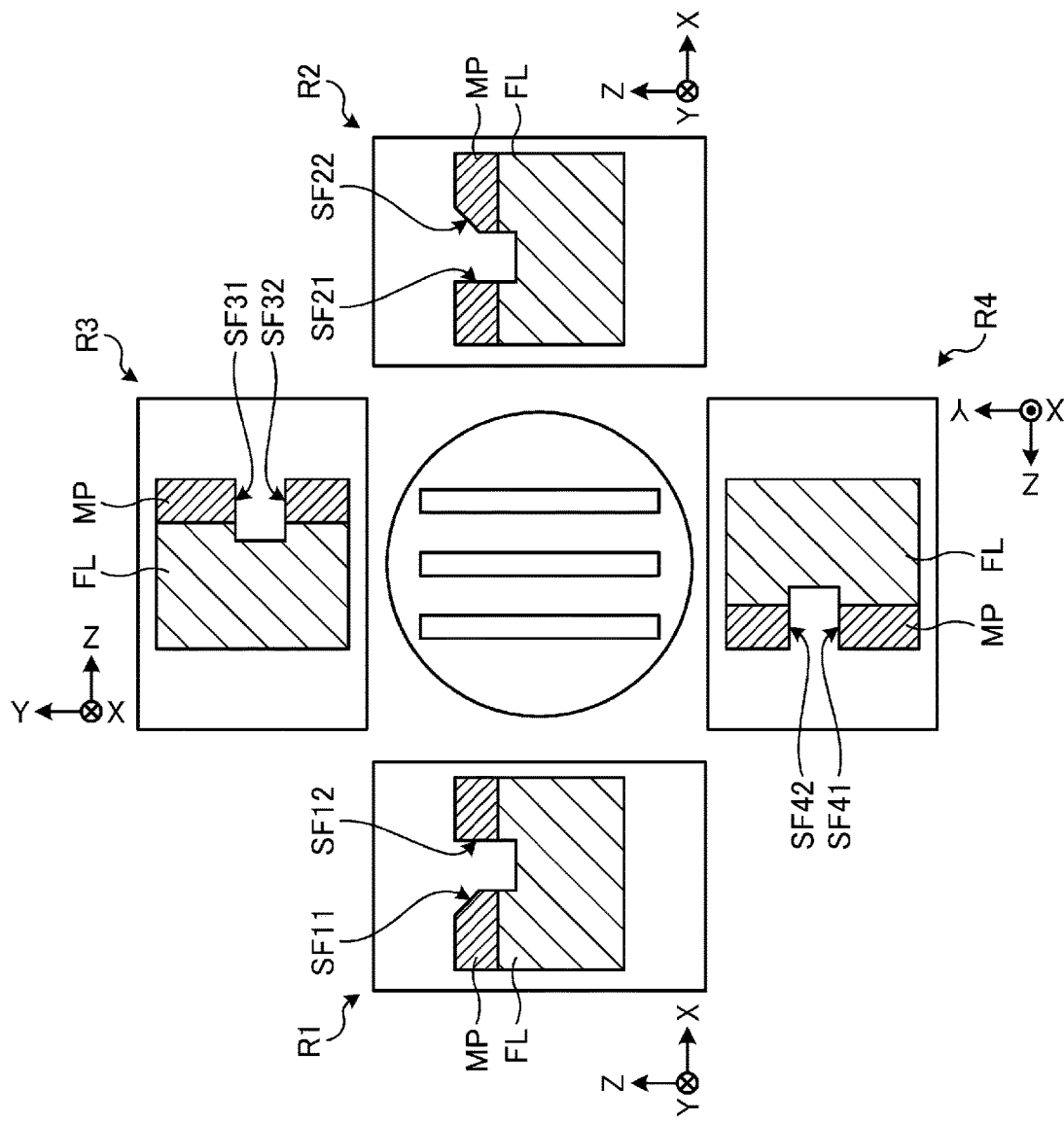
FIG. 10 is a diagram illustrating a processed cross-sectional shape of a mask pattern with respect to the groove pattern according to at least one embodiment (when the worn amount is small).

If it is determined as the worn state="small" in S14, with respect to a groove pattern in a first mask pattern MP in an XZ cross-sectional view of the outer peripheral area R1 illustrated in FIG. 10, the inclination angle of a side surface SF11 on the −X side to the +Z direction which corresponds to the direction of the inclination of the etchant is larger than the inclination angle of a side surface SF12 on the +X side to the +Z direction. In the XZ cross-sectional view of the outer peripheral area R1 illustrated in FIG. 11, the hole pattern in the first mask pattern MP has the inclination angle of the side surface SF11 on the −X side to the +Z direction which corresponds to the direction of the inclination of the etchant larger than the inclination angle of the side surface SF12 on the +X side to the +Z direction. The difference between the inclination angle of the side surface SF11 on the −X side and the inclination angle of the side surface SF12 on the +X side may be 3° to 5°. The etching device 106 performs etching processing on a film to be processed FL by using the first mask pattern MP as a mask. At this point, the inclination angle of the side surface on the −X side in the first mask pattern MP is larger than the inclination angle of the side surface on the +X side. Therefore, the influence due to the inclination of the etchant is prevented, and the etching processing on the film to be processed FL can be performed. Accordingly, a pattern in which the inclination angle of the side surface on the −X side and the inclination angle of the side surface on the +X side are equal in the cross-sectional view can be formed on the film to be processed FL.

If it is determined as the worn state="medium" in S14, the incidence direction of the etchant is rarely tilted, and the influence of the tilting can be neglected. Therefore, etching processing may be performed in the same manner as in the inner area R0.

Figure 12:
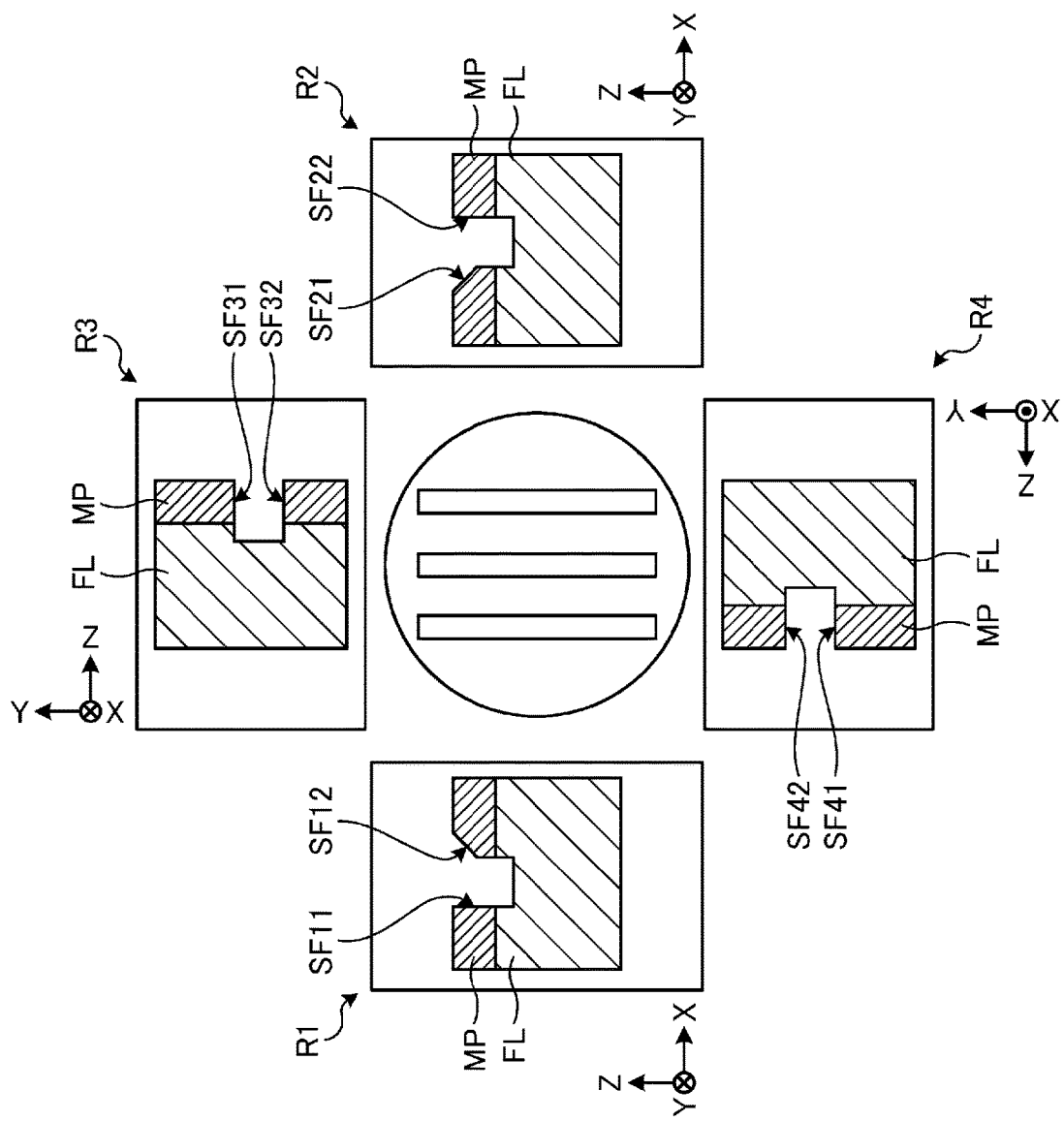
FIG. 12 is a diagram illustrating a processed cross-sectional shape of the mask pattern with respect to the groove pattern according to at least one embodiment (when the worn amount is large).

If it is determined as the worn state="large" in S14, in the XZ cross-sectional view of the outer peripheral area R1 illustrated in FIG. 12, the groove pattern in the first mask pattern MP has the inclination angle of the side surface SF12 on the +X side to the +Z direction which corresponds to the direction of the inclination of the etchant larger than the inclination angle of the side surface SF11 on the −X side to the +Z direction. In the XZ cross-sectional view of the outer peripheral area R1 illustrated in FIG. 13, the hole pattern in the first mask pattern MP has the inclination angle of the side surface SF12 on the +X side to the +Z direction which corresponds to the direction of the inclination of the etchant larger than the inclination angle of the side surface SF11 on the −X side to the +Z direction. The difference between the inclination angle of the side surface SF12 on the +X side and the inclination angle of the side surface SF11 on the −X side may be 3° to 5°. The etching device 106 performs etching processing on a film to be processed FL by using the first mask pattern MP as a mask. At this point, the inclination angle of the side surface on the +X side in the first mask pattern MP is larger than the inclination angle of the side surface on the −X side. Therefore, the influence due to the inclination of the etchant is prevented, and the etching processing on the film to be processed FL can be performed. Accordingly, a pattern in which the inclination angle of the side surface on the +X side and the inclination angle of the side surface on the −X side are equal in the cross-sectional view can be formed on the film to be processed FL.

When the shot areas SH to be exposed belong to the outer peripheral area R2, the exposure device 103 exposes the second resist film formed on the substrate WF with the mask MK2-2 (S17). The exposure device 103 irradiates the mask on the mask stage by the irradiation optical system, projects the irradiation light to the substrate WF on the substrate stage by the projection optical system, and exposes the substrate WF. That is, as the shot areas SH to be exposed belong to the outer peripheral area R2, the exposure device 103 exposes the substrate WF with the exposure patterns of which the edge positions are shifted from the exposure pattern of S5. Accordingly, the latent image pattern is formed in accordance with mask data 109e2-2 on the second resist film of the substrate WF. The conveyance system 101 conveys the exposed substrate WF to the development device 105.

If the substrate WF is conveyed, the development device 105 develops the second resist film of the substrate WF (S18). The development device 105 develops the latent image pattern formed on the second resist film of the substrate WF and forms the second resist pattern on the substrate WF. The conveyance system 101 conveys the substrate WF on which the second resist pattern is formed from the development device 105 to the etching device 106.

If the substrate WF is conveyed, the etching device 106 sets the substrate WF on the stage and performs etching processing on the substrate WF by using the second resist pattern as a mask (S19). The etching device 106 processes the first mask film by using the second resist pattern and the second mask pattern as masks to form the first mask pattern. Accordingly, with respect to the first mask pattern MP, the inclination angle of the side surface in the cross-sectional view may be asymmetrical on the left and right.

If it is determined as the worn state="small" in S14, in the XZ cross-sectional view of the outer peripheral area R2 illustrated in FIG. 10, the groove pattern in the first mask pattern MP has the inclination angle of a side surface SF21 on the +X side to the +Z direction which corresponds to the direction of the inclination of the etchant larger than the inclination angle of a side surface SF22 on the −X side to the +Z direction. In the XZ cross-sectional view of the outer peripheral area R2 illustrated in FIG. 11, the hole pattern in the first mask pattern MP has the inclination angle of the side surface SF22 on the +X side to the +Z direction which corresponds to the direction of the inclination of the etchant larger than the inclination angle of the side surface SF21 on the −X side to the +Z direction. The difference between the inclination angle of the side surface SF22 on the +X side and the inclination angle of the side surface SF21 on the −X side may be 3° to 5°. The etching device 106 performs etching processing on a film to be processed FL by using the first mask pattern MP as a mask. At this point, the inclination angle of the side surface on the +X side in the first mask pattern MP is larger than the inclination angle of the side surface on the −X side. Therefore, the influence due to the inclination of the etchant is prevented, and the etching processing on the film to be processed FL can be performed. Accordingly, a pattern in which the inclination angle of the side surface on the +X side and the inclination angle of the side surface on the −X side are equal in the cross-sectional view can be formed on the film to be processed FL.

If it is determined as the worn state="medium" in S14, the incidence direction of the etchant is rarely tilted, and the influence of the tilting can be neglected. Therefore, etching processing may be performed in the same manner as in the inner area R0.

If it is determined as the worn state="large" in S14, in the XZ cross-sectional view of the outer peripheral area R2 illustrated in FIG. 12, the groove pattern in the first mask pattern MP has the inclination angle of the side surface SF21 on the −X side to the +Z direction which corresponds the direction of the inclination of the etchant larger than the inclination angle of the side surface SF22 on the +X side to the +Z direction. In the XZ cross-sectional view of the outer peripheral area R2 illustrated in FIG. 13, the hole pattern in the first mask pattern MP has the inclination angle of the side surface SF21 on the −X side to the +Z direction which corresponds to the direction of the inclination of the etchant larger than the inclination angle of the side surface SF22 on the +X side to the +Z direction. The difference between the inclination angle of the side surface SF21 on the −X side and the inclination angle of the side surface SF22 on the +X side may be 3° to 5°. The etching device 106 performs etching processing on a film to be processed FL by using the first mask pattern MP as a mask. At this point, the inclination angle of the side surface on the −X side in the first mask pattern MP is larger than the inclination angle of the side surface on the +X side. Therefore, the influence due to the inclination of the etchant is prevented, and the etching processing on the film to be processed FL can be performed. Accordingly, a pattern in which the inclination angle of the side surface on the −X side and the inclination angle of the side surface on the +X side are equal in the cross-sectional view can be formed on the film to be processed FL.

When the shot areas SH to be exposed belong to the outer peripheral area R3, the exposure device 103 exposes the second resist film formed on the substrate WF with the mask MK2-3 (S17). The exposure device 103 irradiates the mask on the mask stage by the irradiation optical system, projects the irradiation light to the substrate WF on the substrate stage by the projection optical system, and exposes the substrate WF. That is, as the shot areas SH to be exposed belong to the outer peripheral area R3, the exposure device 103 exposes the substrate WF with the exposure patterns of which the edge positions are shifted from the exposure pattern of S5. Accordingly, the latent image pattern is formed in accordance with mask data 109e2-3 on the second resist film of the substrate WF. The conveyance system 101 conveys the exposed substrate WF to the development device 105.

If the substrate WF is conveyed, the development device 105 develops the second resist film of the substrate WF (S18). The development device 105 develops the latent image pattern formed on the second resist film of the substrate WF and forms the second resist pattern on the substrate WF. The conveyance system 101 conveys the substrate WF on which the second resist pattern is formed from the development device 105 to the etching device 106.

If the substrate WF is conveyed, the etching device 106 sets the substrate WF on the stage and performs etching processing on the substrate WF by using the second resist pattern as a mask (S19). The etching device 106 processes the first mask film by using the second resist pattern and the second mask pattern as masks to form the first mask pattern. Accordingly, with respect to the first mask pattern MP, the inclination angle of the side surface in the cross-sectional view may be asymmetrical on the left and right.

If it is determined as the worn state="small" in S14, in the YZ cross-sectional view of the outer peripheral area R3 illustrated in FIG. 10, the influence of the tilting on the groove pattern in the first mask pattern MP can be neglected, and thus the inclination angle of a side surface SF31 on the +Y side and the inclination angle of a side surface SF32 on the −Y side are equal. In the YZ cross-sectional view of the outer peripheral area R3 illustrated in FIG. 11, the hole pattern in the first mask pattern MP has the inclination angle of the side surface SF31 on the +Y side to the +Z direction which corresponds to the direction of the inclination of the etchant larger than the inclination angle of the side surface SF32 on the −Y side to the +Z direction. The difference between the inclination angle of the side surface SF31 on the +Y side and the inclination angle of the side surface SF32 on the −Y side may be 3° to 5°. The etching device 106 performs etching processing on a film to be processed FL by using the first mask pattern MP as a mask. At this point, in case of the hole pattern, the inclination angle of the side surface on the +Y side in the first mask pattern MP is larger than the inclination angle of the side surface on the −Y side. Therefore, the influence due to the inclination of the etchant is prevented, and the etching processing on the film to be processed FL can be performed. Accordingly, a pattern in which the inclination angle of the side surface on the +Y side and the inclination angle of the side surface on the −Y side are equal in the cross-sectional view can be formed on the film to be processed FL.

If it is determined as the worn state="medium" in S14, the incidence direction of the etchant is rarely tilted, and the influence of the tilting can be neglected. Therefore, etching processing may be performed in the same manner as in the inner area R0.

If it is determined as the worn state="large" in S14, in the YZ cross-sectional view of the outer peripheral area R3 illustrated in FIG. 12, the influence of the tilting on the groove pattern in the first mask pattern MP can be neglected, and thus the inclination angle of the side surface SF32 on the −Y side and inclination angle of the side surface SF31 on the +Y side are equal. In the YZ cross-sectional view of the outer peripheral area R3 illustrated in FIG. 13, the hole pattern in the first mask pattern MP has the inclination angle of the side surface SF32 on the −Y side to the +Z direction which corresponds to the direction of the inclination of the etchant larger than the inclination angle of the side surface SF31 on the +Y side to the +Z direction. The difference between the inclination angle of the side surface SF32 on the −Y side and the inclination angle of the side surface SF31 on the +Y side may be 3° to 5°. The etching device 106 performs etching processing on a film to be processed FL by using the first mask pattern MP as a mask. At this point, the inclination angle of the side surface on the −Y side in the first mask pattern MP is larger than the inclination angle of the side surface on the +Y side. Therefore, the influence due to the inclination of the etchant is prevented, and the etching processing on the film to be processed FL can be performed. Accordingly, a pattern in which the inclination angle of the side surface on the −Y side and the inclination angle of the side surface on the +Y side are equal in the cross-sectional view can be formed on the film to be processed FL.

When the shot areas SH to be exposed belong to the outer peripheral area R4, the exposure device 103 exposes the second resist film formed on the substrate WF with the mask MK2-4 (S17). The exposure device 103 irradiates the mask on the mask stage by the irradiation optical system, projects the irradiation light to the substrate WF on the substrate stage by the projection optical system, and exposes the substrate WF. That is, as the shot areas SH to be exposed belong to the outer peripheral area R4, the exposure device 103 exposes the substrate WF with the exposure patterns of which the edge positions are shifted from the exposure pattern of S5. Accordingly, the latent image pattern is formed in accordance with mask data 109e2-4 on the second resist film of the substrate WF. The conveyance system 101 conveys the exposed substrate WF to the development device 105.

If the substrate WF is conveyed, the development device 105 develops the second resist film of the substrate WF (S18). The development device 105 develops the latent image pattern formed on the second resist film of the substrate WF and forms the second resist pattern on the substrate WF. The conveyance system 101 conveys the substrate WF on which the second resist pattern is formed from the development device 105 to the etching device 106.

If the substrate WF is conveyed, the etching device 106 sets the substrate WF on the stage and performs etching processing on the substrate WF by using the second resist pattern as a mask (S19). The etching device 106 processes the first mask film by using the second resist pattern and the second mask pattern as masks to form the first mask pattern. Accordingly, with respect to the first mask pattern MP, the inclination angle of the side surface in the cross-sectional view may be asymmetrical on the left and right.

For example, if it is determined as the worn state="small" in S14, with respect to the groove pattern in the first mask pattern MP in the YZ cross-sectional view of the outer peripheral area R4 illustrated in FIG. 10, the influence of the tilting can be neglected, and thus the inclination angle of a side surface SF41 on the −Y side and inclination angle of a side surface SF42 on the +Y side are equal. In the YZ cross-sectional view of the outer peripheral area R4 illustrated in FIG. 11, the hole pattern in the first mask pattern MP has the inclination angle of the side surface SF41 on the −Y side to the +Z direction which corresponds to the direction of the inclination of the etchant larger than the inclination angle of the side surface SF42 on the +Y side to the +Z direction. The difference between the inclination angle of the side surface SF41 on the −Y side and the inclination angle of the side surface SF42 on the +Y side may be 3° to 5°. The etching device 106 performs etching processing on a film to be processed FL by using the first mask pattern MP as a mask. At this point, the inclination angle of the side surface SF41 on the −Y side in the first mask pattern MP is larger than the inclination angle of the side surface SF42 on the +Y side. Therefore, the influence due to the inclination of the etchant is prevented, and the etching processing on the film to be processed FL can be performed. Accordingly, a pattern in which the inclination angle of the side surface on the −Y side and the inclination angle of the side surface on the +Y side are equal in the cross-sectional view can be formed on the film to be processed FL.

If it is determined as the worn state="medium" in S14, the incidence direction of the etchant is rarely tilted, and the influence of the tilting can be neglected. Therefore, etching processing may be performed in the same manner as in the inner area R0.

If it is determined as the worn state="large" in S14, in the YZ cross-sectional view of the outer peripheral area R4 illustrated in FIG. 12, the influence of the tilting on the groove pattern in the first mask pattern MP can be neglected, and thus the inclination angle of the side surface SF42 on the +Y side and the inclination angle of the side surface SF41 on the −Y side are equal. In the YZ cross-sectional view of the outer peripheral area R4 illustrated in FIG. 13, the hole pattern in the first mask pattern MP has the inclination angle of the side surface SF42 on the +Y side to the +Z direction which corresponds to the direction of the inclination of the etchant larger than the inclination angle of the side surface SF41 on the −Y side to the +Z direction. The difference between the inclination angle of the side surface SF42 on the +Y side and the inclination angle of the side surface SF41 on the −Y side may be 3° to 5°. The etching device 106 performs etching processing on a film to be processed FL by using the first mask pattern MP as a mask. At this point, in case of the hole pattern, the inclination angle of the side surface on the +Y side in the first mask pattern MP is larger than the inclination angle of the side surface on the −Y side. Therefore, the influence due to the inclination of the etchant is prevented, and the etching processing on the film to be processed FL can be performed. Accordingly, a pattern in which the inclination angle of the side surface on the +Y side and the inclination angle of the side surface on the −Y side are equal in the cross-sectional view can be formed on the film to be processed FL.

Figure 11:
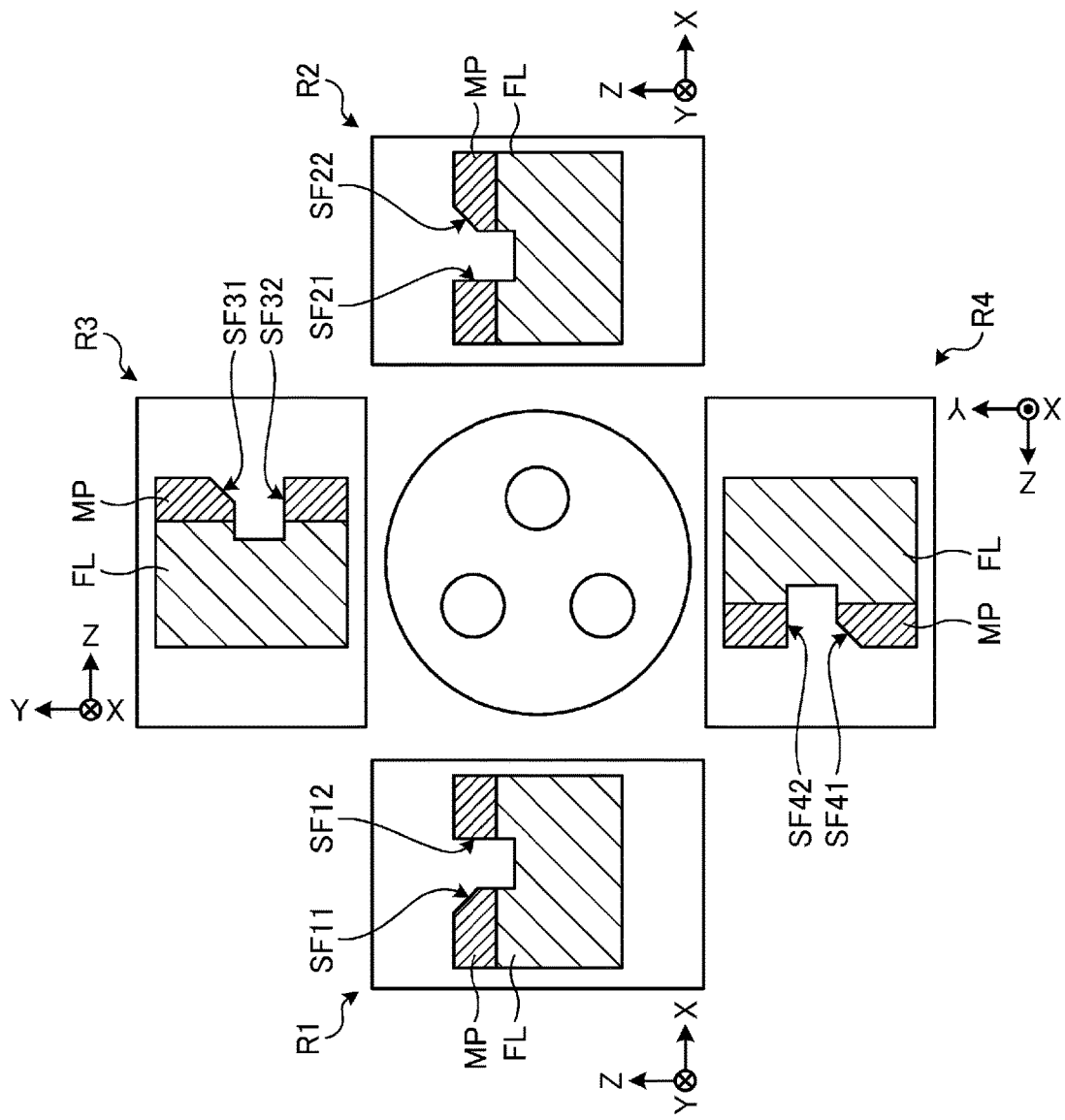
FIG. 11 is a diagram illustrating a processed cross-sectional shape of the mask pattern with respect to the hole pattern according to at least one embodiment (when the worn amount is small).
Figure 13:
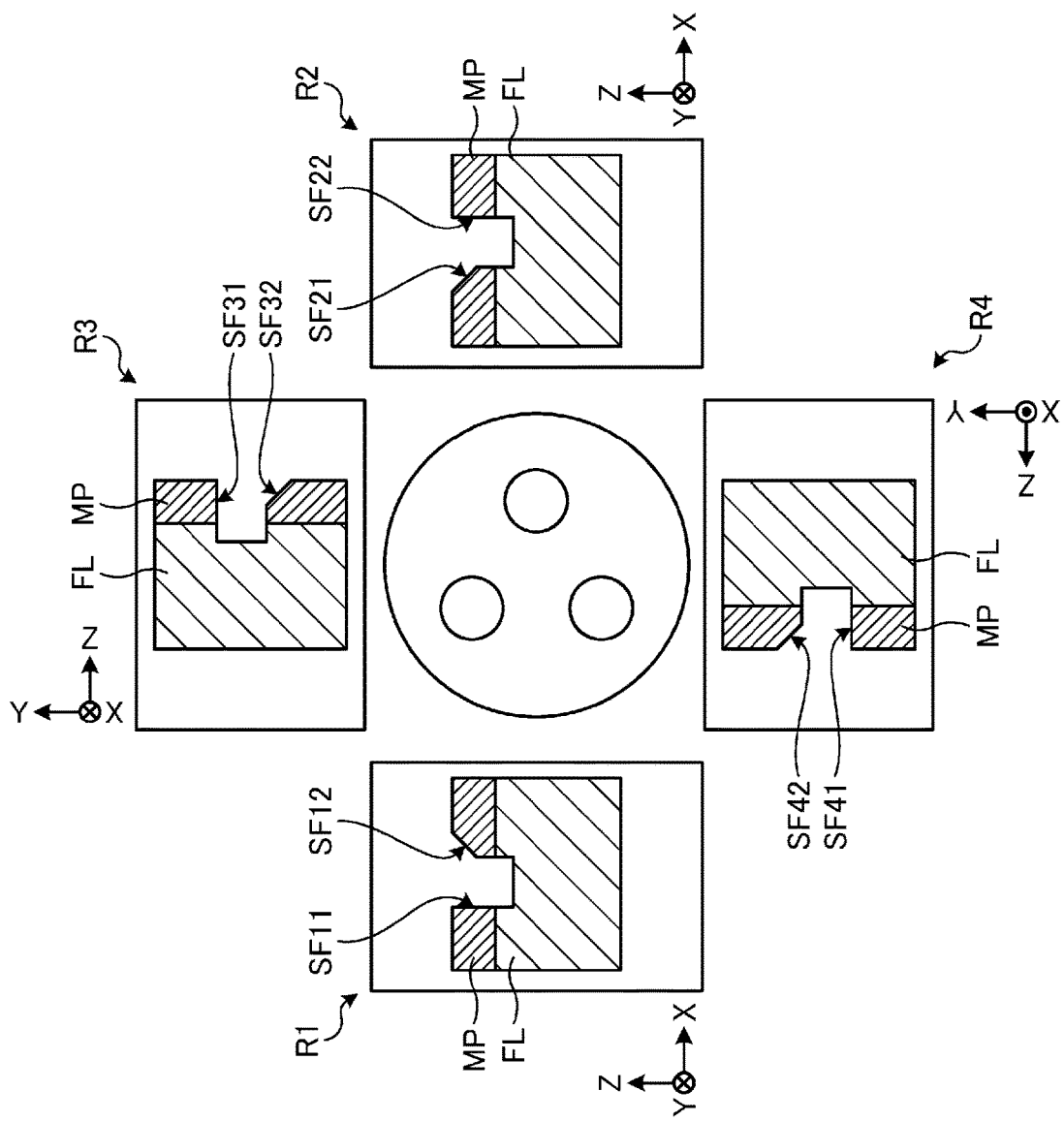
FIG. 13 is a diagram illustrating a processed cross-sectional shape of the mask pattern with respect to the hole pattern according to at least one embodiment (when the worn amount is large).

In addition, FIG. 10 is a diagram illustrating the processed cross-sectional shape of the mask pattern with respect to the groove pattern (when the worn amount is small). FIG. 11 is a diagram illustrating the processed cross-sectional shape of the mask pattern with respect to the hole pattern (when the worn amount is small). FIG. 12 is a diagram illustrating the processed cross-sectional shape of the mask pattern with respect to the groove pattern (when the worn amount is large). FIG. 13 is a diagram illustrating the processed cross-sectional shape of the mask pattern with respect to the hole pattern (when the worn amount is large). In FIGS. 10 to 13, when the side surface of the processed cross section includes an inclined portion and a non-inclined portion, the inclined portion is described as a side surface by focusing on the inclined portion.

Figure 14:
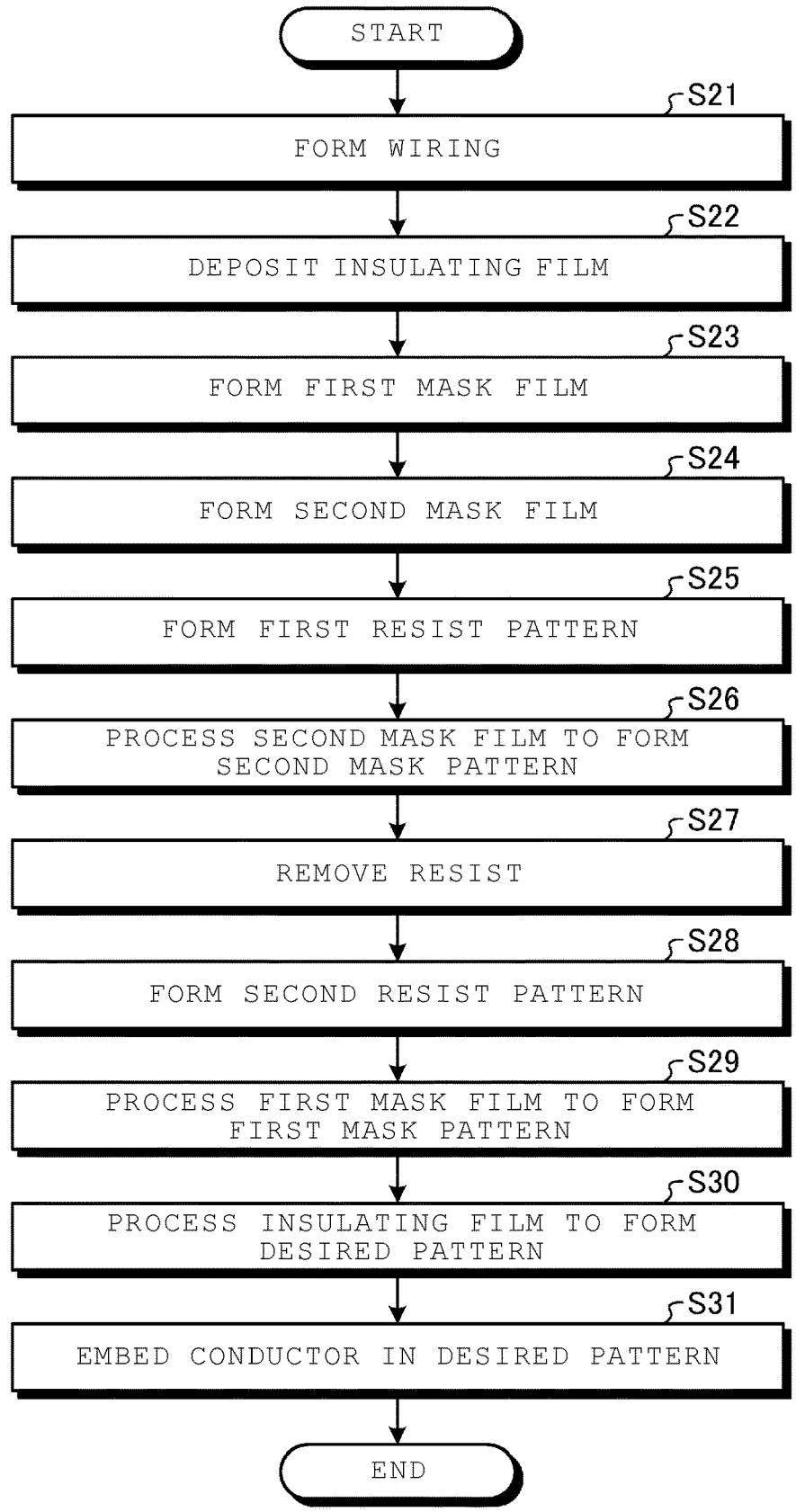
FIG. 14 is a flowchart illustrating a method of manufacturing a semiconductor device according to t at least one he embodiment.
Figure 18:
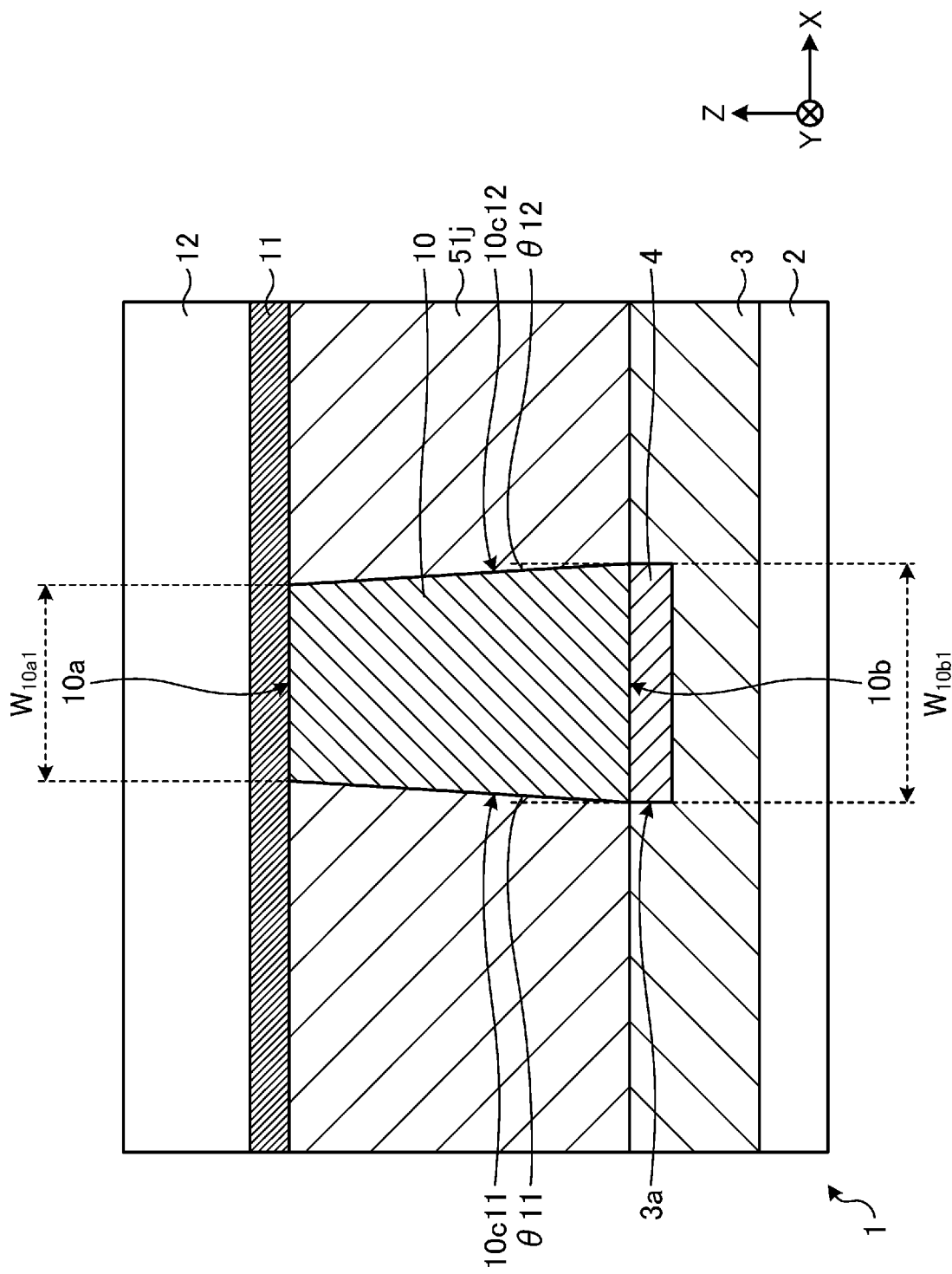
FIG. 18 is a cross sectional view illustrating the method of manufacturing the semiconductor device and a configuration thereof according to at least one embodiment.
Figure 19:
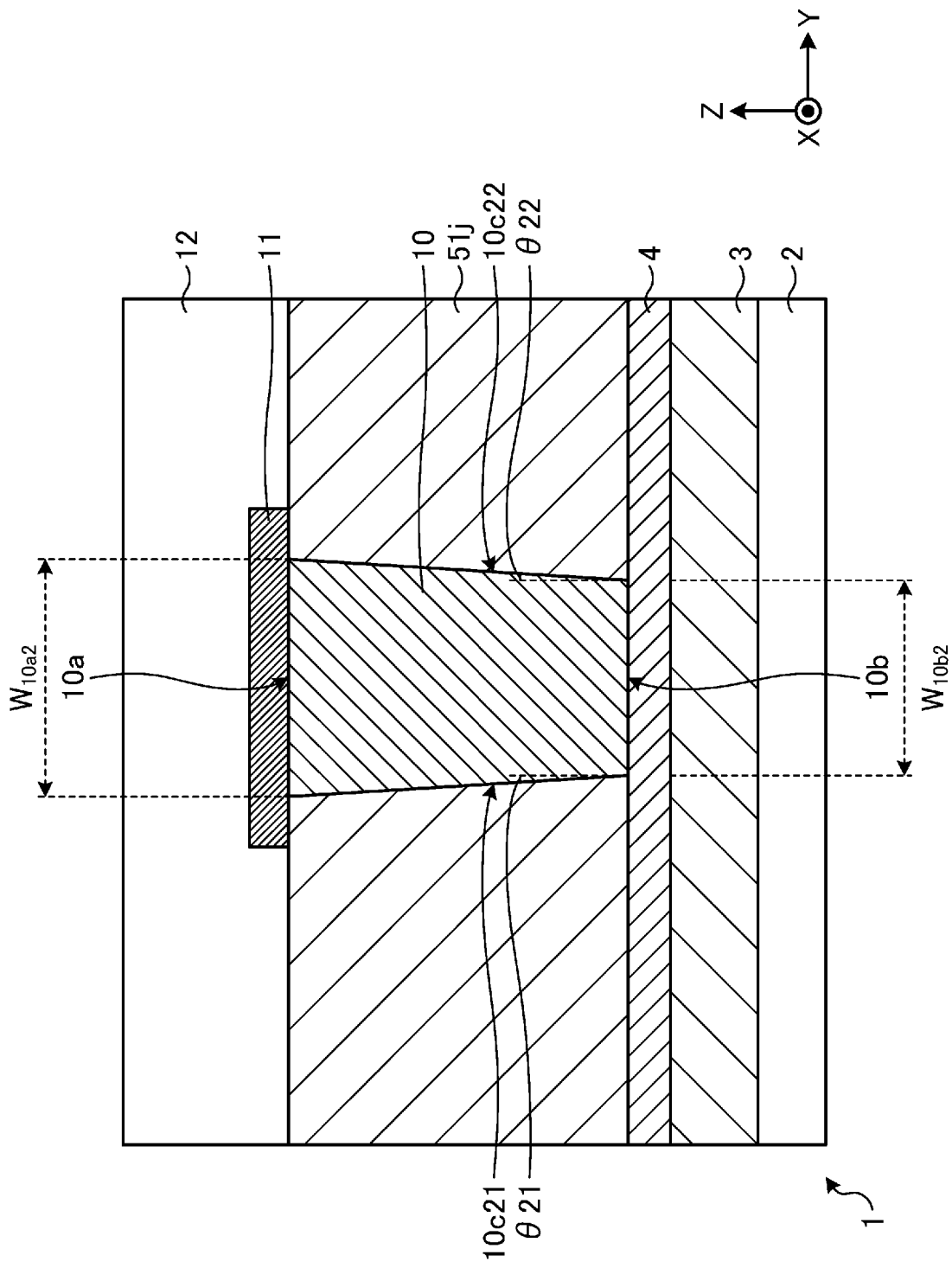
FIG. 19 is a cross sectional view illustrating the method of manufacturing the semiconductor device and a configuration thereof according to at least one embodiment.

Subsequently, the method of manufacturing the semiconductor device 1 is described with reference to FIGS. 14 to 19. FIG. 14 is a flowchart illustrating the method of manufacturing the semiconductor device 1. FIGS. 15A to 17C are cross sectional views illustrating the method of manufacturing the semiconductor device 1. FIGS. 18 and 19 are cross sectional views illustrating the method of manufacturing the semiconductor device and the configuration thereof. In FIGS. 14 to 19, formation of the hole pattern (see FIG. 7) of the outer peripheral area R1 when it is determined as the worn state="small" with respect to the worn state of the part of the etching device 106 is illustrated. However, the same may be applied to other cases, other areas, and other patterns.

Figure 15A:
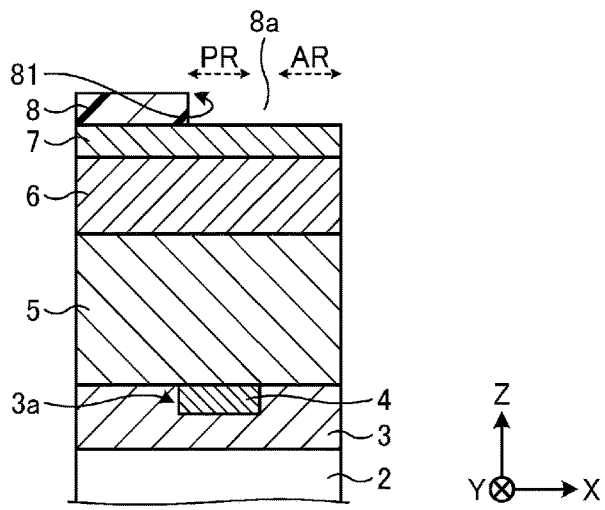
FIGS. 15A to 15C are cross sectional views illustrating the method of manufacturing the semiconductor device according to at least one embodiment.
Figure 15B:
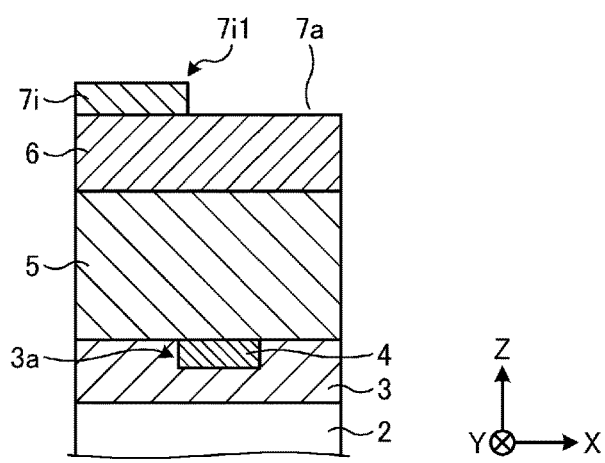

The wiring 4 is formed on the +Z side of a substrate 2 (S21). The substrate 2 may be formed of a material with a semiconductor such as silicon as a main component. As illustrated in FIG. 15A, an insulating film 3 such as a silicon oxide film is deposited on the +Z side of the substrate 2 by the film formation device 107. The coating device 102, the exposure device 103, and the development device 105 form a resist pattern in which an area to be a groove 3a is selectively opened on the surface of the insulating film 3 on the +Z side. The etching device 106 performs the etching processing by using the resist pattern as a mask and forms the groove 3a on the insulating film 3. A plating device (not illustrated) embeds a material including a conductor (for example, copper, titanium, and tungsten) as a main component in the groove 3a, and a CMP device (not illustrated) performs flattening until the insulating film 3 is exposed to form a wiring 4.

An insulating film 5 is deposited on the +Z side of the insulating film 3 and the wiring 4 (S22). As illustrated in FIG. 15A, the film formation device 107 deposits the insulating film 5 such as a silicon oxide film on the +Z side of the insulating film 3 and the wiring 4.

A first mask film 6 is formed on the +Z side of the insulating film 5 (S23). As illustrated in FIG. 15A, the coating device 102 forms the first mask film 6 on the insulating film 5 by coating. The first mask film is a film, for example, including carbon as a main component and may be a Spin On Carbon (SOC) film in case of being formed by spin coating.

A second mask film 7 is formed on the +Z side of the first mask film 6 (S24). As illustrated in FIG. 15A, the coating device 102 forms the second mask film 7 on the first mask film 6 by coating. The second mask film is a film, for example, including silicon oxide as a main component, and may be a Spin On Glass (SOG) film in case of being formed by spin coating.

A first resist pattern 8 is formed on the +Z side of the second mask film 7 (S25). The coating device 102 forms a first resist film 8' (not illustrated) on the +Z side of the second mask film 7 by coating. The first resist film 8' is a photoresist, for example, including a photosensitive material as a main component. The structure in which the first mask film 6, the second mask film 7, and the first resist film 8' are sequentially deposited configures a multilayer resist structure. The exposure device 103 exposes the first resist film 8' to form the latent image corresponding to an opening pattern 8a to be formed on the first resist film 8'. The development device 105 develops the latent image of the first resist film 8' to form the first resist pattern 8. The first resist pattern 8 includes the opening pattern 8a. The opening pattern 8a is a pattern in which an area AR on the +X side is further opened in addition to an area PR in accordance with the pattern of the layout data (see the hole patterns illustrated with dotted lines of the outer peripheral area R1 of FIG. 7). The first resist pattern 8 includes an edge 81 extending almost in the Y direction on the −X side of the area PR.

The second mask film 7 is processed to form a second mask pattern 7i (S26). The etching device 106 performs etching processing on the second mask film 7 by using the first resist pattern 8 as a mask. Accordingly, the first resist pattern 8 is transferred to the second mask film 7, and the second mask pattern 7i including an edge 7i1 corresponding to an edge 81 is formed. The second mask pattern 7i includes an opening pattern 7a corresponding to the opening pattern 8a. Accordingly, the first mask film 6 is exposed in areas corresponding the area PR and the area AR (see FIG. 15A).

Figure 15C:
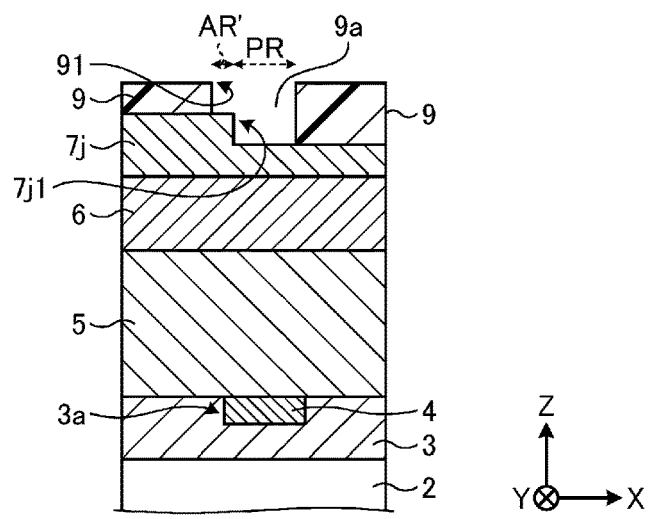

The resist is removed (S27). If the resist remains after the etching, the resist is removed by a chemical solution such as sulfuric acid. As illustrated in FIG. 15C, the coating device 102 additionally coats the +Z side of the second mask pattern 7i and the first mask film 6 with the second mask film 7 to form a second mask pattern 7j. The second mask pattern 7j is a pattern including an edge 7j1 corresponding to the edge 7i1 and in which an area corresponding to the second mask pattern 7i is thicker than the other areas. The edge 7j1 is disposed in a step portion in the second mask pattern 7j.

A second resist pattern 9 is formed on the +Z side of the second mask pattern 7j (S28). The coating device 102 forms a second resist film 9' (not illustrated) on the +Z side of the second mask pattern 7j by coating. The second resist film 9' is a photoresist, for example, including a photosensitive material as a main component. The structure in which the first mask film 6, the second mask film 7, and the second resist film 9' are sequentially deposited configures a multilayer resist structure. The exposure device 103 exposes the second resist film 9' to form a latent image corresponding to an opening pattern 9a to be formed on the second resist film 9'. The development device 105 develops the latent image of the second resist film 9' and forms the second resist pattern 9 as illustrated in FIG. 15C. The second resist pattern 9 includes the opening pattern 9a. The opening pattern 9a is a pattern in which the area AR' on the −X side is further opened in addition to the area PR in accordance with the pattern of the layout data (see the hole patterns illustrated with the solid lines in the outer peripheral area R1 of FIG. 7). The second resist pattern 9 includes an edge 91 extending almost in the Y direction on the −X side of the area AR'. The edge 91 is an edge recedes in the −X direction with respect to the edge 81. Accordingly, in the XZ cross-sectional view, the side surface of the opening pattern 9a on the −X side has a step shape. The side surface of the opening pattern 9a on the +X side extends along the Z direction.

Figure 16A:
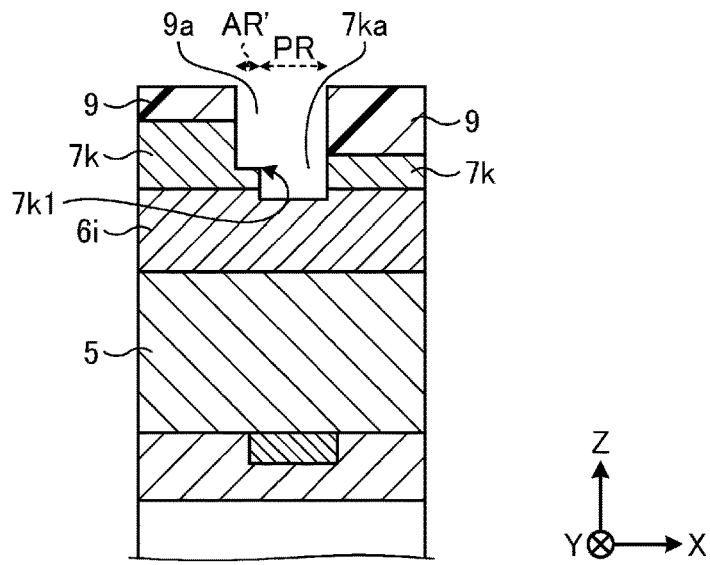
FIGS. 16A to 16C are cross sectional views illustrating the method of manufacturing the semiconductor device according to at least one embodiment.

The first mask film 6 is processed to form a first mask pattern 6j (S29). As illustrated in FIG. 16A, the etching device 106 performs etching processing on the second mask pattern 7j by using the second resist pattern 9 as a mask. Accordingly, the second resist pattern 9 is transferred to the second mask pattern 7j, so that the Z position of an edge 7k1 in a second mask pattern 7k goes further to the −Z side and an opening pattern 7ka is formed. The opening pattern 7ka does not pass through the second mask pattern 7k in the area AR' but passes through the second mask pattern 7k in an area PR. By the opening pattern 7ka, a portion of the surface of a first mask film 6i on the +Z side is exposed.

Figure 16B:
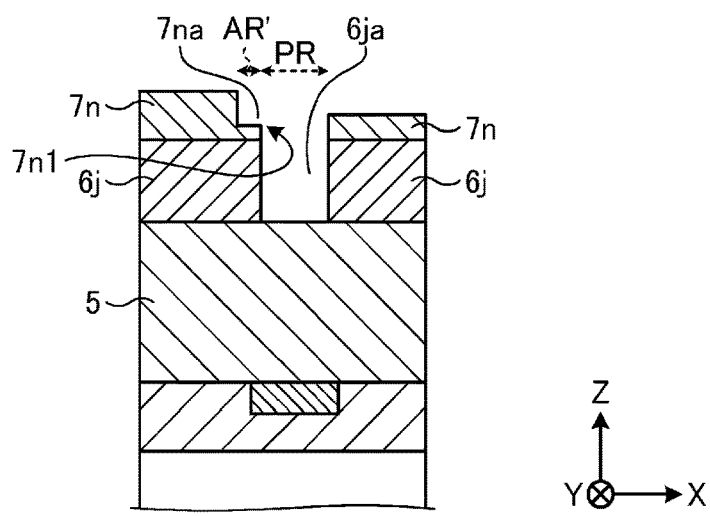

As illustrated in FIG. 16B, the etching device 106 performs etching processing on the first mask film 6i by using the second resist pattern 9 and the second mask pattern 7k as masks. Accordingly, the second resist pattern 9 is transferred to the second mask pattern 7k, and the Z position of an edge 7n1 in a second mask pattern 7n goes further to the −Z side. Also, the second mask pattern 7k is transferred to the first mask film 6i, and the first mask pattern 6j with an opening pattern 6j a is formed. The opening pattern 6j a passes through the first mask pattern 6j in the area PR. A portion of the surface of the insulating film 5 on the +Z side is exposed by the opening pattern 6ja.

Figure 16C:
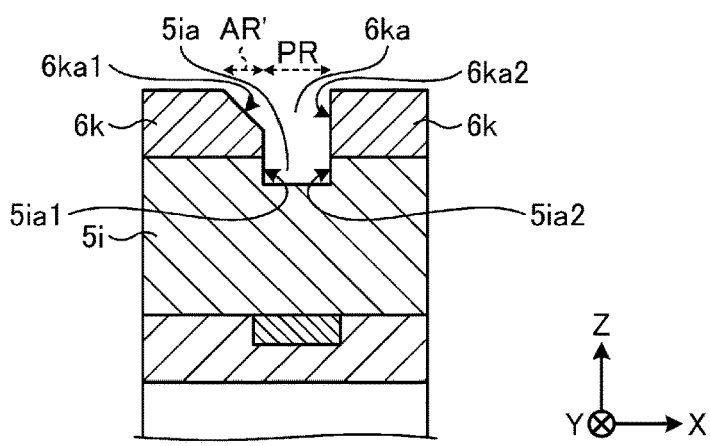

The insulating film 5 is processed to form a desired pattern (S30). As illustrated in FIG. 16C, the etching device 106 performs etching processing on the first mask pattern 6j by using the second mask pattern 7n as a mask and performs the etching processing on the insulating film 5 by using the first mask pattern 6j as a mask. Accordingly, the second mask pattern 7n is transferred to the first mask pattern 6j, and the edge corresponding to the edge 7n1 is transferred to the first mask pattern 6j. At this point, the side wall protective film of the anisotropic etching is hardly deposited on a first mask pattern 6k, a portion near the edge in the first mask pattern 6k is preferentially etched due to the electric field concentration at the edge, and the step shape of the side surface in accordance with the edge is changed to the inclined surface shape, to form a side surface 6ka1 that is inclined to the −X side of an opening pattern 6ka. That is, in the opening pattern 6ka of the first mask pattern 6k, the inclination angle of a side surface 16ka1 on the −X side to the +Z direction which corresponds to the direction of the inclination of the etchant is larger than the inclination angle of a side surface 6ka2 on the +X side to the +Z direction. Accordingly, a hole pattern 5ia in which inclination angle of a side surface 5ia1 on the −X side and the inclination angle of a side surface 5ia2 on the +X side are equal in the XZ cross-sectional view is started to be formed on the insulating film 5i.

Figure 17A:
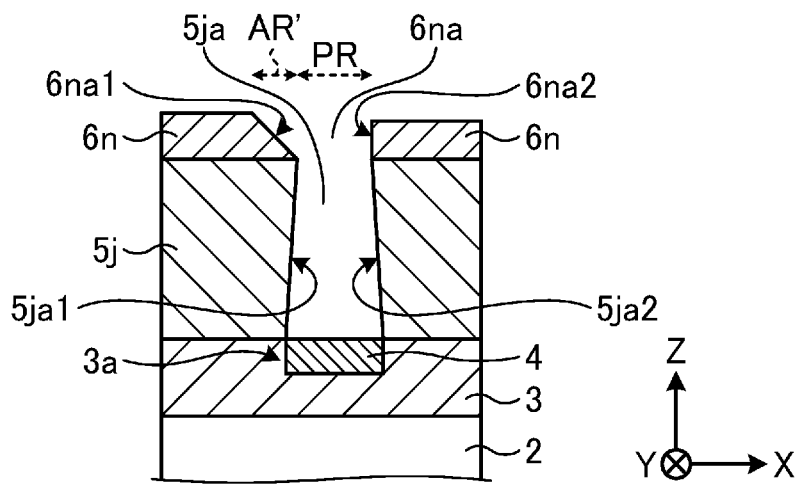
FIGS. 17A to 17C are cross sectional views illustrating the method of manufacturing the semiconductor device according to at least one embodiment.
Figure 17B:
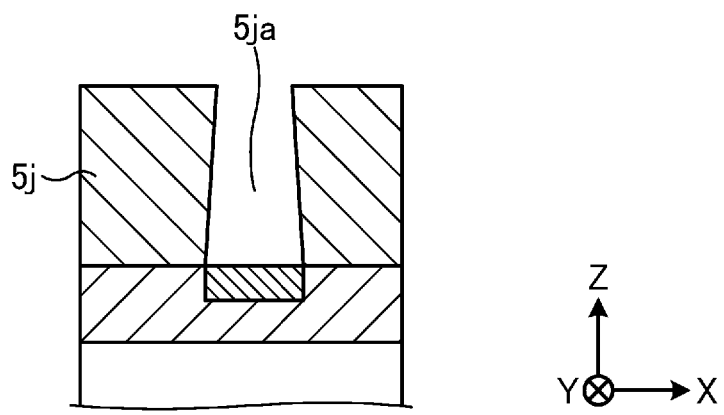

As illustrated in FIG. 17A, the etching device 106 continuously performs etching processing and performs etching processing on an insulating film 5j by using a first mask pattern 6n as a mask. At this point, in an opening pattern 6na of the first mask pattern 6n, the inclination angle of a side surface 6na1 on the −X side is larger than the inclination angle of a side surface 6na2 on the +X side, so that the insulating film 5j can be subjected to the etching processing by preventing the influence caused by the inclination of the etchant. Accordingly, a hole pattern 5ja in which the inclination angle of a side surface 5ja1 on the −X side and the inclination angle of a side surface 5ja2 on the +X side are equal in the XZ cross-sectional view can be formed on the insulating film 5j. The hole pattern 5ja exposes the front surface of the wiring 4. As illustrated in FIG. 17B, the first mask pattern 6n is removed by a predetermined chemical solution.

Figure 17C:
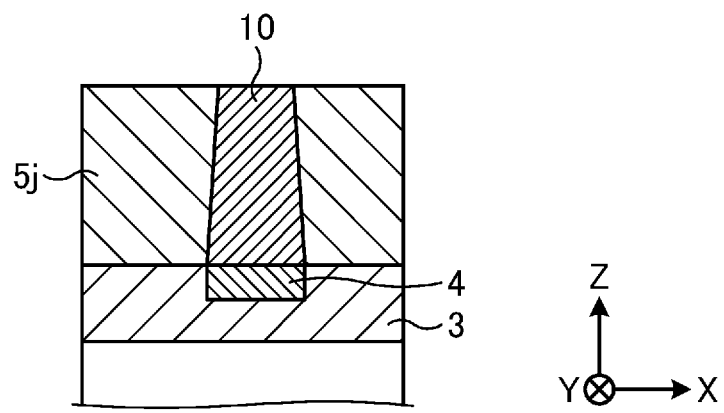

A conductor is embedded in the desired pattern (S31). As illustrated in FIG. 17C, the plating device embeds a material including a conductor (for example, copper, titanium, and tungsten) as a main component in the hole pattern 5ja, and the CMP device performs flattening until the insulating film 5j is exposed to form a through via 10. The end portion of the through via 10 on the −Z side is in contact with the wiring 4 and is electrically connected to the wiring 4.

Thereafter, as illustrated in FIGS. 18 and 19, a wiring 11 and an insulating film 12 are formed on the +Z side of the through via 10, to manufacture the semiconductor device 1.

Subsequently, the configuration of the semiconductor device 1 is described by using FIGS. 18 to 20B. FIG. 18 illustrates an XZ cross section when the semiconductor device 1 is cut at the position passing through the through via 10, and FIG. 19 is a YZ cross section when the semiconductor device 1 is cut at the position passing through the through via 10. FIGS. 20A and 20B are perspective views illustrating the configuration of the semiconductor device 1. FIG. 20A is a perspective view including the XZ cross section corresponding to FIG. 18, and FIG. 20B is a perspective view including the YZ cross section corresponding to FIG. 19. In FIGS. 20A and 20B, for simplicity, the wiring 11 and the insulating film 12 are not illustrated. In FIGS. 18 to 20B, the configuration corresponding to the hole pattern of the outer peripheral area R1 (see FIG. 7) when it is determined as the worn state="small" with respect to the worn state of the part of the etching device 106 is illustrated. However, the same may be applied to other cases, other areas, and other patterns.

The substrate 2 extends in a plate shape in the X direction and the Y direction. The substrate 2 may be formed of a material including a semiconductor (for example, silicon) as a main component.

The insulating film 3 is disposed on the +Z side of the substrate 2, and coves the surface of the substrate 2 on the +Z side. The insulating film 3 may be formed with a material including silicon oxide as a main component. The insulating film 3 includes the groove 3a on the surface on the +Z side.

The wiring 4 is disposed in the groove 3a on the insulating film 3. The wiring 4 extends in a line shape along the Y direction. The wiring 4 may be formed of a material including a conductor (for example, copper, titanium, and tungsten) as a main component. In the wiring 4, the surface on the +Z side is in contact with the through via 10, and the wiring 4 is electrically connected to the through via 10.

An insulating film 51j is disposed on the substrate 2 and the insulating film 3 on the +Z side, so that the surface of the insulating film 3 on the +Z side is covered. The insulating film 51j may be formed of a material including silicon oxide as a main component. The insulating film 51j is penetrated by the through via 10 in the Z direction.

The through via 10 is disposed on the substrate 2, the insulating film 3, and the wiring 4 on the +Z side, is disposed on the wiring 11 and the insulating film 12 on the −Z side, and penetrates the insulating film 51j in the Z direction. The through via 10 may be formed of a material including a conductor (for example, copper, titanium, and tungsten) as a main component. The through via 10 includes an end portion 10a on the +Z side in contact with the wiring 11 and electrically connected to the wiring 11. The through via 10 includes an end portion 10b on the −Z side in contact with the wiring 4 and is electrically connected to the wiring 4.

As illustrated in FIGS. 18 and 20A, with respect to the through via 10, a width W10a1 of the end portion 10a on the +Z side in the X direction is smaller than a width W10b1 of the end portion 10b on the −Z side in the X direction in the XZ cross-sectional view. As illustrated in FIGS. 19 and 20B, with respect to the through via 10, a width W10a2 of the end portion 10a on the +Z side in the Y direction is larger than a width W10b2 of the end portion 10b on the −Z side in the Y direction in the YZ cross-sectional view.

As illustrated in FIGS. 18 and 20A, in the XZ cross-sectional view, with respect to the through via 10, a side surface 10c11 on the −X side is inclined from the +Z direction to the +X side by an angle $\theta 11$, a side surface 10c12 on the +X side is inclined from the +Z direction to the −X side by an angle $\theta 12$, and $\theta 11 \approx \theta 12$. That is, in the XZ cross-sectional view, with respect to the through via 10, the inclination angle $\theta 11$ of the side surface 10c11 on the −X side and the inclination angle $\theta 12$ of the side surface 10c12 on the +X side are equal.

As illustrated in FIGS. 19 and 20B, in the YZ cross-sectional view, with respect to the through via 10, a side surface 10c21 on the −Y side is inclined from the +Z direction to the +Y side at an angle $\theta 21$, a side surface 10c22 on the +Y side is inclined from the +Z direction to the −Y side at an angle $\theta 22$, and $\theta 21 \approx \theta 22$. That is, in the YZ cross-sectional view, with respect to the through via 10, the inclination angle $\theta 21$ of the side surface 10c21 on the −Y side and the inclination angle $\theta 22$ of the side surface 10c22 on the +Y side are equal.

The wiring 11 extends in a line shape along the X direction. The wiring 11 may be formed of a material including a conductor (for example, copper, titanium, and tungsten) as a main component. With respect to the wiring 11, the surface on the −Z side is in contact with the through via 10 and the wiring 11 is electrically connected to the through via 10.

The insulating film 12 is disposed on the insulating film 51j and the through via 10 on the +Z side, so that the surface of the insulating film 51j on the +Z side is covered. The insulating film 12 may be formed of a material including silicon oxide as a main component.

The structure illustrated in FIGS. 18 to 20B can be obtained by the manufacturing method according to the present embodiment in which the etching processing can be performed on the film to be processed, while the tilting is prevented. Therefore, the structure can be provided as a structure appropriate for improving the manufacturing yield of the semiconductor device 1.

As described above, according to the present embodiment, in the semiconductor manufacturing system 100, the inclination degree of the incidence direction of the etchant according to the worn state of the part of the etching device 106 is calculated, the edge position of the layout data is corrected according to the calculated inclination degree, and the substrate WF is exposed, developed, and subjected to the etching processing. Accordingly, the etching processing can be performed on the film to be processed while the tilting is prevented, and thus the manufacturing yield of the semiconductor device 1 can be improved.

In addition, FIG. 2 illustrates a case where the first mask film and the second mask film in the multilayer resist structure formed on the film to be processed are a coating-type film. However, the first mask film and the second mask film may be a film formation-type film by CVD and the like. In this case, the film formation device 107 forms the film to be processed on the substrate WF, and the first mask film and the second mask film are further deposited sequentially on the film to be processed (S1'). The first mask film is a film, for example, including carbon as a main component. The second mask film is a film, for example, including silicon oxide as a main component. The conveyance system 101 conveys the substrate WF on which the film to be processed, the first mask film, and the second mask film are sequentially deposited from the film formation device 107 to the coating device 102. The coating device 102 forms the first resist film on the second mask film by coating (S2). Thereafter, S3 to S7 are performed, and the conveyance system 101 conveys the processed substrate WF from the etching device 106 to the washing device (not illustrated). The washing device performs washing for removing the first resist pattern from the substrate WF. The conveyance system 101 conveys the washed substrate WF from the washing device to the film formation device 107. The film formation device 107 additionally deposits the second mask film on the second mask pattern (S8'). The conveyance system 101 conveys the substrate WF from the film formation device 107 to the coating device 102. The coating device 102 forms the second resist film on the second mask pattern by coating (S9). Thereafter, S10 and subsequent steps thereof are the same as in the embodiment.

Figure 21:
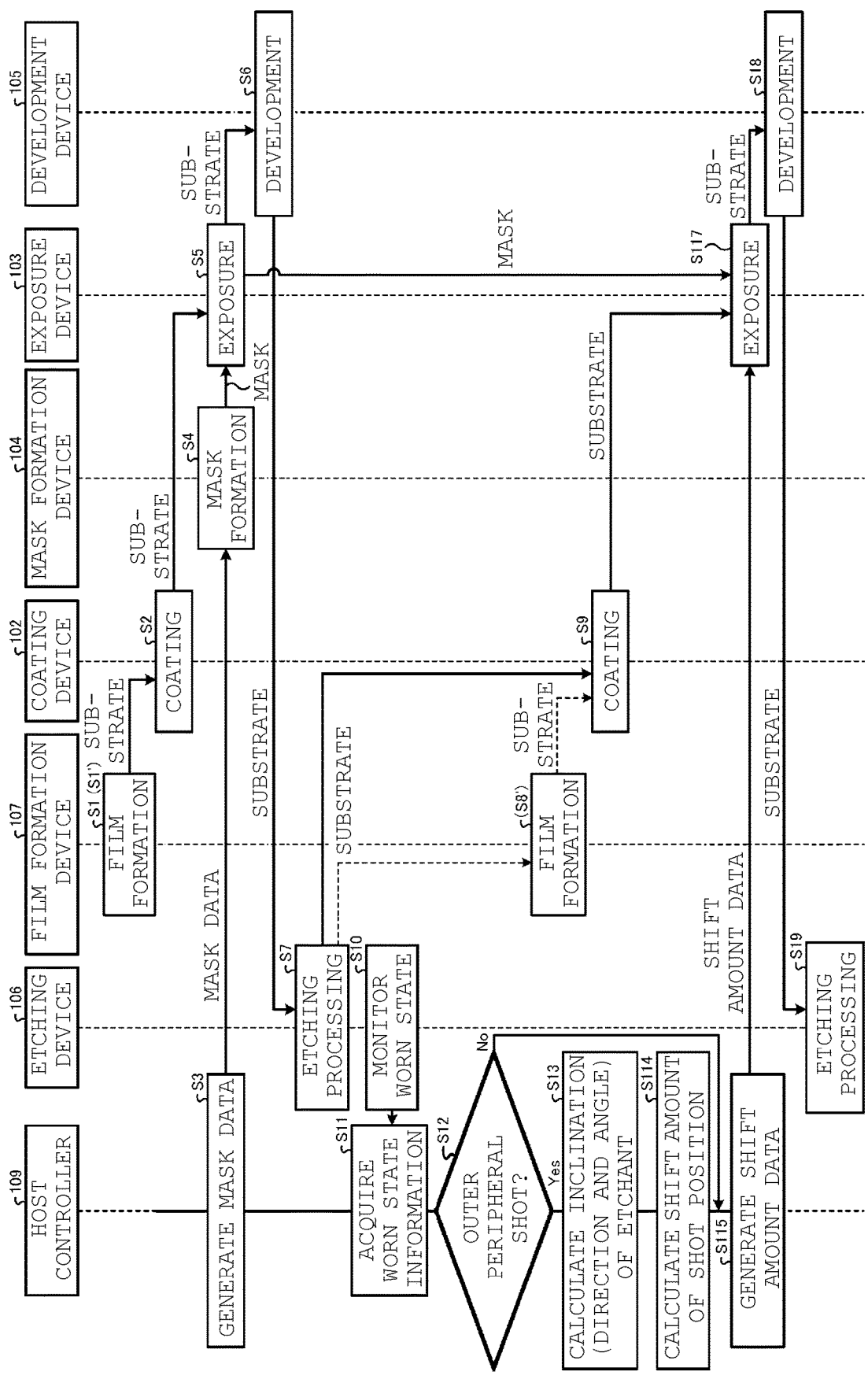
FIG. 21 is a sequence diagram illustrating an operation of a semiconductor manufacturing system related to a first modification according to at least one embodiment.

As the first modification of the embodiment, the semiconductor manufacturing system 100 may perform an operation as illustrated in FIG. 21. FIG. 21 is a sequence diagram illustrating an operation of the semiconductor manufacturing system 100 according to the first modification of the embodiment. In FIG. 21, S16 (see FIG. 2) is omitted, and S14, S15, and S17 are substituted with S114, S115, and S117.

When the shot area SH to be exposed belongs to the inner area R0 (No in S12), the host controller 109 generates shift amount data SD-0 indicating that the shift amount is zero (S115) and supplies the data to the exposure device 103.

When the shot areas SH to be exposed belongs to the outer peripheral area R1 (Yes in S12), the host controller 109 calculates the inclination degree of the incidence direction of the etchant in the outer peripheral area R1 according to the worn state information acquired in S11 (S13). The host controller 109 calculates the shift amount of the center position of the shot area (that is, the shot position) so that the edge position is shifted from the first resist pattern according to the inclination degree of the etchant in the outer peripheral area R1 (S114). The host controller 109 obtains the direction and the amount of the shift according to the direction and the angle of the inclination of the etchant and obtains the shift amount of the shot positions according to the obtained direction and amount. That is, in the outer peripheral area R1, the host controller 109 corrects the edge position in the exposure pattern to be exposed in S117 to be shifted from the exposure pattern of S5 according to the inclination degree calculated in S13.

Figure 22:
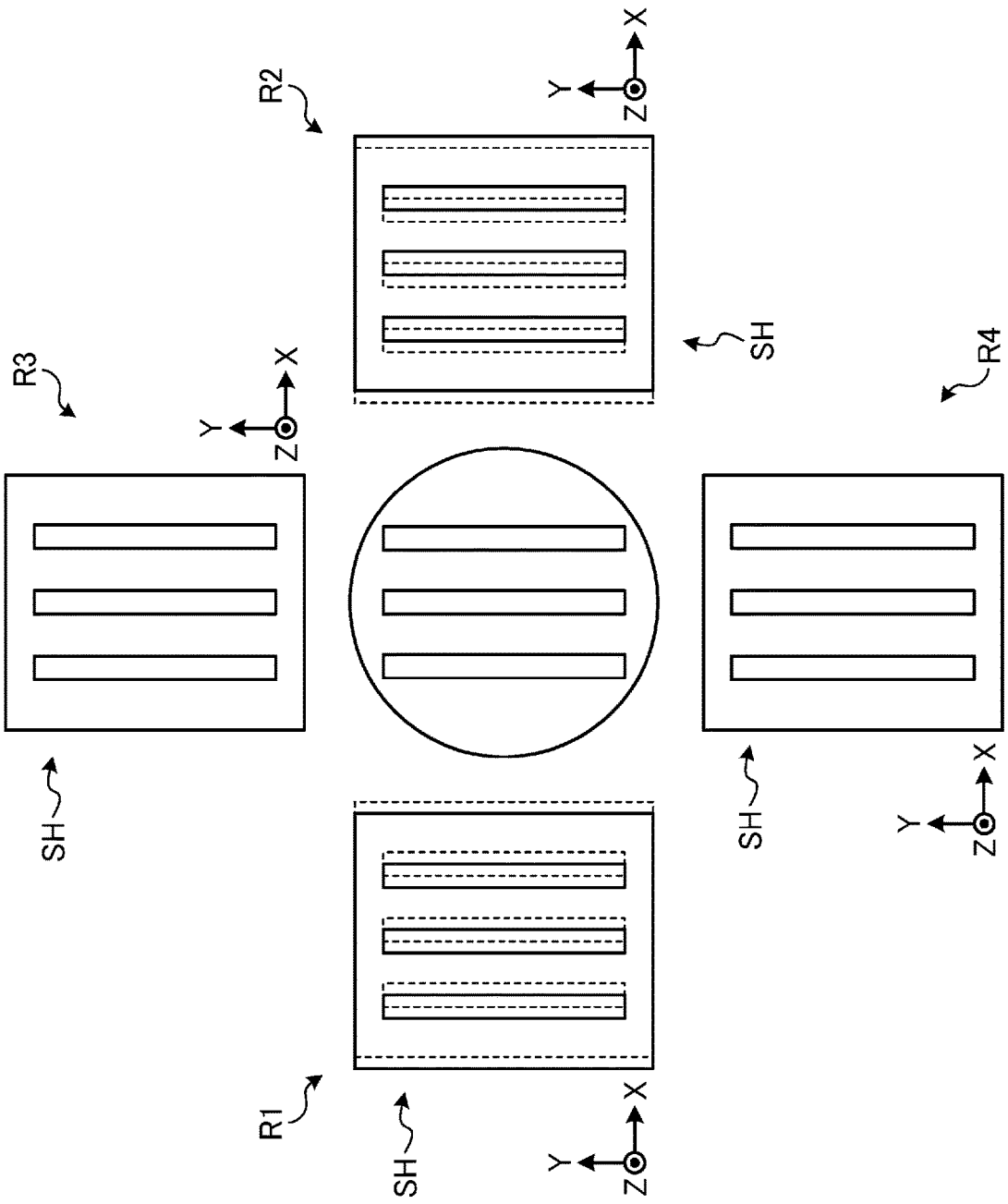
FIG. 22 is a diagram illustrating the shot position shift with respect to a groove pattern according to the first modification of at least one embodiment (when the worn amount is small).
Figure 23:
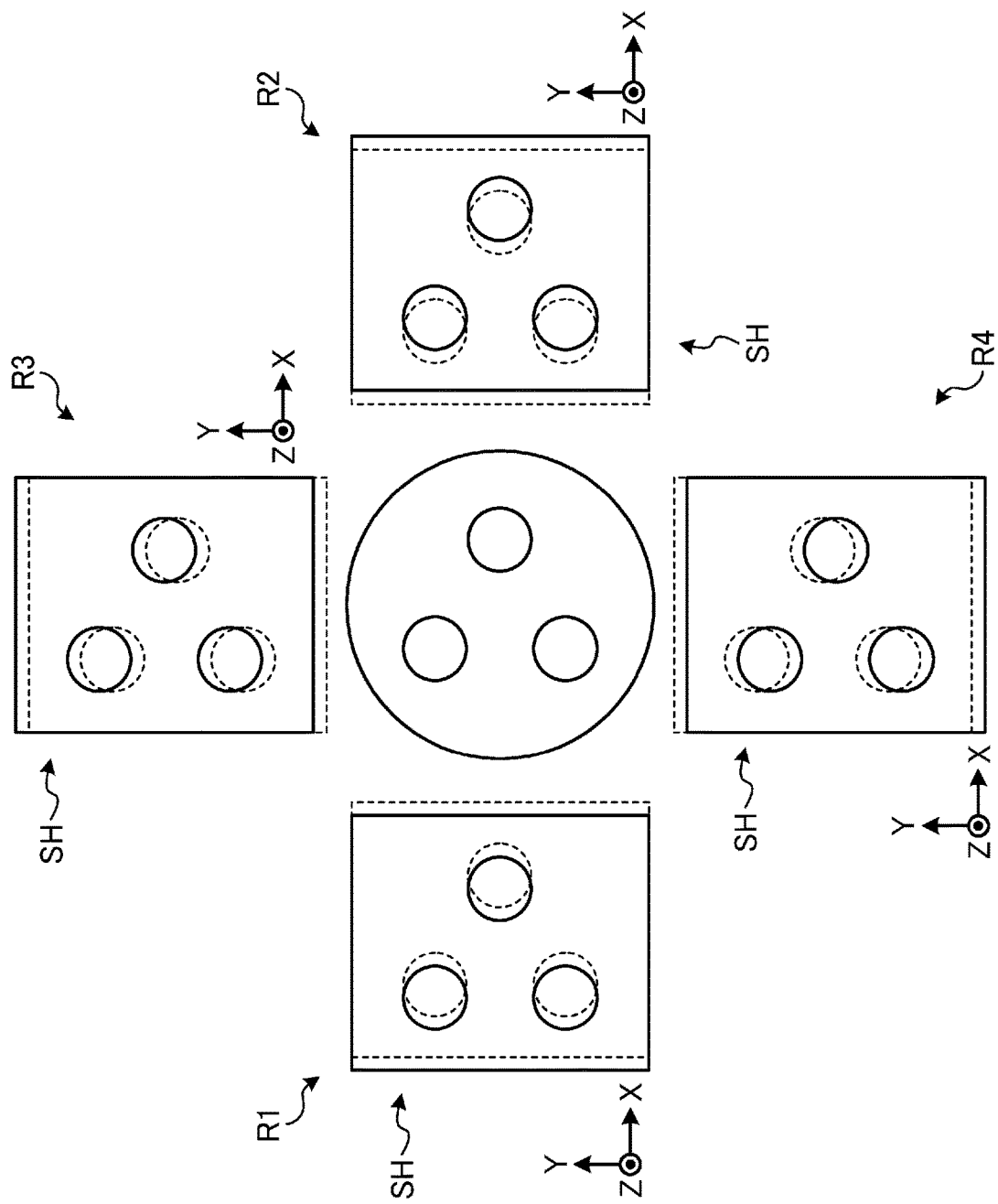
FIG. 23 is a diagram illustrating the shot position shift with respect to a hole pattern according to the first modification of at least one embodiment (when the worn amount is small).

When it is determined as the worn state="small" with respect to the worn state of the part of the etching device 106, according to the direction and the angle of the inclination of the etchant of the outer peripheral area R1 indicated by the arrows in FIG. 5A, the host controller 109 sets the direction of the shift to the shot position as the −X direction and sets the shift amount as the amount in accordance with the angle θ. For example, with respect to the groove pattern of the outer peripheral area R1, FIG. 22 illustrates the shot positions during the exposure of S5 with the dotted square frames, and illustrates the shot positions to be exposed in S117 with the solid square frames. The host controller 109 obtains the amount in accordance with the angle θ on the −X side as the shift amount of the shot positions illustrated with the solid square frames with respect to the shot position illustrated with the dotted square frames. According to this shift amount, the groove pattern may be shifted in the same manner as in FIG. 6. With respect to the hole pattern of the outer peripheral area R1, FIG. 23 illustrates the shot positions during the exposure of S5 with the dotted square frames and shot positions to be exposed in S117 with the solid square frames. The host controller 109 obtains the amount in accordance with the angle θ to the −X side as the shift amount of the shot positions illustrated with the solid square frames with respect to the shot positions illustrated with the dotted square frames. According to this shift amount, the hole patterns may be shifted in the same manner as in FIG. 7.

When it is determined as the worn state="medium", the host controller 109 obtains the shift amount of zero with respect to the shot positions during the exposure of S5 according to the direction and the angle of the inclination of the etchant of the outer peripheral area R1 illustrated in FIG. 5B.

FIG. 22 is a diagram illustrating a shot position shift with respect to the groove pattern according to the first modification of the embodiment (when the worn amount is small). FIG. 23 is a diagram illustrating the shot position shift with respect to the hole pattern according to the first modification of the embodiment (when the worn amount is small).

With respect to the worn state of the part of the etching device 106, if it is determined as the worn state="large", according to the direction and the angle of the inclination of the etchant of the outer peripheral area R1 illustrated with the arrows in FIG. 5C, the host controller 109 sets the direction of the shift with respect to the shot position as the +X direction and sets the shift amount as the amount in accordance with the angle θ. For example, with respect to the groove pattern of the outer peripheral area R1, FIG. 24 illustrates the shot positions during the exposure of S5 with the dotted square frames and illustrates the shot positions to be exposed in S117 with the solid square frames. The host controller 109 obtains the amount in accordance with the angle θ to the +X side as the shift amount of the shot positions illustrated with the solid square frames with respect to the shot positions illustrated with the dotted square frames. According to this shift amount, the groove pattern may be shifted in the same manner as in FIG. 8. With respect to the hole pattern of the outer peripheral area R1, FIG. 25 illustrates the shot positions during the exposure of S5 with the dotted square frames and shot positions to be exposed in S117 with the solid square frames. The host controller 109 obtains the amount in accordance with the angle θ on the +X side as the shift amount of the shot positions illustrated with the solid square frames with respect to the shot positions illustrated with the dotted square frames. According to this shift amount, the hole pattern may be shifted in the same manner as in FIG. 9.

In addition, FIG. 24 is a diagram illustrating the shot position shift with respect to the groove pattern according to the first modification of the embodiment (when the worn amount is large). FIG. 25 is a diagram illustrating the shot position shift with respect to the hole pattern according to the first modification of the embodiment (when the worn amount is large).

The host controller 109 generates shift amount data SD-1 for the outer peripheral area R1 according to the shift amount obtained in S114 (S115). The host controller 109 supplies the shift amount data SD-1 to the exposure device 103. The supplied shift amount data SD-1 may be referred to by the exposure device 103 when the shot areas SH that belong to the outer peripheral area R1 are exposed.

When the shot areas SH to be exposed belongs to the outer peripheral area R2 (Yes in S12), the host controller 109 calculates the inclination degree of the incidence direction of the etchant in the outer peripheral area R2 according to the worn state information acquired in S11 (S13). The host controller 109 calculates the shift amount of the center positions of the shot areas (that is, the shot positions) so that the edge positions are shifted from the first resist pattern according to the inclination degree of the etchant in the outer peripheral area R2 (S114). The host controller 109 obtains the direction and the amount of the shift according to the direction and the angle of the inclination of the etchant and obtains the shift amount of the shot positions according to the obtained direction and amount. That is, with respect to the outer peripheral area R2, the host controller 109 performs correction so that the edge positions in the exposure pattern to be exposed in S117 are shifted from the exposure pattern of S5 according to the inclination degree calculated in S13.

With respect to the worn state of the part of the etching device 106, if it is determined as the worn state="small", according to the direction and the angle of the inclination of the etchant of the outer peripheral area R2 illustrated with the arrows in FIG. 5A, the host controller 109 sets the direction of the shift with respect to the shot positions as the +X direction and sets the shift amount as the amount in accordance with the angle θ. For example, with respect to the groove pattern of the outer peripheral area R2, FIG. 22 illustrates the shot positions during the exposure of S5 with the dotted square frames and the shot positions to be exposed in S117 with the solid square frames. The host controller 109 obtains the amount in accordance with the angle θ on the +X side as the shift amount of the shot position illustrated with the solid square frames with respect to the shot positions illustrated with the dotted square frames. According to this shift amount, the groove pattern may be shifted in the same manner as in FIG. 6. With respect to the hole pattern of the outer peripheral area R2, FIG. 23 illustrates the shot positions during the exposure of S5 with the dotted square frames and shot positions to be exposed in S117 with the solid square frames. The host controller 109 obtains the amount in accordance with the angle θ on the +X side as the shift amount of the shot position illustrated with the solid square frames with respect to the shot positions illustrated with the dotted square frames. According to this shift amount, the hole pattern may be shifted in the same manner as in FIG. 7.

If it is determined as the worn state="medium", the host controller 109 obtains the shift amount of zero with respect to the shot positions during the exposure of S5 according to the direction and the angle of the inclination of the etchant of the outer peripheral area R2 illustrated in FIG. 5B.

With respect to the worn state of the part of the etching device 106, if it is determined as the worn state="large", according to the direction and the angle of the inclination of the etchant of the outer peripheral area R2 illustrated with the arrows in FIG. 5C, the host controller 109 sets the direction of the shift with respect to the shot positions as the −X direction and sets the shift amount as the amount in accordance with the angle θ. For example, with respect to the groove pattern of the outer peripheral area R2, FIG. 24 illustrates the shot positions during the exposure of S5 with dotted square frames and shot positions to be exposed in S117 with the solid square frames. The host controller 109 obtains the amount in accordance with the angle θ on the −X side as the shift amount of the shot position illustrated with the solid square frames with respect to the shot positions illustrated with the dotted square frames. According to this shift amount, the groove pattern may be shifted in the same manner as in FIG. 8. With respect to the hole pattern of the outer peripheral area R2, FIG. 25 illustrates the shot positions during the exposure of S5 with the dotted square frames and shot positions to be exposed in S117 with the solid square frames. The host controller 109 obtains the amount in accordance with the angle θ on the +X side as the shift amount of the shot position illustrated with the solid square frames with respect to the shot positions illustrated with the dotted square frames. According to this shift amount, the hole pattern may be shifted in the same manner as in FIG. 9.

The host controller 109 generates shift amount data SD-2 for the outer peripheral area R2 according to the shift amount obtained in S114 (S115). The host controller 109 supplies the shift amount data SD-2 to the exposure device 103. The supplied shift amount data SD-2 may be referred to by the exposure device 103 when the shot areas SH that belong to the outer peripheral area R2 are exposed.

When the shot areas SH to be exposed belongs to the outer peripheral area R3 (Yes in S12), the host controller 109 calculates the inclination degree of the incidence direction of the etchant in the outer peripheral area R3 according to the worn state information acquired in S11 (S13). The host controller 109 calculates the shift amount of the center positions of the shot areas (that is, the shot positions) so that the edge positions are shifted from the first resist pattern according to the inclination degree of the etchant in the outer peripheral area R3 (S114). The host controller 109 obtains the direction and the amount of the shift according to the direction and the angle of the inclination of the etchant and obtains the shift amount of the shot positions according to the obtained direction and amount. That is, with respect to the outer peripheral area R3, the host controller 109 performs correction so that the edge positions in the exposure pattern to be exposed in S117 are shifted from the exposure pattern of S5 according to the inclination degree calculated in S13.

With respect to the worn state of the part of the etching device 106, if it is determined as the worn state="small", according to the direction and the angle of the inclination of the etchant of the outer peripheral area R3 illustrated with the arrows in FIG. 5A, the host controller 109 sets the direction of the shift with respect to the shot positions as the +Y direction and sets the shift amount as the amount in accordance with the angle θ. For example, with respect to the groove pattern of the outer peripheral area R3, the host controller 109 determines that the influence of the tilting can be neglected, and sets the shift amount of the shot positions as zero as illustrated with the solid square frames in FIG. 22. With respect to the hole pattern of the outer peripheral area R3, FIG. 23 illustrates the shot positions during the exposure of S5 with the dotted square frames and the shot positions to be exposed in S117 with the solid square frames. The host controller 109 obtains the amount in accordance with the angle θ on the +Y side as the shift amount of the shot position illustrated with the solid square frames with respect to the shot positions illustrated with the dotted square frames. According to this shift amount, the hole pattern may be shifted in the same manner as in FIG. 7.

If it is determined as the worn state="medium", the host controller 109 obtains the shift amount of zero with respect to the shot positions during the exposure of S5 according to the direction and the angle of the inclination of the etchant of the outer peripheral area R3 illustrated in FIG. 5B.

With respect to the worn state of the part of the etching device 106, if it is determined as the worn state="large", according to the direction and the angle of the inclination of the etchant of the outer peripheral area R3 illustrated with the arrows in FIG. 5C, the host controller 109 sets the direction of the shift with respect to the shot positions as the −Y direction and sets the shift amount as the amount in accordance with the angle θ. For example, with respect to the groove pattern of the outer peripheral area R3, the host controller 109 determines that the influence of the tilting can be neglected, and sets the shift amount of the shot positions as illustrated with the solid square frames in FIG. 24. With respect to the hole pattern of the outer peripheral area R3, FIG. 25 illustrates the shot positions during the exposure of S5 with the dotted square frames and the shot positions to be exposed in S117 with the solid square frames. The host controller 109 obtains the amount in accordance with the angle θ on the −Y side as the shift amount of the shot position illustrated with the solid square frames with respect to the shot positions illustrated with the dotted square frames. According to this shift amount, the hole pattern may be shifted in the same manner as in FIG. 9.

The host controller 109 generates shift amount data SD-3 for the outer peripheral area R3 according to the shift amount obtained in S114 (S115). The host controller 109 supplies the shift amount data SD-3 to the exposure device 103. The supplied shift amount data SD-3 may be referred to by the exposure device 103 when the shot areas SH that belong to the outer peripheral area R3 are exposed.

When the shot areas SH to be exposed belong to the outer peripheral area R4 (Yes in S12), the host controller 109 calculates the inclination degree of the incidence direction of the etchant in the outer peripheral area R4 according to the worn state information acquired in S11 (S13). The host controller 109 calculates the shift amount of the center positions of the shot areas (that is, the shot positions) so that the edge positions are shifted from the first resist pattern according to the inclination degree of the etchant in the outer peripheral area R4 (S114). The host controller 109 obtains the direction and the amount of the shift according to the direction and the angle of the inclination of the etchant and obtains the shift amount of the shot positions according to the obtained direction and amount. That is, with respect to the outer peripheral area R4, the host controller 109 performs correction so that the edge positions in the exposure pattern to be exposed in S117 are shifted from the exposure pattern of S5 according to the inclination degree calculated in S13.

With respect to the worn state of the part of the etching device 106, if it is determined as the worn state="small", according to the direction and the angle of the inclination of the etchant of the outer peripheral area R4 illustrated with the arrows in FIG. 5A, the host controller 109 sets the direction of the shift with respect to the shot positions as the −Y direction and sets the shift amount as the amount in accordance with the angle θ. For example, with respect to the groove pattern of the outer peripheral area R4, the host controller 109 determines that the influence of the tilting can be neglected, and sets the shift amount of the shot positions as zero as illustrated with the solid square frames in FIG. 22. With respect to the hole pattern of the outer peripheral area R4, FIG. 23 illustrates the shot positions during the exposure of S5 with the dotted square frames and the shot positions to be exposed in S117 with the solid square frames. The host controller 109 obtains the amount in accordance with the angle θ on the −Y side as the shift amount of the shot position illustrated with the solid square frames with respect to the shot positions illustrated with the dotted square frames. According to this shift amount, the hole pattern may be shifted in the same manner as in FIG. 7.

If it is determined as the worn state="medium", the host controller 109 obtains the shift amount of zero with respect to the shot positions during the exposure of S5 according to the direction and the angle of the inclination of the etchant of the outer peripheral area R4 illustrated in FIG. 5B.

With respect to the worn state of the part of the etching device 106, if it is determined as the worn state="large", according to the direction and the angle of the inclination of the etchant of the outer peripheral area R4 illustrated with the arrows in FIG. 5C, the host controller 109 sets the direction of the shift with respect to the shot positions as the +Y direction and sets the shift amount as the amount in accordance with the angle θ. For example, with respect to the groove pattern of the outer peripheral area R4, the host controller 109 determines that the influence of the tilting can be neglected, and sets the shift amount of the shot positions as illustrated with the solid square frames in FIG. 24. With respect to the hole pattern of the outer peripheral area R4, FIG. 25 illustrates the shot positions during the exposure of S5 with the dotted square frames and the shot positions to be exposed in S117 with the solid square frames. The host controller 109 obtains the amount in accordance with the angle θ on the +Y side as the shift amount of the shot position illustrated with the solid square frames with respect to the shot positions illustrated with the dotted square frames. According to this shift amount, the hole pattern may be shifted in the same manner as in FIG. 9.

The host controller 109 generates shift amount data SD-4 for the outer peripheral area R4 according to the shift amount obtained in S114 (S115). The host controller 109 supplies the shift amount data SD-4 to the exposure device 103. The supplied shift amount data SD-4 may be referred to by the exposure device 103 when the shot areas SH that belong to the outer peripheral area R4 are exposed.

When the shot areas SH to be exposed belong to the inner area R0, the exposure device 103 refers to the shift amount data SD-0 and exposes the second resist film formed on the substrate WF at the shot positions by the shift amount of zero by using the mask MK1 in the same manner as in S5 (S117). Thereafter, S6 and S7 are performed.

When the shot areas SH to be exposed belong to the outer peripheral area R1, the exposure device 103 shifts alignment coordinates of the shot areas SH by the shift amount indicated by the shift amount data SD-1 and exposes the second resist film formed on the substrate WF in that state by using the mask MK1 in the same manner as in S5 (S117). That is, the exposure device 103 exposes the substrate WF with the exposure pattern in which the edge positions are shifted from the exposure pattern of S5 as the shot areas SH to be exposed belong to the outer peripheral area R1. Thereafter, S6 and S7 are performed.

When the shot areas SH to be exposed belong to the outer peripheral area R2, the exposure device 103 shifts alignment coordinates of the shot areas SH by the shift amount indicated by the shift amount data SD-2 and exposes the second resist film formed on the substrate WF in that state by using the mask MK1 in the same manner as in S5 (S117). That is, the exposure device 103 exposes the substrate WF with the exposure pattern in which the edge positions are shifted from the exposure pattern of S5 as the shot areas SH to be exposed belong to the outer peripheral area R2. Thereafter, S6 and S7 are performed.

When the shot areas SH to be exposed belong to the outer peripheral area R3, the exposure device 103 shifts alignment coordinates of the shot areas SH by the shift amount indicated by the shift amount data SD-3 and exposes the second resist film formed on the substrate WF in that state by using the mask MK1 in the same manner as in S5 (S117). That is, the exposure device 103 exposes the substrate WF with the exposure pattern in which the edge positions are shifted from the exposure pattern of S5 as the shot areas SH to be exposed belong to the outer peripheral area R3. Thereafter, S6 and S7 are performed.

When the shot areas SH to be exposed belong to the outer peripheral area R4, the exposure device 103 shifts alignment coordinates of the shot areas SH by the shift amount indicated by the shift amount data SD-4 and exposes the second resist film formed on the substrate WF in that state by using the mask MK1 in the same manner as in S5 (S117). That is, the exposure device 103 exposes the substrate WF with the exposure pattern in which the edge positions are shifted from the exposure pattern of S5 as the shot areas SH to be exposed belong to the outer peripheral area R4. Thereafter, S6 and S7 are performed.

Also with such a semiconductor manufacturing system 100, the edge position of the layout data is corrected according to the calculated inclination degree, and the substrate WF is exposed, developed, and subjected to etching processing. Therefore, the etching processing can be performed on the film to be processed while the tilting is prevented. Accordingly, the manufacturing yield of the semiconductor device 1 can be improved.

As a second modification of the embodiment, a hard mask film may be disposed between the film to be processed and the multilayer resist structure, and the patterning may be performed on the film to be processed by the multilayer resist structure and the hard mask film. For example, in the method of manufacturing the semiconductor device 1, as illustrated in FIGS. 26A to 30B, processes different from those of the embodiment in the following points may be performed.

Figure 26A:
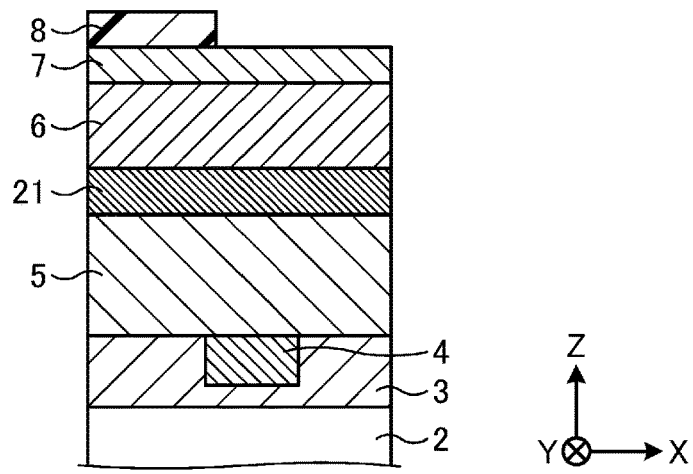
FIGS. 26A to 26C are cross sectional views illustrating a method of manufacturing a semiconductor device according to a second modification of at least one embodiment.

In the process illustrated in FIG. 26A, after the insulating film 5 is deposited on the insulating film 3 and the wiring 4 on the +Z side, a hard mask film 21 such as a silicon nitride film is deposited by the film formation device 107. Thereafter, the coating device 102 forms the first mask film 6 on the hard mask film 21 by coating. The other points are the same as the processes illustrated in FIG. 15A.

Figure 26B:
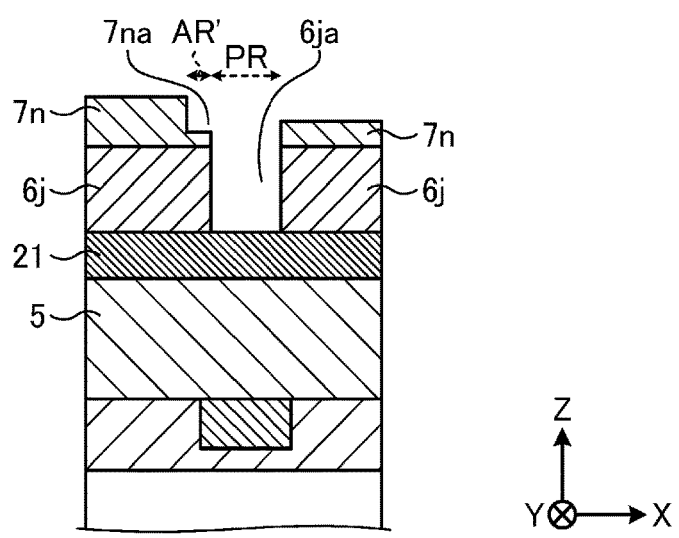

Thereafter, the same processes as illustrated in FIGS. 15B to 16A are performed, and a process illustrated in FIG. 26B is performed. In the process illustrated in FIG. 26B, etching processing is performed on the first mask film 6i by using the second resist pattern 9 and the second mask pattern 7k (see FIG. 16A) as masks. Accordingly, the second resist pattern 9 is transferred to the second mask pattern 7k, and the Z position of the edge 7n1 in the second mask pattern 7n goes further to the −Z side. In addition, the second mask pattern 7k is transferred to the first mask film 6i, and the first mask pattern 6j with the opening pattern 6ja is formed. The opening pattern 6ja penetrates the first mask pattern 6j in the area PR. The opening pattern 6ja exposes a portion of the surface of the hard mask film 21 on the +Z side.

Figure 26C:
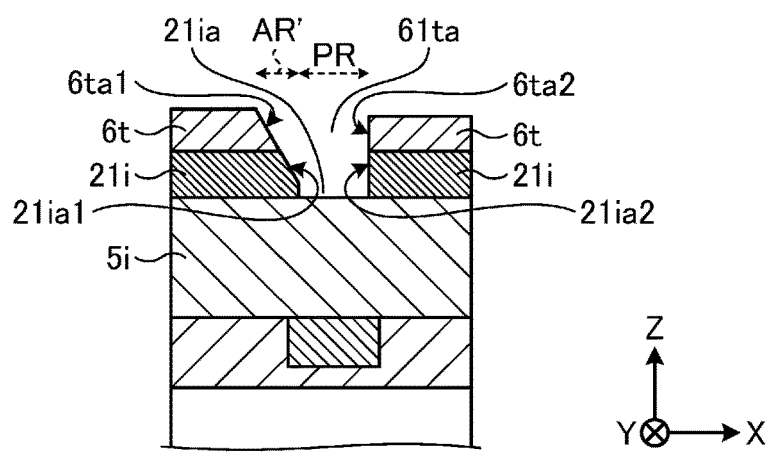

In the process illustrated in FIG. 26C, the etching device 106 performs etching processing on the first mask pattern 6j by using the second mask pattern 7n as a mask. Accordingly, the second mask pattern 7n is transferred to the first mask pattern 6j, and the edge corresponding to the edge 7n1 is transferred to the first mask pattern 6j. At this point, the side wall protective film of the anisotropic etching is hardly deposited in a first mask pattern 6t, a portion near the edge in the first mask pattern 6t is preferentially etched by the electric field concentration at the edge, the step shape of the side surface is changed to the inclined surface shape in accordance with the edge, and a side surface 6t1 inclined to the −X side of an opening pattern 6ta is formed. Also, by using the first mask pattern 6t as a mask, the hard mask film 21 is subjected to etching processing. Accordingly, the first mask pattern 6t is transferred to the hard mask film 21, a third mask pattern 21i with a hole pattern 21ia is formed. The hole pattern 21ia includes a side surface 21ia1 that is inclined corresponding to the inclined side surface 6ta1. That is, with respect to the opening pattern 6ta1 of the first mask pattern 6t, the inclination angle of a side surface 6ta1 on the −X side to the +Z direction which corresponds to the direction of the inclination of the etchant is larger than the inclination angle of aside surface 6ta2 on the +X side in the +Z direction. With respect to the hole pattern 21ia of the third mask pattern 21i, the inclination angle of the side surface 21ia1 on the −X side to the +Z direction which corresponds to the direction of the inclination of the etchant is larger than the inclination angle of a side surface 21ia2 on the +X side to the +Z direction. Accordingly, a hole pattern in which the inclination angle of the side surface on the −X side and the inclination angle of the side surface on the +X side are equal in the XZ cross-sectional view is started to be formed on the insulating film 5i.

Figure 27A:
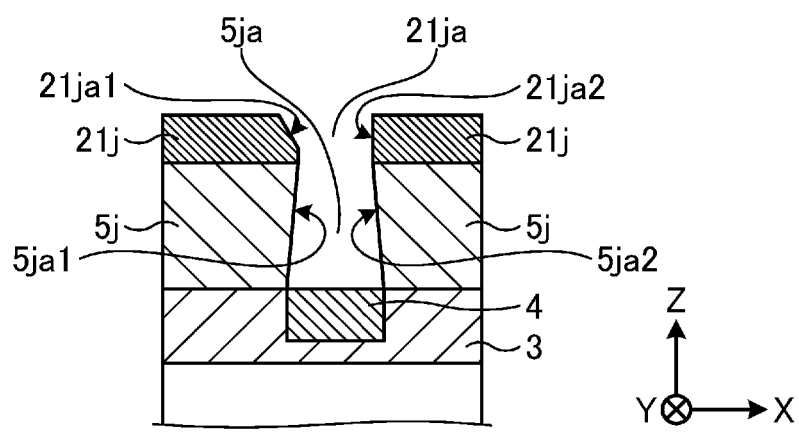
FIGS. 27A and 27B are cross sectional views illustrating the method of manufacturing the semiconductor device according to the second modification of at least one embodiment.

In the process illustrated in FIG. 27A, the etching device 106 continuously performs etching processing and performs etching processing on the insulating film 5j by using a third mask pattern 21j as a mask. At this point, the inclination angle of a side surface 21ja1 on the −X side in a hole pattern 21ja of the third mask pattern 21j is larger than the inclination angle of a side surface 21ja2 on the +X side. Therefore, etching processing can be performed on the insulating film 5j with preventing the influence by the inclination of the etchant. Accordingly, the hole pattern 5ja in which the inclination angle of the side surface 5ja1 on the −X side and the inclination angle of the side surface 5ja2 on the +X side are equal in XZ cross-sectional view can be formed on the insulating film 5j. The hole pattern 5ja exposes the front surface of the wiring 4.

Figure 27B:
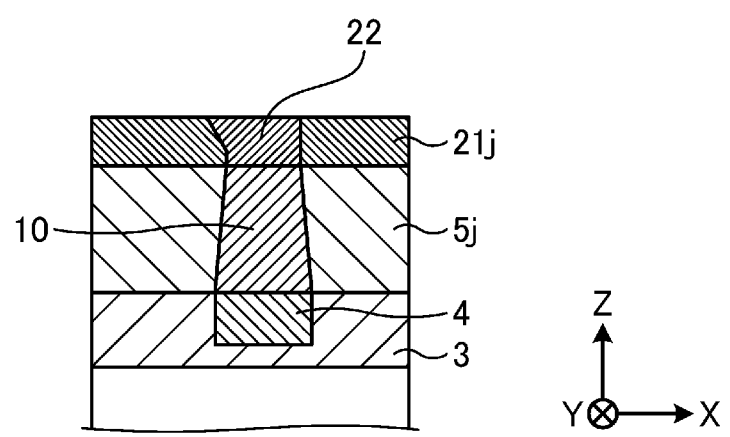

As illustrated in FIG. 27B, the plating device embeds a material including a conductor (for example, copper, titanium, and tungsten) as a main component in the hole patterns 5ja and 21ja, and the CMP device performs flattening until the third mask pattern 21j is exposed to form through vias 10 and 22. The end portion of the through via 10 on the −Z side is in contact with the wiring 4 and is electrically connected to the wiring 4. The end portion of the through via 10 on the +Z side is in contact with the through via 22 and is electrically connected to the through via 22.

Figure 28:
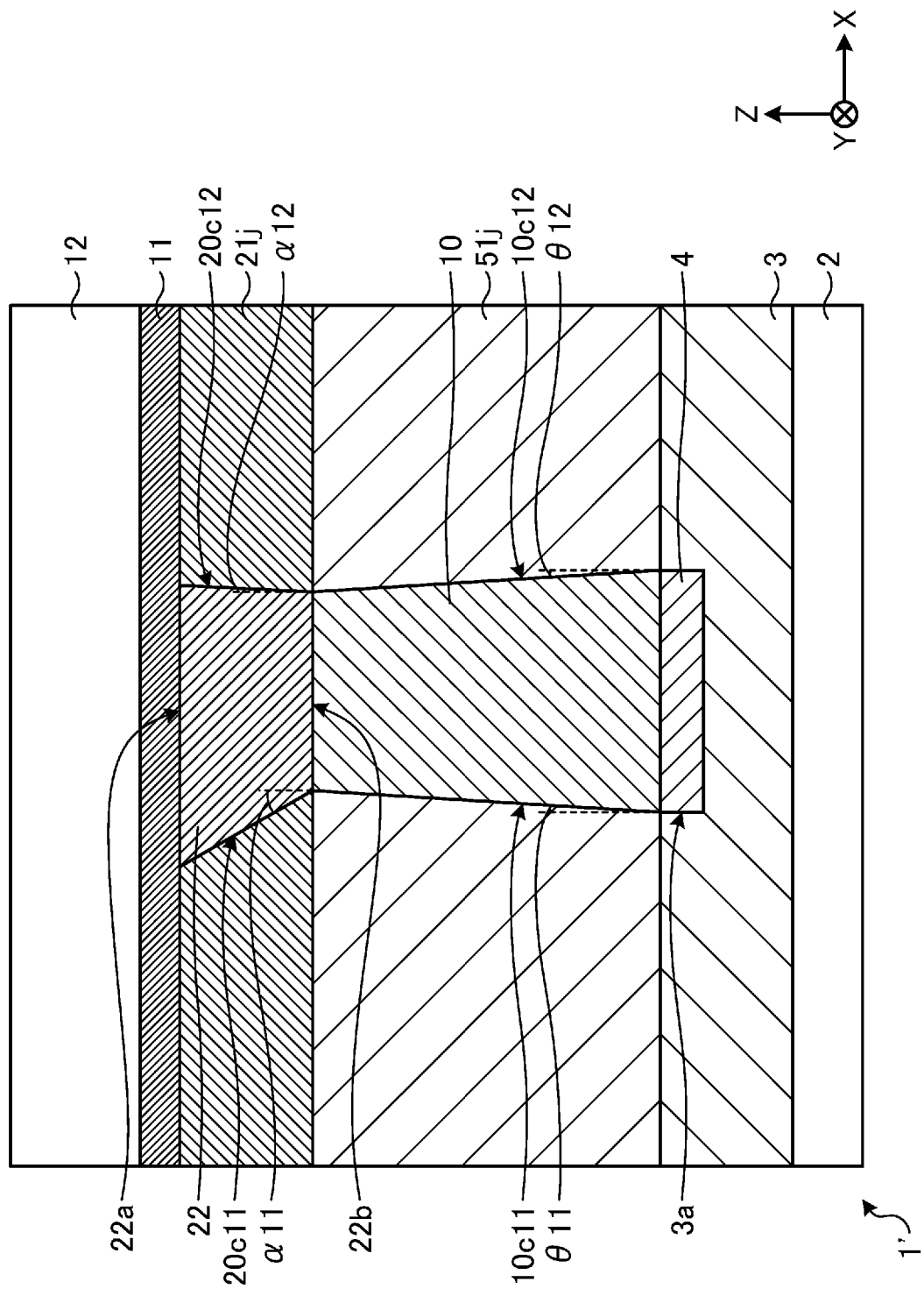
FIG. 28 is a cross sectional view illustrating the method of manufacturing the semiconductor device and the configuration according to the second modification according to at least one embodiment.
Figure 29:
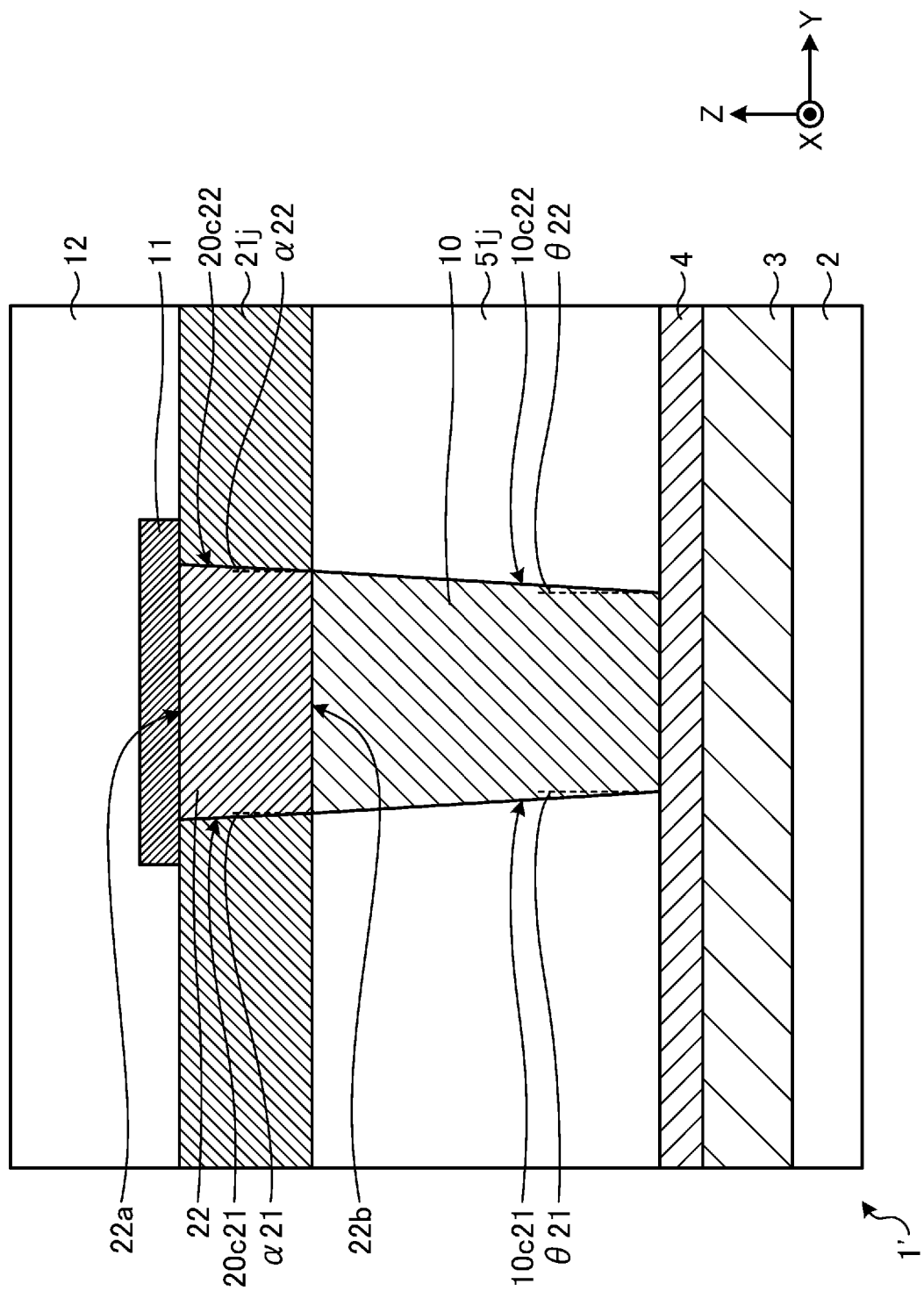
FIG. 29 is a cross sectional view of the method of manufacturing the semiconductor device and the configuration according to the second modification of at least one embodiment.

Therefore, as illustrated in FIGS. 28 and 29, the wiring 11 and the insulating film 12 are formed on the +Z side of the through via 22, to manufacture a semiconductor device 1'.

Figure 30B:
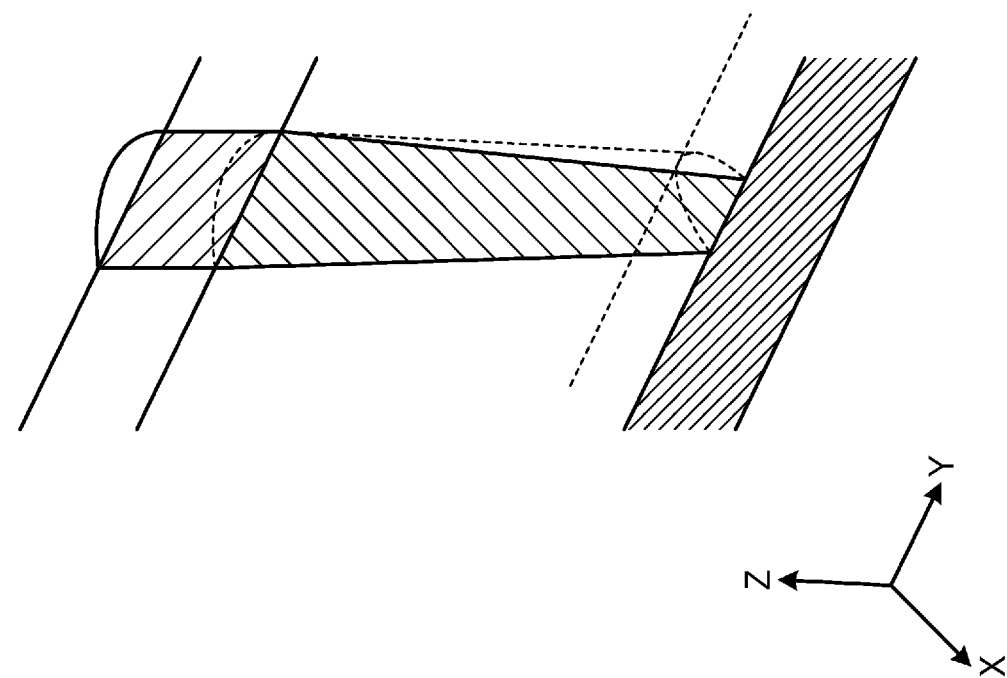
FIGS. 30A and 30B are perspective views illustrating the configuration of the semiconductor device according to the second modification of at least one embodiment.

As illustrated in FIGS. 28 to 30B, the semiconductor device 1' includes configurations different from those in the semiconductor device 1 in the following points. FIG. 28 illustrates the XZ cross section obtained by cutting the semiconductor device 1' (see FIGS. 18 to 20B) at a position passing through the through vias 10 and 22, and FIG. 29 is a YZ cross section obtained by cutting the semiconductor device 1' at a position passing through the through vias 10 and 22. FIGS. 30A and 30B are perspective views illustrating the configuration of the semiconductor device 1'. FIG. 30A is a perspective view illustrating the XZ cross section corresponding to FIG. 28, and FIG. 30B is a perspective view illustrating the YZ cross section corresponding to FIG. 29. In FIGS. 30A and 30B, for simplicity, the wiring 11 and the insulating film 12 are not illustrated.

The through via 10 is disposed on the −Z side of the through via 22, the third mask pattern (hard mask film) 21j, the wiring 11, and the insulating film 12. With respect to the through via 10, the end portion 10a (see FIG. 18) of the +Z side is in contact with the through via 22 and is electrically connected to the through via 22.

The third mask pattern 21j is disposed on the substrate 2, the insulating film 3, the insulating film 51j, and the through via 10 on the +Z side, so that the surface of the insulating film 51j on the +Z side is covered. The third mask pattern 21j may be formed of a material including silicon nitride as a main component. The third mask pattern 21j is penetrated by the through via 22 in the Z direction.

The through via 22 is disposed on the substrate 2, the insulating film 3, the wiring 4, the insulating film 51j, and the through via 10 on the +Z side, is disposed on the wiring 11 and the insulating film 12 on the −Z side, and penetrate the third mask pattern 21j in the Z direction. With respect to the through via 22, an end portion 22a on the +Z side is in contact with the wiring 11 and is electrically connected to the wiring 11. With respect to the through via 22, an end portion 22b on the −Z side is in contact with the through via 10, and is electrically connected to the through via 10.

Figure 30A:
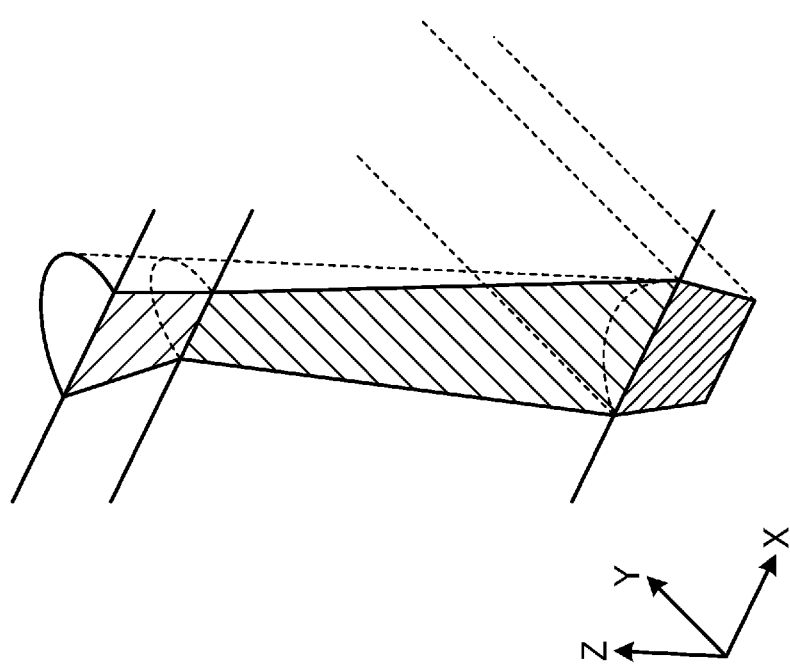

As illustrated in FIGS. 28 and 30A, in XZ cross-sectional view, with respect to the through via 22, a side surface 20c11 on the −X side is inclined from the +Z direction to the −X side at an angle α11, aside surface 20c12 on the +X side is inclined from the +Z direction to the +X side by an angle α12, and α11>α12. For example, the difference between α11 and α12 may be 3° to 5°. That is, with respect to the through via 22, in the XZ cross-sectional view, an inclination angle α11 of the side surface 22c11 on the −X side is larger than the inclination angle α12 of the side surface 22c12 on the +X side.

As illustrated in FIGS. 29 and 30B, in the YZ cross-sectional view, with respect to the through via 10, a side surface 20c21 on the −Y side is inclined from the +Z direction to the −Y side at an angle α21, a side surface 20c22 on the +Y side is inclined from the +Z direction to the +Y side at an angle α22, and α21≈α22. That is, in the YZ cross-sectional view, with respect to the through via 22, the inclination angle α21 of the side surface 20c21 on the −Y side and the inclination angle α22 of the side surface 20c22 on the +Y side are equal.

Such a structure can be obtained by the manufacturing method of the second modification of the present embodiment in which etching processing can be performed on the film to be processed while tilting is prevented, and thus can be provided as a structure appropriate for improving the manufacturing yield of the semiconductor device 1.

Figure 31:
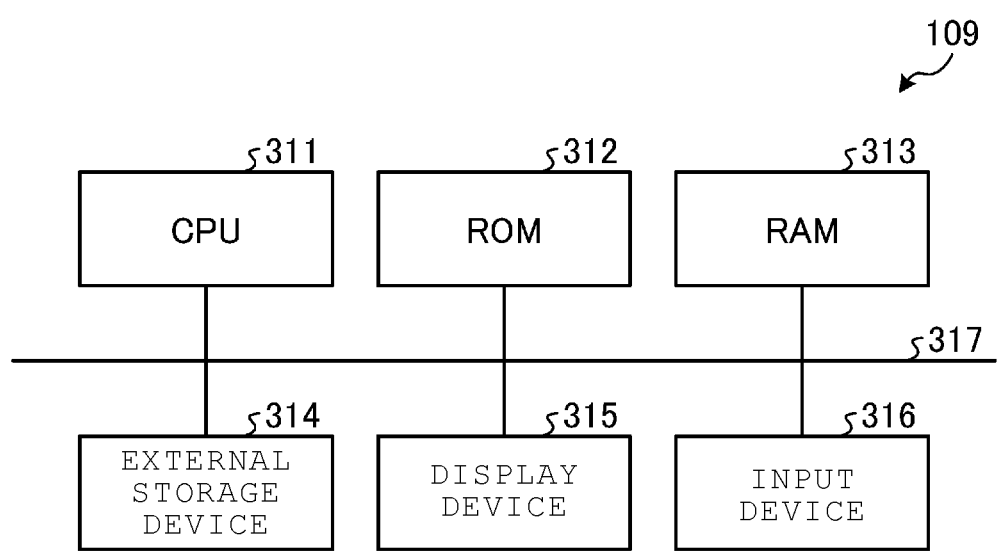
FIG. 31 is a diagram illustrating a hardware configuration of a host controller according to at least one embodiment, the first modification, and the second modification.

In the embodiment and the modifications thereof, the host controller 109 may be configured with hardware as illustrated in FIG. 31. FIG. 31 is a diagram illustrating the hardware configuration of the host controller according to the embodiment and the modifications thereof.

The host controller 109 includes a Central Processing Unit (CPU) 311, a Read Only Memory (ROM) 312, a Random Access Memory (RAM) 313 that is a main storage device, an external storage device 314 such as a Hard Disk Drive (HDD), a Solid State Drive (SSD), or a Compact Disc (CD) drive device, a display device 315 such as a liquid crystal display device, and an input device 316 such as a keyboard and a mouse, and has a hardware configuration in which these are connected to each other via bus lines 317 by using a normal computer.

Each of the acquisition unit 109a, the generation unit 109b, the calculation unit 109c, and the correction unit 109d (see FIG. 1) may be implemented in the CPU 311 in terms of hardware by a circuit or the like. Each of the acquisition unit 109a, the generation unit 109b, the calculation unit 109c, and the correction unit 109d may be implemented in terms of software as a functional module that is loaded on the buffer area of the RAM 313 collectively at the time of compiling the program or sequentially according to the progress of the process by programs. Otherwise, a portion of the acquisition unit 109a, the generation unit 109b, the calculation unit 109c, and the correction unit 109d may be implemented in terms of hardware and the others may be implemented in terms of software. The storage unit 109e (see FIG. 1) may be implemented in terms of hardware such as the ROM 312 or the RAM 313.

The program executed by the host controller 109 of the present embodiment executes the method illustrated in FIG. 2 or 21, and is recorded and provided on a computer-readable recording medium such as a CD-ROM, a flexible disk (FD), a CD-R, or a Digital Versatile Disk (DVD) as a file in an installable format or an executable format.

Further, the program executed by the host controller 109 of the present embodiment may be configured to be stored on a computer connected to a network such as the Internet and provided by downloading via the network. Further, the program executed by the host controller 109 of the present embodiment may be configured to be provided or distributed via a network such as the Internet.

Further, the program of the present embodiment may be configured to be provided by being incorporated into a ROM or the like in advance.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of manufacturing a semiconductor device, the method comprising:
    depositing an insulating film on a substrate;
    depositing a first mask film on or over the insulating film;
    depositing a hard mask film on the insulating film after the insulating film is deposited and before the first mask film is deposited;
    depositing a second mask film on the first mask film;
    forming a first resist pattern on the second mask film;
    processing the second mask film by using the first resist pattern as a mask to form a second mask pattern including an edge;

forming a second resist pattern wherein an edge position is shifted from the first resist pattern on the second mask pattern, from which the first resist pattern is removed;

processing the first mask film using the second resist pattern and the second mask pattern as masks, to form a first mask pattern, the first mask pattern having an inclination angle of a side surface of a first side larger than an inclination angle of a side surface of a second side as seen in a cross-sectional view;

processing the hard mask film using the second resist pattern, the second mask pattern, and the first mask pattern as masks to form a third mask pattern, the third mask pattern having the inclination angle of the side surface of the first side larger than the inclination angle of the side surface of the second side in the cross-sectional view;

processing the insulating film using the first mask pattern as a mask to form a pattern, the pattern having the inclination angle of the side surface of the first side equal to the inclination angle of the side surface of the second side as seen in a cross-sectional view; and wherein the forming of the pattern includes processing the insulating film using the first mask pattern and the third mask pattern as masks to form the pattern.

2. The method of manufacturing the semiconductor device according to claim 1, wherein the substrate includes a plurality of shot areas, and the forming of the second resist pattern includes forming the second resist pattern, on the second mask pattern, in which the edge position is shifted from the first resist pattern by a direction and an amount determined according to a position of the shot areas on the substrate.

3. The method of manufacturing the semiconductor deVice according to claim 1, wherein the first mask film includes spin on carbon.

4. The method of manufacturing the semiconductor deVice according to claim 1, wherein the second mask film includes spin on glass.

* * * * *